(12) United States Patent
Soki et al.

(10) Patent No.: US 10,840,566 B2
(45) Date of Patent: Nov. 17, 2020

(54) CONTROL MODULE

(71) Applicant: DENSO CORPORATION, Kariya (JP)

(72) Inventors: Takahiro Soki, Kariya (JP); Takashi Inamoto, Kariya (JP); Ryosuke Sakai, Kariya (JP); Takeshi Tsukamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 42 days.

(21) Appl. No.: 15/975,877

(22) Filed: May 10, 2018

(65) Prior Publication Data

US 2018/0326863 A1 Nov. 15, 2018

(30) Foreign Application Priority Data

May 10, 2017 (JP) .................. 2017-094218

(51) Int. Cl.
*H01M 10/613* (2014.01)
*H01M 10/44* (2006.01)
(Continued)

(52) U.S. Cl.
CPC .......... *H01M 10/613* (2015.04); *B60L 50/64* (2019.02); *B60L 58/26* (2019.02); *G01R 31/382* (2019.01); *H01M 2/1077* (2013.01); *H01M 2/1083* (2013.01); *H01M 2/1094* (2013.01); *H01M 10/0413* (2013.01); *H01M 10/425* (2013.01);
(Continued)

(58) Field of Classification Search
CPC .... B60L 58/26; B60L 50/64; B60L 2270/147; B60L 2270/145; G01R 31/382; G01R 15/205; G01R 1/18; H01M 10/6563; H01M 10/613; H01M 10/625; H01M 10/486; H01M 10/425; H01M 2/1094; H01M 2/1077; H01M 10/482; H01M 10/441;
(Continued)

(56) References Cited

U.S. PATENT DOCUMENTS 6,225,788 B1 5/2001 Kouzu et al.
6,344,728 B1 2/2002 Kouzu et al.
(Continued)

OTHER PUBLICATIONS

U.S. Appl. No. 15/976,071, filed May 10, 2018 in the name of Takahiro Soki et al.
(Continued)

*Primary Examiner* — M Baye Diao
(74) *Attorney, Agent, or Firm* — Oliff PLC

(57) ABSTRACT

A control module is arranged in alignment with a battery module in a longitudinal direction. The battery module includes battery cells that are aligned in the longitudinal direction and each have upper and lower end faces opposite to each other in a height direction perpendicular to the longitudinal direction. The control module includes a busbar configured to electrically connect the battery module to an electrical load, a switch configured to switch electrical connection of the busbar with the electrical load between a connected state and a disconnected state, and a controller that controls the switch. In the height direction, the busbar is located closer to the upper end faces of the battery cells than to the lower end faces; the controller is located closer to the lower end faces of the battery cells than to the upper end faces; and the switch is located between the busbar and the controller.

10 Claims, 27 Drawing Sheets

(51) Int. Cl.
| | |
|---|---|
| *H01M 10/48* | (2006.01) |
| *H01M 2/10* | (2006.01) |
| *H02J 7/04* | (2006.01) |
| *H01M 10/04* | (2006.01) |
| *H01M 10/6563* | (2014.01) |
| *H01M 10/625* | (2014.01) |
| *B60L 50/64* | (2019.01) |
| *H01M 10/42* | (2006.01) |
| *B60L 58/26* | (2019.01) |
| *G01R 31/382* | (2019.01) |
| *H01M 10/647* | (2014.01) |
| *G01R 15/20* | (2006.01) |
| *G01R 1/18* | (2006.01) |

(52) U.S. Cl.
CPC ....... *H01M 10/441* (2013.01); *H01M 10/482* (2013.01); *H01M 10/486* (2013.01); *H01M 10/625* (2015.04); *H01M 10/6563* (2015.04); *H02J 7/04* (2013.01); *B60L 2270/145* (2013.01); *B60L 2270/147* (2013.01); *G01R 1/18* (2013.01); *G01R 15/205* (2013.01); *H01M 10/647* (2015.04); *H01M 2010/4271* (2013.01)

(58) Field of Classification Search
CPC .......... H01M 10/0413; H01M 2/1083; H01M 10/647; H01M 2010/4271; H02J 7/04
USPC ........................................................ 320/117
See application file for complete search history.

(56) References Cited

U.S. PATENT DOCUMENTS

| | | | |
|---|---|---|---|
| 6,411,063 B1 | 6/2002 | Kouzu et al. | |
| 6,507,169 B1* | 1/2003 | Holtom | B60L 53/11 |
| | | | 320/106 |
| 6,720,107 B1* | 4/2004 | Holtom | B60L 58/16 |
| | | | 429/105 |
| 8,541,979 B2* | 9/2013 | Firehammer | H02J 7/0014 |
| | | | 320/107 |
| 8,717,186 B2* | 5/2014 | Zhou | H01M 10/482 |
| | | | 340/636.11 |
| 9,660,237 B2* | 5/2017 | DeKeuster | H01M 2/12 |
| 9,722,233 B2* | 8/2017 | Tyler | G01R 31/3835 |
| 9,911,951 B2* | 3/2018 | DeKeuster | H01M 2/1077 |
| 2012/0129023 A1* | 5/2012 | Nakahama | H01M 2/02 |
| | | | 429/83 |
| 2012/0326672 A1 | 12/2012 | Dennis et al. | |
| 2013/0330577 A1 | 12/2013 | Kristofek et al. | |
| 2014/0002269 A1 | 1/2014 | Zhou | |
| 2015/0003136 A1 | 1/2015 | Inomata et al. | |
| 2015/0048684 A1 | 2/2015 | Rooyakkers et al. | |
| 2015/0115736 A1 | 4/2015 | Snyder | |
| 2015/0180257 A1 | 6/2015 | Snyder et al. | |
| 2015/0188198 A1* | 7/2015 | Bonhomme | B60L 50/64 |
| | | | 429/61 |
| 2016/0111901 A1* | 4/2016 | Waterford | G01R 31/382 |
| | | | 320/107 |
| 2016/0146859 A1* | 5/2016 | Futakuchi | G01R 15/205 |
| | | | 324/117 R |
| 2016/0224048 A1 | 8/2016 | Rooyakkers et al. | |
| 2017/0288422 A1* | 10/2017 | Yang | H02J 7/0047 |
| 2017/0318987 A1* | 11/2017 | Jerabek | A47F 5/0838 |
| 2018/0123357 A1* | 5/2018 | Beaston | H02J 3/383 |
| 2018/0166887 A1* | 6/2018 | Ridley | H01M 8/188 |
| 2018/0331394 A1 | 11/2018 | Inoue | |
| 2018/0331395 A1 | 11/2018 | Inoue | |
| 2018/0331402 A1 | 11/2018 | Inoue | |

OTHER PUBLICATIONS

Dec. 12, 2019 Office Action issued in U.S. Appl. No. 15/976,071.
May 14, 2020 Notice of Allowance issued in U.S. Appl. No. 15/976,071.

* cited by examiner

FIG.13
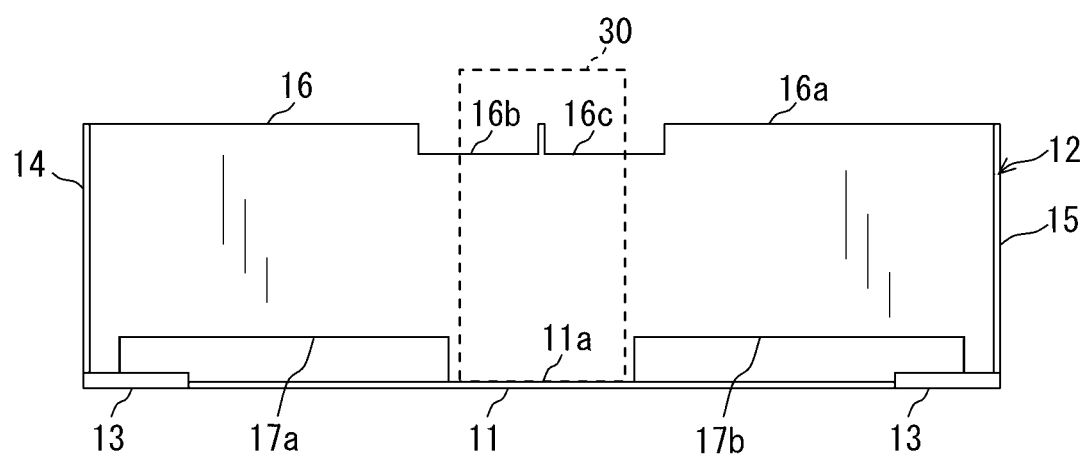
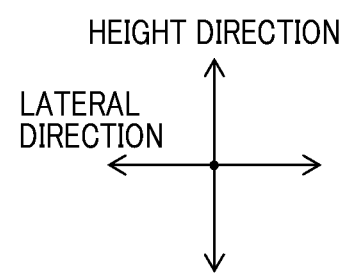

FIG.23
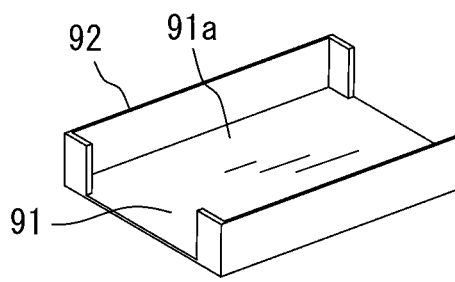
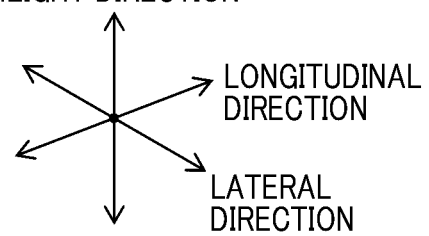

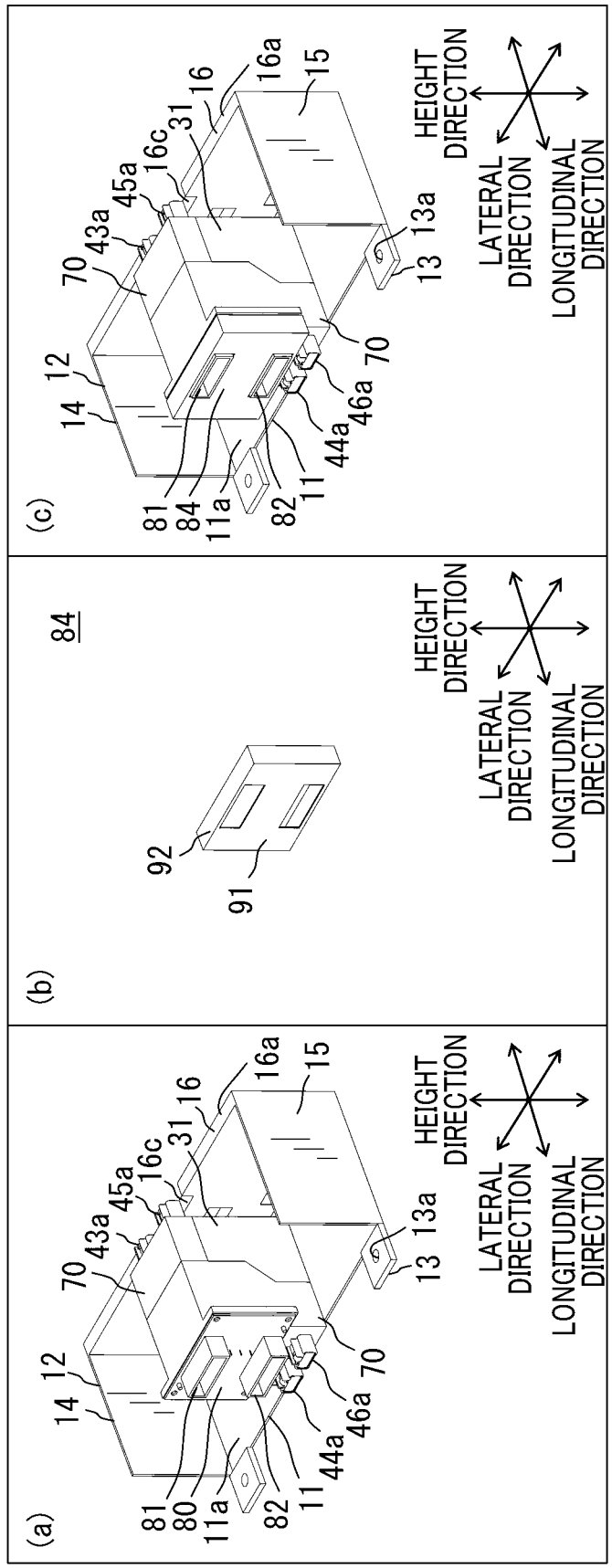

CONTROL MODULE

CROSS-REFERENCE TO RELATED APPLICATION

This application is based on and claims priority from Japanese Patent Application No. 2017-94218 filed on May 10, 2017, the content of which is hereby incorporated by reference in its entirety into this application.

BACKGROUND

1. Technical Field

The present invention relates to control modules for controlling battery modules.

2. Description of Related Art

Japanese Patent No. JP4117655B2 discloses a battery power source device which includes a battery pack, a charge/discharge circuit unit and a battery ECU (Electronic Control Unit). The battery pack includes two battery holders each having a predetermined number of battery modules received therein; each of the battery modules is formed by electrically connecting a plurality of battery cells in series with each other. The charge/discharge circuit unit includes a relay, a current sensor and the like. The battery ECU detects the state of battery capacity of the battery pack. The battery power source device is configured to output DC power for driving an electric motor.

In recent years, with the spread of hybrid and electric vehicles, the output power of electric motors has been increasing. Moreover, with increase in the output power of electric motors, the output power and capacities of battery modules, which supply DC power for driving electric motors, have also been increasing. Consequently, there is a trend of increasing the sizes of battery modules.

As described above, the battery power source device disclosed in the patent document includes the charge/discharge circuit unit and the battery ECU in addition to the battery pack. Therefore, it may be possible to suppress increase in the size of the battery power source device by arranging the charge/discharge circuit unit and the battery ECU close to each other while increasing the size of the battery pack which includes the battery modules. However, in this case, the separation distance (or clearance) between the charge/discharge circuit unit and the battery ECU would be shortened. Accordingly, the separation distance between the relay included in the charge/discharge circuit unit and the battery ECU would also be shortened. Consequently, it would become easier for the battery ECU to be affected by electromagnetic noise generated in the relay.

SUMMARY

According to an exemplary embodiment, there is provided a control module which is configured to be arranged in alignment with a battery module in a longitudinal direction. The battery module includes at least one battery stack that is comprised of a plurality of battery cells aligned with each other in the longitudinal direction. Each of the battery cells has an upper end face and a lower end face that are opposite to each other in a height direction perpendicular to the longitudinal direction. Each of the battery cells includes a pair of electrodes formed on the upper end face thereof. The control module includes a busbar configured to electrically connect the battery module to an electrical load, a switch configured to switch electrical connection of the busbar with the electrical load between a connected state and a disconnected state, and a controller configured to control switching operation of the switch. The busbar is located to be closer to the upper end faces of the battery cells than to the lower end faces of the battery cells in the height direction. The controller is located to be closer to the lower end faces of the battery cells than to the upper end faces of the battery cells in the height direction. The switch is located between the busbar and the controller in the height direction.

With the above configuration, between the busbar and the controller, there is formed a space whose height depends on the height of the battery cells; in this space, the switch is arranged. Consequently, the height of the control module and thus the volume of the control module are prevented from being increased due to the arrangement of the switch therein.

Moreover, a connection point (or connection portion) between the busbar and the switch is located away from the controller by about the height of the switch. Consequently, the influence of electromagnetic noise, which is generated at the connection point during switching operation of the switch, on the controller is suppressed. In addition, the influence of heat generated in the switch on the controller is also suppressed.

BRIEF DESCRIPTION OF THE DRAWINGS

The present invention will be understood more fully from the detailed description given hereinafter and from the accompanying drawings of one exemplary embodiment, which, however, should not be taken to limit the present invention to the specific embodiment but are for the purpose of explanation and understanding only.

In the accompanying drawings:

FIG. 13 is a front view of the control module housing;

FIG. 23 is a perspective view of a control cover of the battery ECU;

FIG. 28 is a diagram including various views of components of the control module according to the second modification.

DESCRIPTION OF EMBODIMENT

A battery pack 300 according to an embodiment will be described hereinafter with reference to FIGS. 1-24.

In the present embodiment, the battery pack 300 is designed to be used in, for example, a hybrid vehicle. The battery pack 300 is a three-dimensional object having a length, a width and a height. Accordingly, the battery pack 300 defines a longitudinal direction (or length direction), a lateral direction (or width direction) and a height direction, which are perpendicular to each other.

In addition, in the present embodiment, the battery pack 300 is mounted in the hybrid vehicle so that: the longitudinal direction of the battery pack 300 coincides with the left-right direction (or lateral direction) of the vehicle; the lateral direction of the battery pack 300 coincides with the forward-backward direction (or longitudinal direction) of the vehicle; and the height direction of the battery pack 300 coincides with the vertical direction (or height direction) of the vehicle.

For the sake of convenience of explanation, hereinafter, planes which are defined by both the longitudinal and lateral directions of the battery pack 300 will be referred to as horizontal planes; planes which are defined by both the longitudinal and height directions of the battery pack 300 will be referred to as longitudinal planes; and planes which are defined by both the lateral and height directions of the battery pack 300 will be referred to as lateral planes.

(Overview of Battery Pack)

Figure 1:
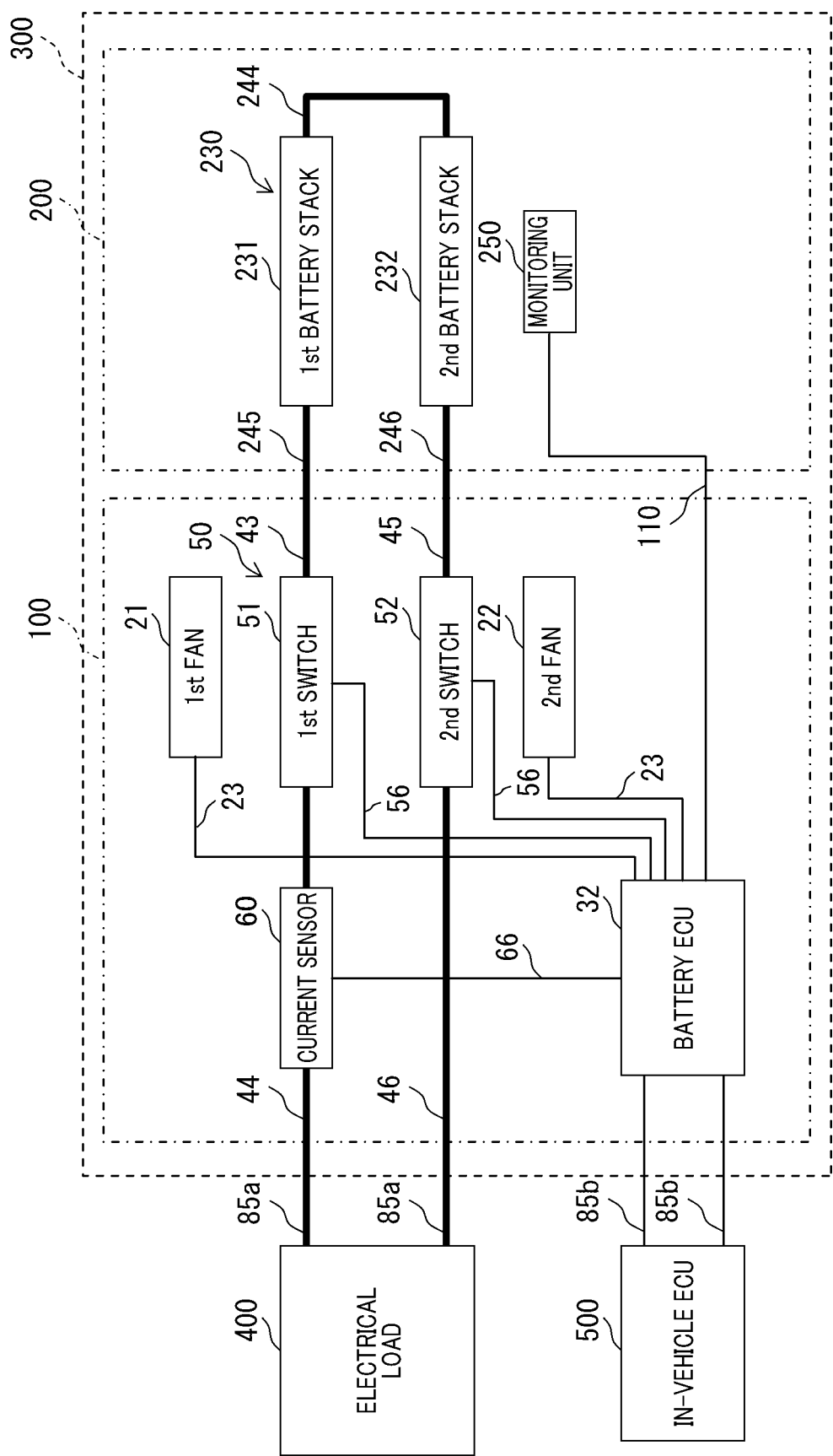
FIG. 1 is a functional block diagram of a battery pack according to an embodiment.

Referring first to FIG. 1, in the present embodiment, the battery pack 300 is provided in the hybrid vehicle to supply electric power to an electrical load 400 which is, for example, a motor-generator. Specifically, when the motor-generator functions as an electric motor to generate mechanical power, the battery pack 300 discharges to supply electric power to the motor-generator. On the other hand, when the motor-generator functions as an electric generator to generate electric power, the battery pack 300 is charged with the electric power generated by the motor-generator. In addition, the battery pack 300 may also supply electric power to other electrical loads than the motor-generator.

The battery pack 300 includes a battery ECU (Electronic Control Unit) 32. The battery ECU 32 is electrically connected with an in-vehicle ECU 500 provided in the hybrid vehicle. The battery ECU 32 transmits and receives signals to and from the in-vehicle ECU 500, so as to together control the hybrid vehicle. In addition, the battery ECU 32 may also be electrically connected with various other ECUs provided in the hybrid vehicle.

The battery pack 300 includes battery stacks 230 each of which is formed by electrically connecting a plurality of battery cells 240 in series with each other. The battery ECU 32 outputs to the in-vehicle ECU 500 a signal indicative of the state of charge of the battery stacks 230. The in-vehicle ECU 500 generates a command signal based on the signal outputted from the battery ECU 32, vehicle information provided by various sensors mounted in the vehicle and the on/off state of an ignition switch of the vehicle; the vehicle information may include, for example, the amount of depression of an accelerator pedal of the vehicle and the opening degree of a throttle valve of the vehicle. Then, the in-vehicle ECU 500 outputs the command signal to the battery ECU 32, so that the battery ECU 32 can control a system main relay 50 (to be described in detail later) in accordance with the command signal.

In the present embodiment, the battery pack 300 is arranged in a space under a rear seat of the hybrid vehicle. In addition, the space under the rear seat is wider than a space under a front seat of the hybrid vehicle.

The height of the rear seat in the vertical direction (or the height direction of the battery pack 300) is determined according to the degree of comfort felt by an occupant seated on the rear seat. The width of the rear seat in the forward-backward direction of the vehicle (or the lateral direction of the battery pack 300) is also determined according to the degree of comfort felt by an occupant seated on the rear seat. On the other hand, the length of the rear seat in the left-right direction of the vehicle (or the longitudinal direction of the battery pack 300) is determined according to the size of the hybrid vehicle. Accordingly, the size of the space under the rear seat, in which the battery pack 300 is arranged, depends on the size of the hybrid vehicle and the degree of comfort felt by an occupant seated on the rear seat.

Moreover, the degree of comfort felt by an occupant seated on the rear seat is determined based on ergonomics and the like. Therefore, the degree of freedom in setting the height and the width of the space under the rear seat is low. In contrast, the length of the space under the rear seat, which depends on the size of the hybrid vehicle, can be set to be considerably greater than the height and the width of the space.

(Overview of Battery Module)

As shown in FIGS. 1-5, in the present embodiment, the battery pack 300 includes a battery module 200 and a control module 100. The battery module 200 and the control module 100 are aligned with each other in the longitudinal direction of the battery pack 300. Moreover, the battery module 200 and the control module 100 are connected with each other both mechanically and electrically.

The battery module 200 has both the function of a power supply source and the function of a charging power source. The control module 100 controls the input and output of electric power to and from the battery module 200. Moreover, the control module 100 also controls cooling of the battery stacks 230 that are included in the battery module 200. In addition, the control module 100 commands the battery module 200 to perform a process of balancing the battery cells 240.

As shown in FIGS. 2-5, the battery module 200 includes a battery module housing 210 and the battery stacks 230. The battery module housing 210 is shaped in a rectangular box having an opening at one end and a bottom at the other in the height direction of the battery pack 300. The battery module housing 210 is arranged to have its length in the longitudinal direction of the battery pack 300. The battery stacks 230 are received in the battery module housing 210. Each of the battery stacks 230 is comprised of a plurality of battery cells 240 that are aligned in the longitudinal direction of the battery pack 300. Moreover, the battery cells 240 are connected, both mechanically and electrically, in series with each other. In addition, each of the battery cells 240 is implemented by a secondary battery that generates electromotive force by chemical reactions.

In the present embodiment, the battery module 200 includes two battery stacks 230, i.e., a first battery stack 231 and a second battery stack 232. The first and second battery stacks 231 and 232 are electrically connected in series with each other. Therefore, the output voltage of the battery module 200 is equal to the sum of the output voltages of all the battery cells 240 of the first and second battery stacks 231 and 232.

As shown in FIG. 1, the battery module 200 also includes a monitoring unit 250 that monitors the output voltage of each of the battery cells 240 of the battery stacks 230.

In addition, though not shown in the figures, the monitoring unit 250 includes a flexible substrate on which are mounted electronic elements and a monitoring IC chip. The electronic elements include a fuse, a Zener diode and temperature sensors. The monitoring IC chip includes a plurality of switches and a microcomputer.

The monitoring unit 250 is arranged on the battery stacks 230. That is, the monitoring unit 250 is mounted to the battery module housing 210 via the battery stacks 230. More specifically, the monitoring unit 250 is arranged on upper end faces 240a of the battery cells 240 which will be described in detail later.

On the flexible substrate, there are provided a plurality of detection electrodes each corresponding to one of the battery cells 240 and a plurality of wiring patterns each corresponding to one of the battery cells 240. Moreover, on the flexible substrate, there are also provided, for each of the wiring patterns, electronic elements corresponding to the wiring pattern. Each of the wiring patterns is electrically connected with the monitoring IC chip. Each of the switches of the monitoring IC chip corresponds to one of the wiring patterns. Consequently, by controlling the on/off operation of each of the switches, it is possible to control the charge/discharge of that one of the battery cells 240 which is electrically connected with the wiring pattern corresponding to the switch.

Furthermore, on the flexible substrate, there is also provided a connector that is electrically connected with the wiring patterns. Moreover, to the connector, there are connected a pair of internal wires 110. The internal wires 110 are also connected to the battery ECU 32 of the control module 100. Thus, the monitoring unit 250 and the battery ECU 32 are electrically connected to each other via the internal wires 110. Consequently, signals indicative of the output voltage and temperature of each of the battery cells 240 can be outputted from the monitoring unit 250 to the battery ECU 32.

Figure 4:
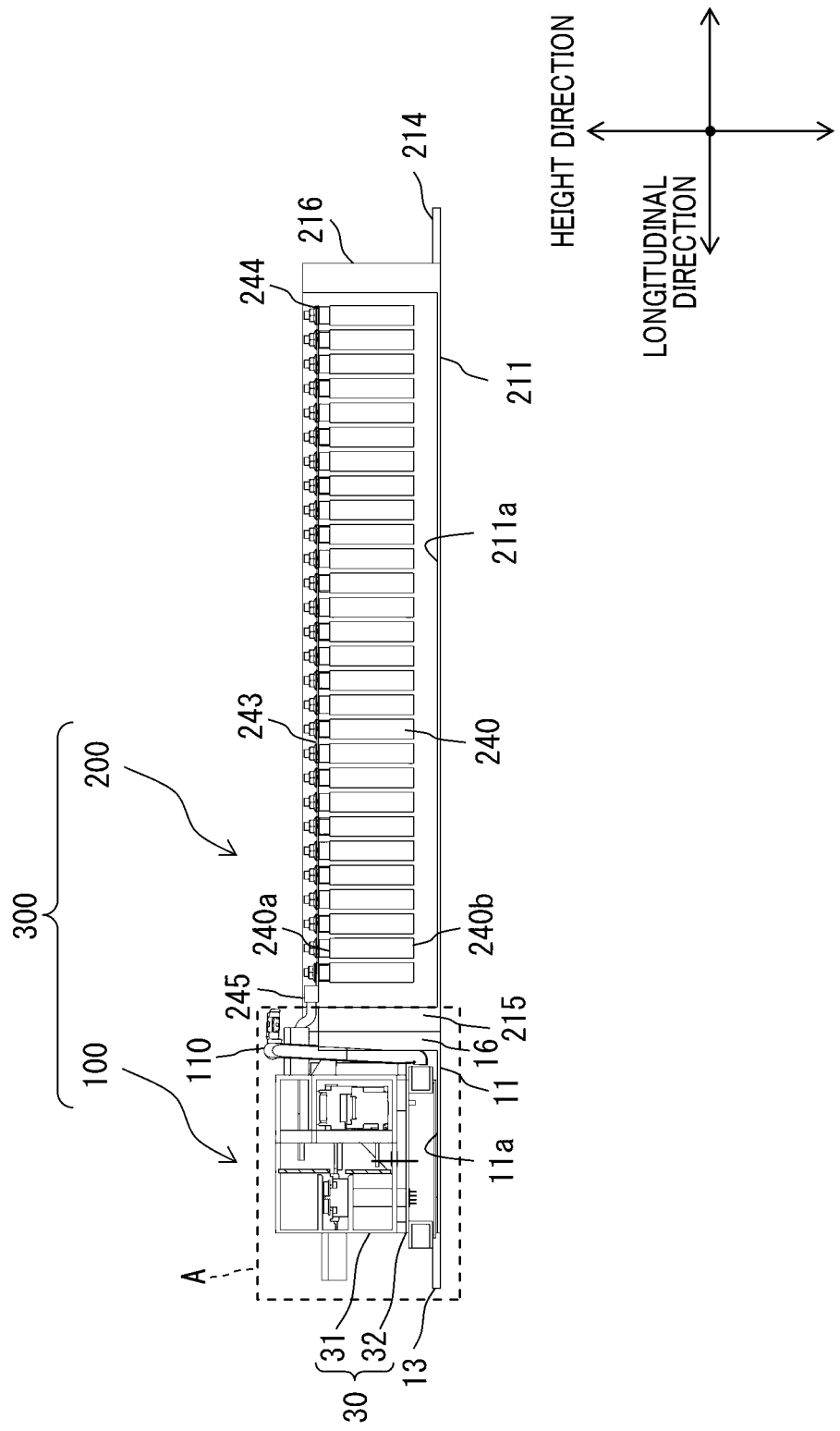
FIG. 4 is a cross-sectional view taken along the line IV-IV in FIG. 3.

As shown in FIG. 4, connection portions of the internal wires 110, which are connected to the connector of the monitoring unit 250, are located above the battery module housing 210 in the height direction of the battery pack 300. Moreover, though not shown in FIG. 4, the connection portions of the internal wires 110 are aligned with the monitoring unit 250 in the longitudinal direction of the battery pack 300.

As described above, each of the battery stacks 230 is comprised of the plurality of battery cells 240 that are connected in series with each other. However, due to manufacturing tolerances, the battery cells 240 vary in performance and characteristics. Therefore, with repeated charge/discharge of the battery cells 240, the SOCs (or States of Charge) of the battery cells 240 become different from one another. In addition, for each of the battery cells 240, the SOC of the battery cell 240 has a correlation with the electromotive force of the battery cell 240.

Because of the nature of the battery cells 240, it is necessary to prevent over-discharge and over-charge of the battery cells 240. Here, the term "over-discharge" denotes a phenomenon that the SOCs of the battery cells 240 become extremely low, whereas the term "over-charge" denotes a phenomenon that the SOCs of the battery cells 240 become extremely high. When the SOCs of the battery cells 240 are different from one another, the degrees of the battery cells 240 leading to over-discharge or over-charge are also different from one another. Therefore, to reliably prevent over-discharge and over-charge of the battery cells 240, it is necessary to balance the SOCs of the battery cells 240. In other words, it is necessary to keep the SOC of each of the battery cells 240 in agreement with the arithmetic mean of the SOCs of all the battery cells 240. In addition, for each of the battery stacks 230, the arithmetic mean of the SOCs of all the battery cells 240 forming the battery stack 230 represents the SOC of the battery stack 230.

In view of the above, in the present embodiment, the monitoring unit 250 detects and monitors the output voltage (or electromotive force) of each of the battery cells 240 which has a correlation with the SOC of the battery cell 240. The detected output voltage is then inputted to the battery ECU 32 of the control module 100. In the battery ECU 32, there is stored the correlation between the SOC and output voltage of each of the battery cells 240. The battery ECU 32 calculates the SOC of each of the battery cells 240 based on the inputted output voltage of the battery cell 240 and the correlation stored therein. Then, based on the calculated SOCs of all the battery cells 240, the battery ECU 32 determines whether it is necessary to perform the process of balancing the SOCs of all the battery cells 240. When it is determined that it is necessary to perform the balancing process, the battery ECU 32 outputs a command signal to the microcomputer of the monitoring IC chip of the monitoring unit 250. Upon receipt of the command signal, the microcomputer of the monitoring IC chip performs the balancing process by controlling the on/off operation of the switches of the monitoring IC chip and thus the charge/discharge of the corresponding battery cells 240.

In addition, as described previously, the temperature of each of the battery cells 240 is also inputted to the battery ECU 32 from the monitoring unit 250. For each of the battery cells 240, the SOC of the battery cell 240 also has a correlation with the temperature of the battery cell 240. Therefore, more strictly speaking, in the battery ECU 32, there is stored the correlation between the SOC, output voltage and temperature of each of the battery cells 240; the battery ECU 32 calculates the SOC of each of the battery cells 240 based on the inputted output voltage and temperature of the battery cell 240 and the correlation stored therein.

(Configuration of Battery Module)

Hereinafter, the configuration of the battery module 200 will be described in detail with reference to FIGS. 6-9.

As described previously, the battery module 200 includes the battery module housing 210 and the battery stacks 230 (i.e., the first and second battery stacks 231 and 232).

The battery module housing 210 is formed, for example, of aluminum. More particularly, in the present embodiment, the battery module housing 210 is formed by aluminum die casting.

Figure 6:
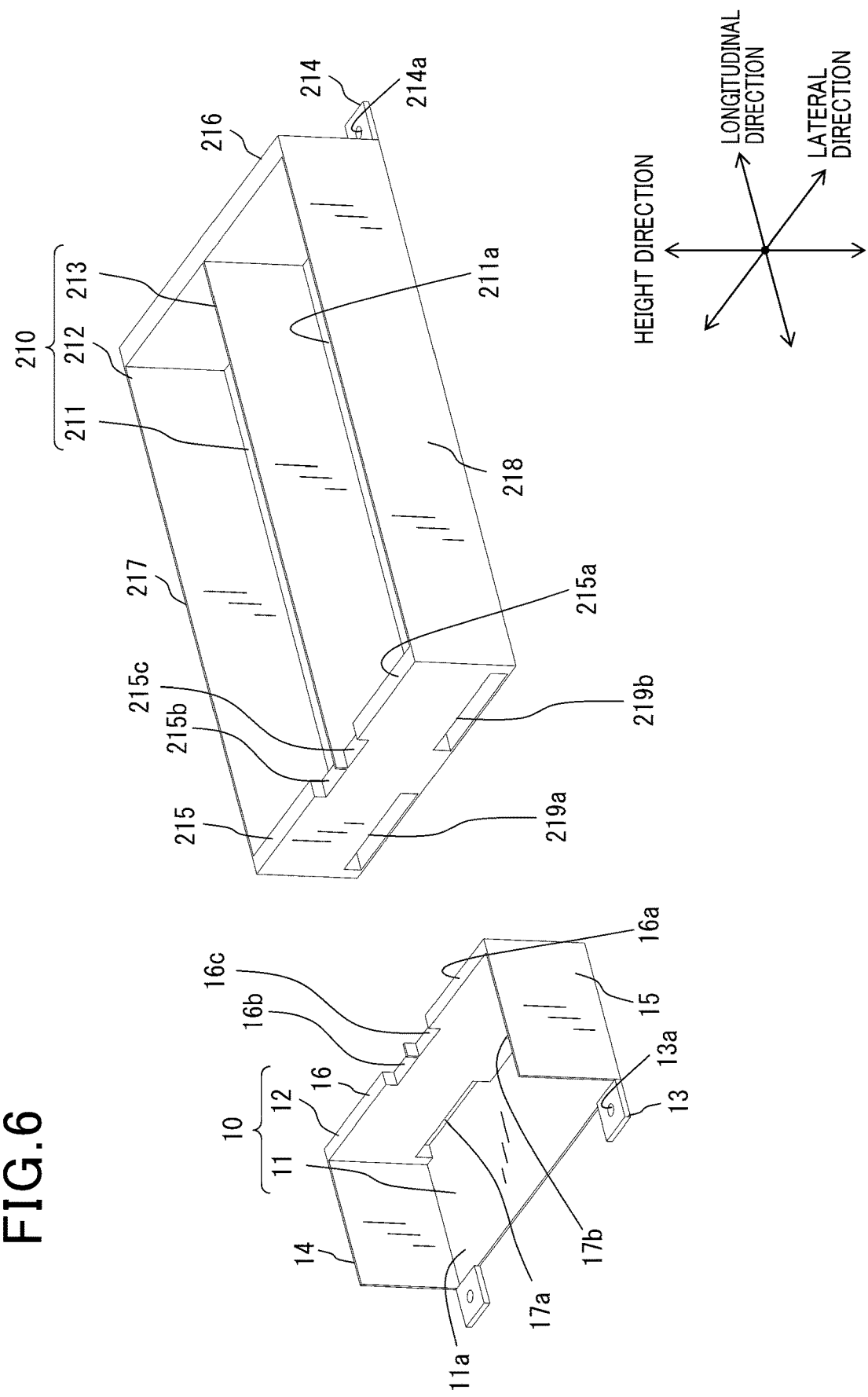
FIG. 6 is an exploded perspective view of a battery module housing and a control module housing of the battery pack.
Figure 7:
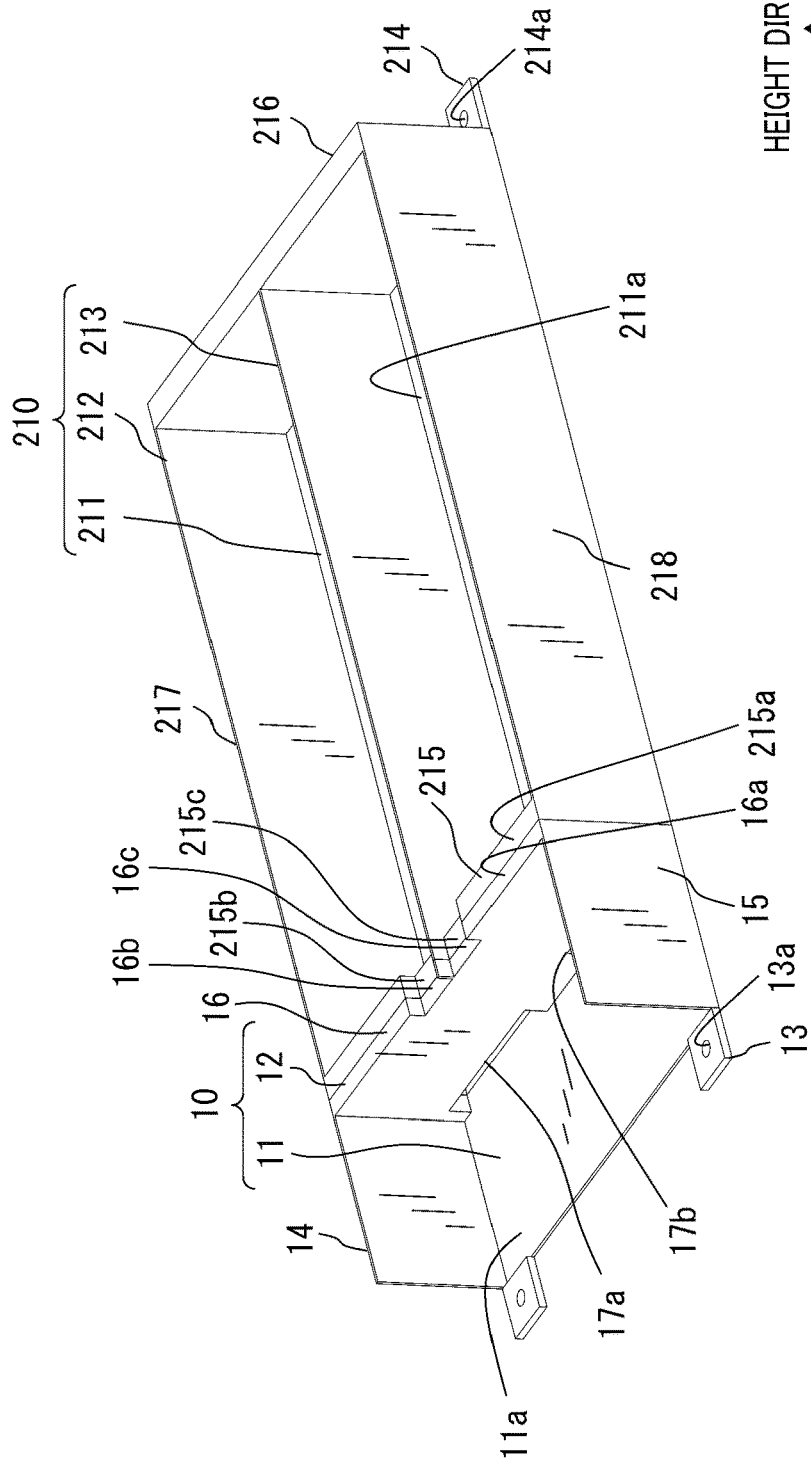
FIG. 7 is a perspective view of the battery module housing and the control module housing assembled to each other.

As shown in FIGS. 6 and 7, the battery module housing 210 has a bottom wall 211, a circumferential wall (or side wall) 212 and a partition wall 213.

The bottom wall 211 is in the shape of a rectangle that is longer in the longitudinal direction than in the lateral direction on a horizontal plane defined by the longitudinal and lateral directions.

Figure 8:
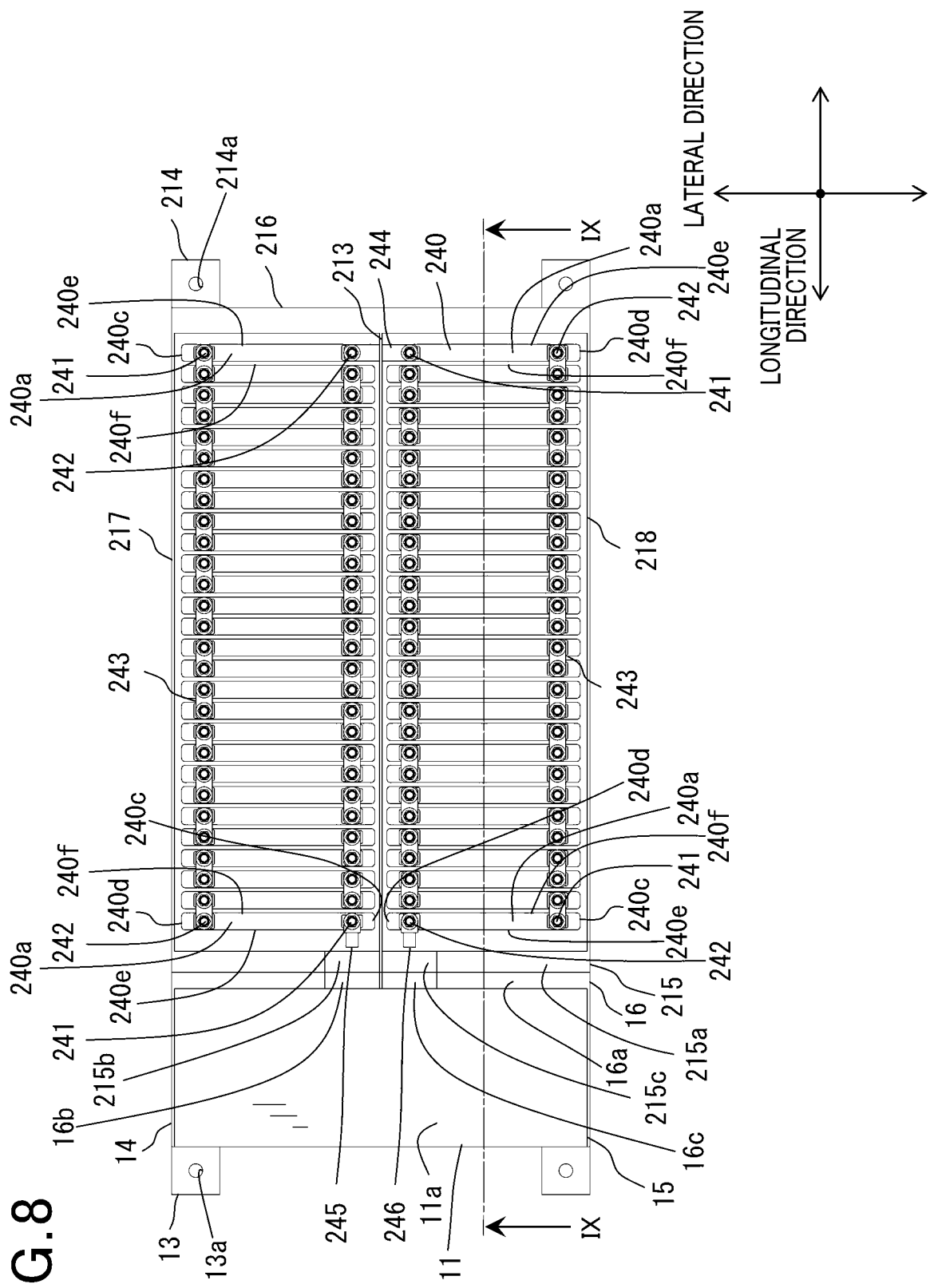
FIG. 8 is a top view of the battery module housing and the control module housing assembled to each other, wherein the battery module housing has first and second battery stacks mounted therein.
Figure 9:
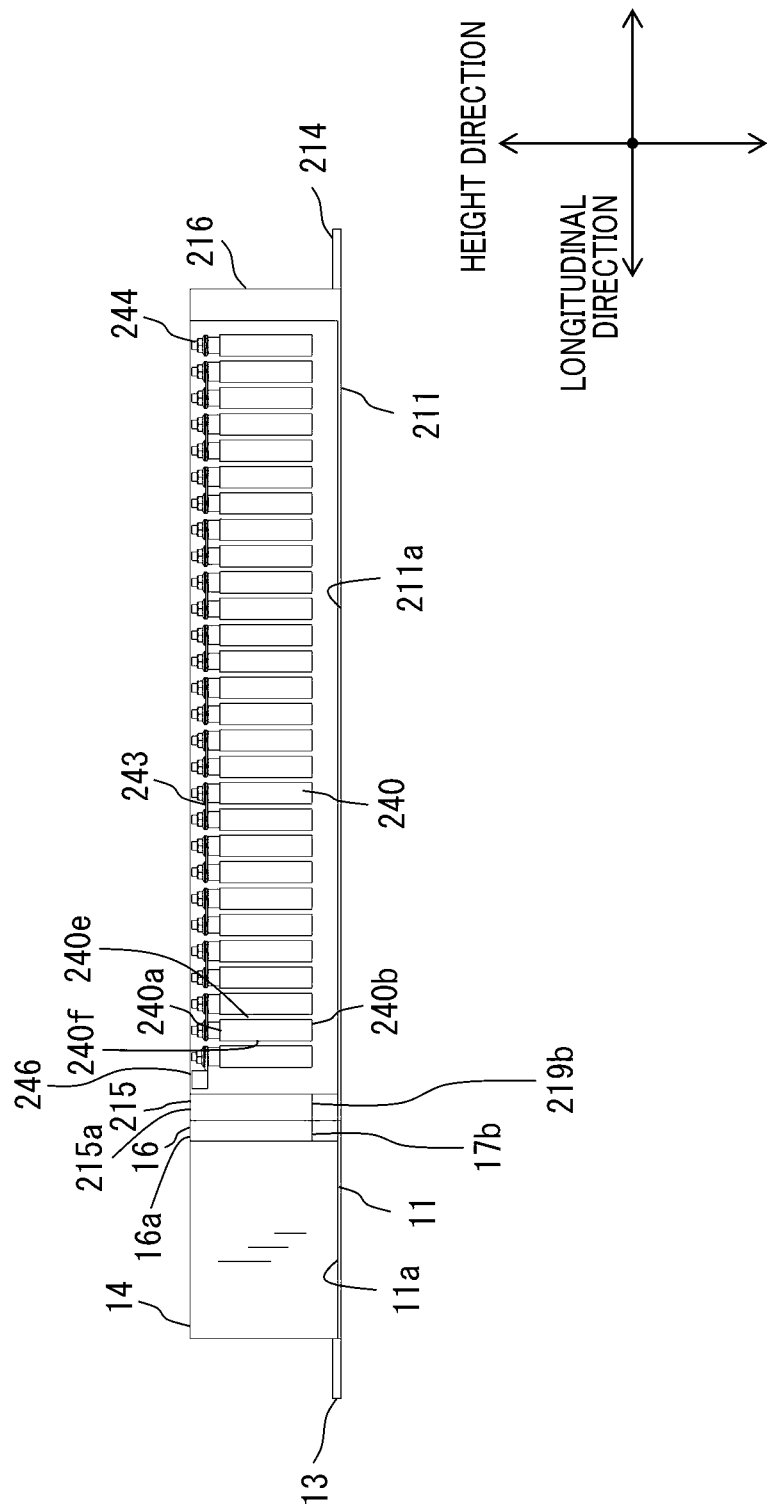
FIG. 9 is a cross-sectional view taken along the line IX-IX in FIG. 8.

Moreover, as shown in FIGS. 8 and 9, in the bottom wall 211, there are formed ribs 214 for fixing the battery module 200 to a body of the hybrid vehicle by bolts. More particularly, in the present embodiment, there are formed two ribs 214 respectively at two corners of the bottom wall 211 which are on the opposite side to the control module 100 in the longitudinal direction of the battery pack 300. Accordingly, the two ribs 214 are aligned with each other in the lateral direction of the battery pack 300. In each of the ribs 214, there is formed a bolt hole 214a through which a bolt (not shown) is fastened to fix the battery module 200 to the body of the hybrid vehicle.

In addition, the partition wall 213 may be formed separately from and assembled to the bottom wall 211 and the circumferential wall 212. Further, the partition wall 213 may be formed of a different material from the bottom wall 211 and the circumferential wall 212.

The circumferential wall 212 includes a left wall 215, a right wall 216, a front wall 217 and a rear wall 218. Each of the left and right walls 215 and 216 is in the shape of a rectangle that is longer in the lateral direction than in the height direction on a lateral plane defined by the lateral and height directions. The left and right walls 215 and 216 are spaced from and face each other in the longitudinal direction. On the other hand, each of the front and rear walls 217 and 218 is in the shape of a rectangle that is longer in the longitudinal direction than in the height direction on a longitudinal plane defined by the longitudinal and height directions. The front and rear walls 217 and 218 are spaced from and face each other in the lateral direction. Moreover, the left wall 215, the front wall 217, the right wall 216 and the rear wall 218 are arranged in this order in the circumferential direction of the battery module housing 210 around the height direction, and connected with one another. In addition, each of the left wall 215, the front wall 217, the right wall 216 and the rear wall 218 is connected with a peripheral portion of an upper surface (or inside surface) 211a of the bottom wall 211. Consequently, there is defined an accommodation space by the circumferential wall 212 above the bottom wall 211.

Though not shown in the figures, the battery module 200 also includes a lid that covers the opening of the battery module housing 210. It should be noted that in the lid, between the lid and the battery module housing 210 or in the battery module housing 210, there are formed openings through which air flows into and out of the battery module housing 210. In addition, these openings are formed on the right wall 216 side.

The partition wall 213 is provided in the accommodation space formed inside the battery module housing 210. The partition wall 213 is in the shape of a rectangle that is longer in the longitudinal direction than in the height direction on a longitudinal plane defined by the longitudinal and height directions. By the partition wall 213, the accommodation space is partitioned into two parts in the lateral direction.

Hereinafter, for the sake of convenience of explanation, that part of the accommodation space which is surrounded by the left wall 215, the front wall 217, the right wall 216 and the partition wall 213 will be referred to as first accommodation space; that part of the accommodation space which is surrounded by the left wall 215, the rear wall 218, the right wall 216 and the partition wall 213 will be referred to as second accommodation space.

In the first accommodation space, there is accommodated the first battery stack 231. On the other hand, in the second accommodation space, there is accommodated the second battery stack 232.

As described previously, each of the first and second battery stacks 231 and 232 is comprised of a plurality of battery cells 240 that are electrically connected in series with each other. Each of the battery cells 240 is in the shape of a rectangular prism with six faces.

More specifically, each of the battery cells 240 has: an upper end face (or top face) 240a and a lower end face (or bottom face) 240b that face away from each other in the height direction; a first side face 240c and a second side face 240d that face away from each other in the lateral direction; and a first major face 240e and a second major face 240f that face away from each other in the longitudinal direction. In addition, the first and second major faces 240e and 240f have a larger area than the other faces 240a-240d.

Each of the battery cells 240 is a secondary battery. More particularly, in the present embodiment, each of the battery cells 240 is implemented by a lithium-ion battery that generates electromotive force by chemical reactions. The generated electromotive force causes electric current to flow in the battery cells 240, thereby generating heat. Moreover, the generated heat causes the battery cells 240 to swell. As described above, the first and second major faces 240e and 240f of the battery cells 240 have a larger area than the other faces 240a-240d of the battery cells 240. Therefore, it is easier for the first and second major faces 240e and 240f to swell than for the other faces 240a-240d to swell. Consequently, the battery cells 240 swell in the longitudinal direction of the battery pack 300. That is, the battery cells 240 swell in the direction in which the battery cells 240 are aligned with each other.

The battery stacks 230 include restraints (not shown) by which the battery cells 240 are mechanically connected in series with each other in the longitudinal direction. The restraints restrain the swelling of the battery cells 240, thereby suppressing the increase in the size of the battery stacks 230 due to the swelling. In addition, between each adjacent pair of the battery cells 240, there is provided an air gap through which air flows to facilitate the dissipation of heat from the battery cells 240.

As will be described in detail later, in the battery module 200, there is provided a ventilation space under the battery stacks 230. In operation, air flows from a vacant part of the accommodation space above the battery stacks 230 to the ventilation space under the battery stacks 230 through the air gaps between the battery cells 240. In other words, air flows from the upper end face 240a side to the lower end face 240b side of the battery cells 240 through the air gaps.

As shown in FIG. 8, each of the battery cells 240 has a positive terminal 241 and a negative terminal 242 formed on the upper end face 240a of the battery cell 240. The positive terminal 241 and the negative terminal 242 are aligned with each other in the lateral direction of the battery pack 300. More specifically, the positive terminal 241 is located on the first side face 240c side while the negative terminal 242 is located on the second side face 240d side of the battery cell 240 in the lateral direction. In addition, the positive and negative terminals 241 and 242 respectively correspond to positive and negative electrodes of the battery cell 241.

Hereinafter, the arrangement of the battery cells 240 of the first and second battery stacks 231 and 232 will be explained in detail.

In addition, in the following explanation, the battery cells 240 of each of the first and second battery stacks 231 and 232 are numbered from the left wall 215 side to the right wall 216 side in the battery module housing 210.

As shown in FIG. 8, for each of the first and second battery stacks 231 and 232, the first battery cell 240 of the battery stack is arranged to have its first major face 240e facing the left wall 215 of the battery module housing 210 in the longitudinal direction. Moreover, the first battery cell 240 of the first battery stack 231 has its first side face 240c facing the partition wall 213 of the battery module housing 210 and its second side face 240d facing the front wall 217 of the battery module housing 210. In contrast, the first battery cell 240 of the second battery stack 232 has its first side face 240c facing the rear wall 218 of the battery module housing 210 and its second side face 240d facing the partition wall 213 of the battery module housing 210.

Accordingly, the first battery cell 240 of the first battery stack 231 has its positive terminal 241 located on the partition wall 213 side and its negative terminal 242 located on the front wall 217 side. In contrast, the first battery cell 240 of the second battery stack 232 has its negative terminal 242 located on the partition wall 213 side and its positive terminal 241 located on the rear wall 218 side.

Moreover, for each of the first and second battery stacks 231 and 232, the second battery cell 240 of the battery stack is arranged to have its second major face 240f facing the second major face 240f of the first battery cell 240 of the battery stack in the longitudinal direction. Accordingly, the negative terminal 242 of the first battery cell 240 and the positive terminal 241 of the second battery cell 240 are aligned with each other in the longitudinal direction; the positive terminal 241 of the first battery cell 240 and the negative terminal 242 of the second battery cell 240 are aligned with each other in the longitudinal direction.

Similarly, the remaining battery cells 240 are arranged so that for each longitudinally-adjacent pair of the battery cells 240, the second major faces 240f of the pair of the battery cells 240 face each other in the longitudinal direction. Accordingly, for each longitudinally-adjacent pair of the battery cells 240, the positive and negative terminals 241 and 242 of one of the pair of the battery cells 240 respectively face the negative and positive terminals 242 and 241 of the other of the pair of the battery cells 240 in the longitudinal direction.

Consequently, for each of the first and second battery stacks 231 and 232, the positive terminals 241 of the battery cells 240 of the battery stack are arranged alternately with the negative terminals 242 of the battery cells 240 of the battery stack in the longitudinal direction.

Furthermore, for each of the first and second battery stacks 231 and 232, all the battery cells 240 of the battery stack are electrically connected in series with each other by a plurality of first connecting members 243 that extend in the longitudinal direction. Specifically, for each longitudinally-adjacent pair of the battery cells 240, the positive terminal 241 of one of the pair of the battery cells 240 is electrically connected with the negative terminal 242 of the other of the pair of the battery cells 240 by one of the first connecting members 243.

In addition, the manner of electrically connecting the terminals of the battery cells 240 of the first battery stack 231 is opposite to the manner of electrically connecting the terminals of the battery cells 240 of the second battery stack 232. Specifically, in the first battery stack 231, the negative terminal 242 of the first battery cell 240 and the positive terminal 241 of the second battery cell 240 are electrically connected with each other by one of the first connecting members 243. In contrast, in the second battery stack 232, the positive terminal 241 of the first battery cell 240 and the negative terminal 242 of the second battery cell 240 are electrically connected with each other by one of the first connecting members 243. Similarly, the polarities (being positive or negative) of the terminals of the remaining battery cells 240 connected by the respective first connecting members 243 in the first battery stack 231 are opposite to that in the second battery stack 232.

In the present embodiment, each of the first and second battery stacks 231 and 232 is comprised of an even number of battery cells 240. Moreover, the number of the battery cells 240 of the first battery stack 231 is equal to that of the second battery stack 232.

Accordingly, in the first battery stack 231, the last battery cell 240, which is located furthest from the left wall 215 of the battery module housing 210 among all the battery cells 240, has its first major face 240e facing the right wall 216 of the battery module housing 210 and its second major face 240f facing the second major face 240f of the previous battery cell 240 in the longitudinal direction. Moreover, the last battery cell 240 has its positive terminal 241 located on the front wall 217 side and its negative terminal 242 located on the partition wall 213 side in the lateral direction. That is, the negative terminal 242 of the last battery cell 240 is located close to the center of the right wall 216 of the battery module housing 210 in the lateral direction.

On the other hand, in the second battery stack 232, the last battery cell 240, which is located furthest from the left wall 215 of the battery module housing 210 among all the battery cells 240, has its first major face 240e facing the right wall 216 of the battery module housing 210 and its second major face 240f facing the second major face 240f of the previous battery cell 240 in the longitudinal direction. Moreover, the last battery cell 240 has its positive terminal 241 located on the partition wall 213 side and its negative terminal 242 located on the rear wall 218 side in the lateral direction. That is, the positive terminal 241 of the last battery cell 240 is located close to the center of the right wall 216 of the battery module housing 210 in the lateral direction.

In the above manner, the negative terminal 242 of the last battery cell 240 of the first battery stack 231 and the positive terminal 241 of the last battery cell 240 of the second battery stack 232 are aligned with each other in the lateral direction with the partition wall 213 of the battery module housing 210 interposed between. Moreover, the negative terminal 242 of the last battery cell 240 of the first battery stack 231 and the positive terminal 241 of the last battery cell 240 of the second battery stack 232 are electrically connected with each other by a second connecting member 244 that extends in the lateral direction across the partition wall 213 of the battery module housing 210. Consequently, the first and second battery stacks 231 and 232 are electrically connected in series with each other. In addition, the partition wall 213 of the battery module housing 210 may have a groove formed therein so that the second connecting member 244 can extend through the groove.

As described previously, the positive terminal 241 of the first battery cell 240 of the first battery stack 231 is located on the partition wall 213 side, whereas the negative terminal 242 of the first battery cell 240 of the second battery stack 232 is located on the partition wall 213 side. Consequently, the positive terminal 241 of the first battery cell 240 of the first battery stack 231 and the negative terminal 242 of the first battery cell 240 of the second battery stack 232 are aligned with each other in the lateral direction with the partition wall 213 of the battery module housing 210 interposed between. That is, both the positive terminal 241 of the first battery cell 240 of the first battery stack 231 and the negative terminal 242 of the first battery cell 240 of the second battery stack 232 are located close to the center of the left wall 215 of the battery module housing 210 in the lateral direction.

To the positive terminal 241 of the first battery cell 240 of the first battery stack 231, there is connected a positive input/output terminal 245 both mechanically and electrically. Similarly, to the negative terminal 242 of the first battery cell 240 of the second battery stack 232, there is connected a negative input/output terminal 246 both mechanically and electrically.

Moreover, each of the positive and negative input/output terminals 245 and 246 is connected to the control module 100 both mechanically and electrically. Consequently, when the motor-generator (i.e., electrical load 400) functions as an electric motor to generate mechanical power, the output voltage of the battery module 200 is outputted to the motor-generator via the control module 100. On the other hand, when the motor-generator functions as an electric generator to generate electric power, the generated electric power is outputted to the battery module 200 via the control module 100.

In addition, as shown in FIG. 8, both the positive and negative input/output terminals 245 and 246 may be configured to be entirely accommodated in the accommodation space of the battery module housing 210. Alternatively, as shown in FIG. 10, both the positive and negative input/output terminals 245 and 246 may be configured to partially protrude outside the accommodation space of the battery module housing 210.

One end of the positive input/output terminal 245 is fixed by a bolt to the positive terminal 241 of the first battery cell 240 of the first battery stack 231. Similarly, one end of the negative input/output terminal 246 is fixed by a bolt to the negative terminal 242 of the first battery cell 240 of the second battery stack 232.

Moreover, as shown in FIG. 8, each of the positive and negative input/output terminals 245 and 246 may be shaped, at the other end thereof, in a hollow tube that opens in the lateral direction. In this case, either internal wall surfaces or external wall surfaces of the tubular ends of the positive and negative input/output terminals 245 and 246 may be electrically connected with corresponding busbars 40 of the control modules 100 which will be described in detail later.

Figure 10:
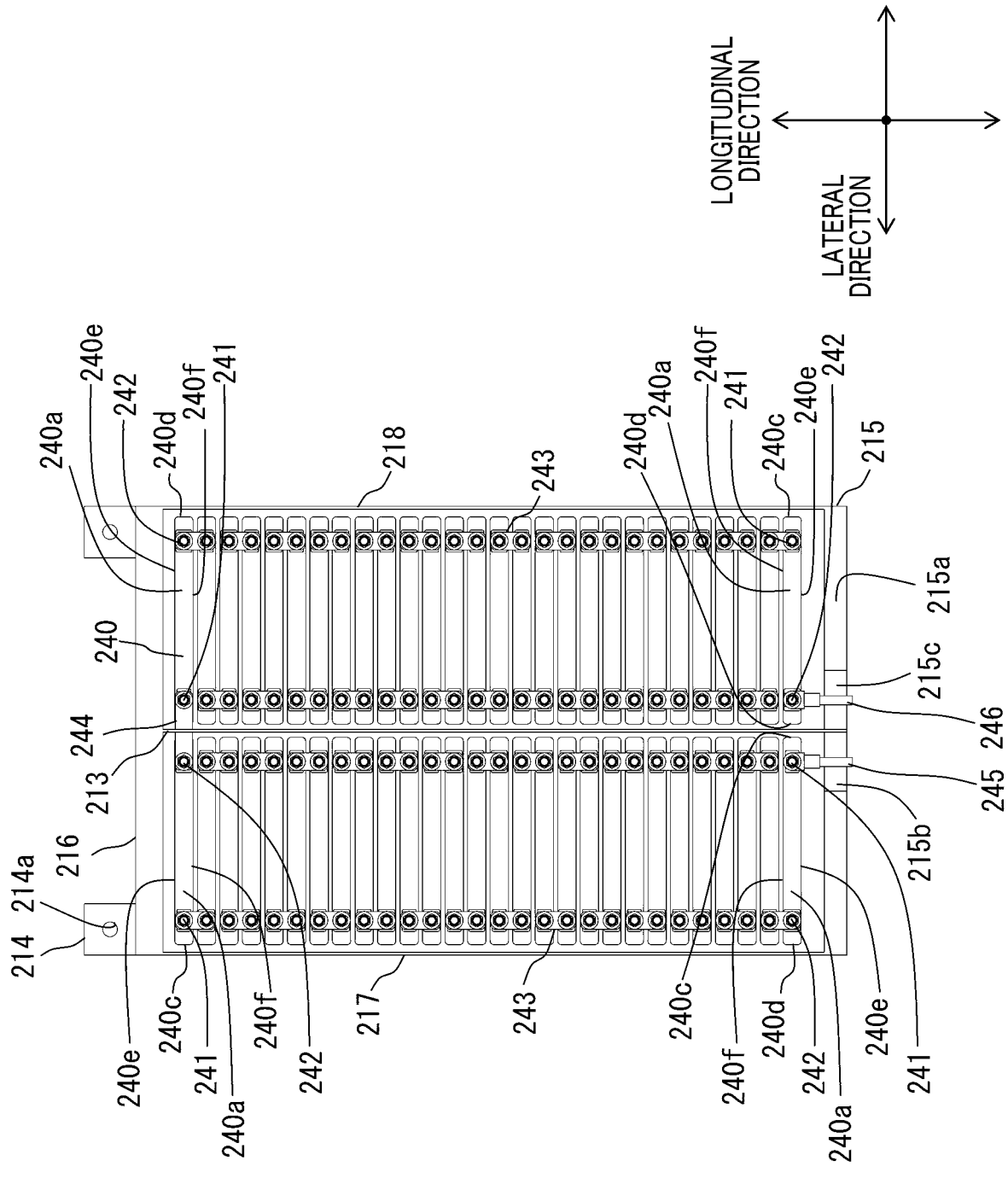
FIG. 10 is a top view of a battery module of the battery pack, the battery module including the battery module housing and the first and second battery stacks.

Alternatively, as shown in FIG. 10, each of the positive and negative input/output terminals 245 and 246 may be shaped, at the other end thereof, in a solid cylinder that extends in the longitudinal direction. In this case, outer wall surfaces of the cylindrical ends of the positive and negative input/output terminals 245 and 246 may be electrically connected with the corresponding busbars 40 of the control modules 100.

As above, each of the positive and negative input/output terminals 245 and 246 may be formed, at the other end thereof, into either a female fitting or a male fitting.

As shown in FIGS. 5-8, in a top surface 215a of the left wall 215 of the battery module housing 210, there is formed a first cut (or recess) 215b for electrically connecting the positive input/output terminal 245 with a positive busbar 41 of the control module 100, which will be described in detail later, at substantially the same height as the upper end faces 240a of the battery cells 240. Moreover, in the top surface 215a of the left wall 215, there is also formed a second cut (or recess) 215c for electrically connecting the negative input/output terminal 246 with a negative busbar 42 of the control module 100, which will be described in detail later, at substantially the same height as the upper end faces 240a of the battery cells 240.

In addition, in the present embodiment, there is formed a partition portion of the left wall 215 between the first and second cuts 215b and 215c. Therefore, the first and second accommodation spaces of the battery module housing 210 are separated from each other also at the first and second cuts 215b and 215c. Consequently, in the case where the first and second cuts 215b and 215c are not closed, air flowing in the first accommodation space and air flowing in the second accommodation space are prevented from being mixed together at the first and second cuts 215b and 215c.

It should be noted that the first and second cuts 215b and 215c may alternatively be formed continuously without a partition portion of the left wall 215 formed therebetween.

In the first cut 215b, there is received at least one of part of the positive busbar 41 and part of the positive input/output terminal 245. Similarly, in the second cut 215c, there is received at least one of part of the negative busbar 42 and part of the negative input/output terminal 246.

Specifically, as shown in FIG. 8, when both the positive and negative input/output terminals 245 and 246 are configured to be entirely accommodated in the accommodation space of the battery module housing 210, only part of the positive busbar 41 is received in the first cut 215b. Moreover, only part of the negative busbar 42 is received in the second cut 215c.

Otherwise, as shown in FIG. 10, when both the positive and negative input/output terminals 245 and 246 are configured to partially protrude outside the accommodation space of the battery module housing 210, either both part of the positive busbar 41 and part of the positive input/output terminal 245 or only part of the positive input/output terminal 245 is received in the first cut 215b. Moreover, either both part of the negative busbar 42 and part of the negative input/output terminal 246 or only part of the negative input/output terminal 246 is received in the second cut 215c.

In addition, in the first cut 215b, there may also be received part of one of the internal wires 110 in such as manner as to be in contact with a wall surface of the left wall 215 of the battery module housing 210 which defines the first cut 215b. Similarly, in the second cut 215c, there may also be received part of the other internal wire 110 in such as manner as to be in contact with a wall surface of the left wall 215 which defines the second cut 215c. Here, the internal wires 110 electrically connect the connector of the monitoring unit 250 of the battery module 200 to an internal connector 81 (to be described later) of the battery ECU 32 of the control module 100. Alternatively, in the left wall 215 of the battery module housing 210, there may be formed dedicated through-holes or cuts through which the internal wires 110 extend. Consequently, it is possible to position the internal wires 110 with respect to the left wall 215 and thereby suppress vibration of the internal wires 110. As a result, it is possible to ensure the reliability of electrical connection between the monitoring unit 250 of the battery module 200 and the battery ECU 32 of the control module 100.

Though not shown in the figures, on the bottom wall 211 of the battery module housing 210, there is formed a support for supporting the battery stacks 230. The support extends in the longitudinal direction of the battery pack 300 and has a mounting surface on which the battery stacks 230 are mounted. The mounting surface is located closer than the upper surface 211a of the bottom wall 211 to the opening of the battery module housing 210 in the height direction of the battery pack 300. Moreover, the support is formed on only part of the upper surface 211a of the bottom wall 211. In other words, the support is in contact with only part of the battery stacks 230. Consequently, as shown in FIG. 9, between the lower end faces 240b of the batter cells 240 forming the battery stacks 230 and the upper surface 211a of the bottom wall 211, there is formed the ventilation space whose height is substantially equal to the height of the support. The ventilation space is defined by the support, the lower end faces 240b of the batter cells 240, the partition wall 213 and the circumferential wall 212 of the battery module housing 210.

The ventilation space has a first part located in the first accommodation space of the battery module housing 210 and a second part located in the second accommodation space of the battery module housing 210. Hereinafter, for the sake of convenience of explanation, the first and second parts will be respectively referred to as first and second ventilation spaces. In addition, the first ventilation space is formed under the battery cells 240 of the first battery stack 231 while the second ventilation space is formed under the battery cells 240 of the second battery stack 232.

The height of the mounting surface of the support may be either constant or changed in the longitudinal direction of the battery stack 300. For example, the height of the mounting surface may be gradually decreased in the longitudinal direction from the left wall 215 to the right wall 216 of the battery module housing 210. In this case, the separation distance (or clearance) between the lower end faces 240b of the battery cells 240 and the upper surface 211a of the bottom wall 211 of the battery module housing 210 in the height direction is gradually shortened in the longitudinal direction from the left wall 215 to the right wall 216. Accordingly, the cross-sectional areas of the first and second ventilation spaces perpendicular to the longitudinal direction (i.e., flow areas of the first and second ventilation spaces) are gradually decreased in the longitudinal direction from the left wall 215 to the right wall 216. In other words, the flow areas of the first and second ventilation spaces are gradually increased in the longitudinal direction from the right wall 216 to the left wall 215. Consequently, the resistance to air flowing in the longitudinal direction in the first and second ventilation spaces is gradually decreased in the longitudinal direction from the right wall 216 to the left wall 215. As a result, air, which has flowed into the first and second ventilation spaces via openings formed in the right wall 216, can easily flow toward the left wall 215.

Figure 5:
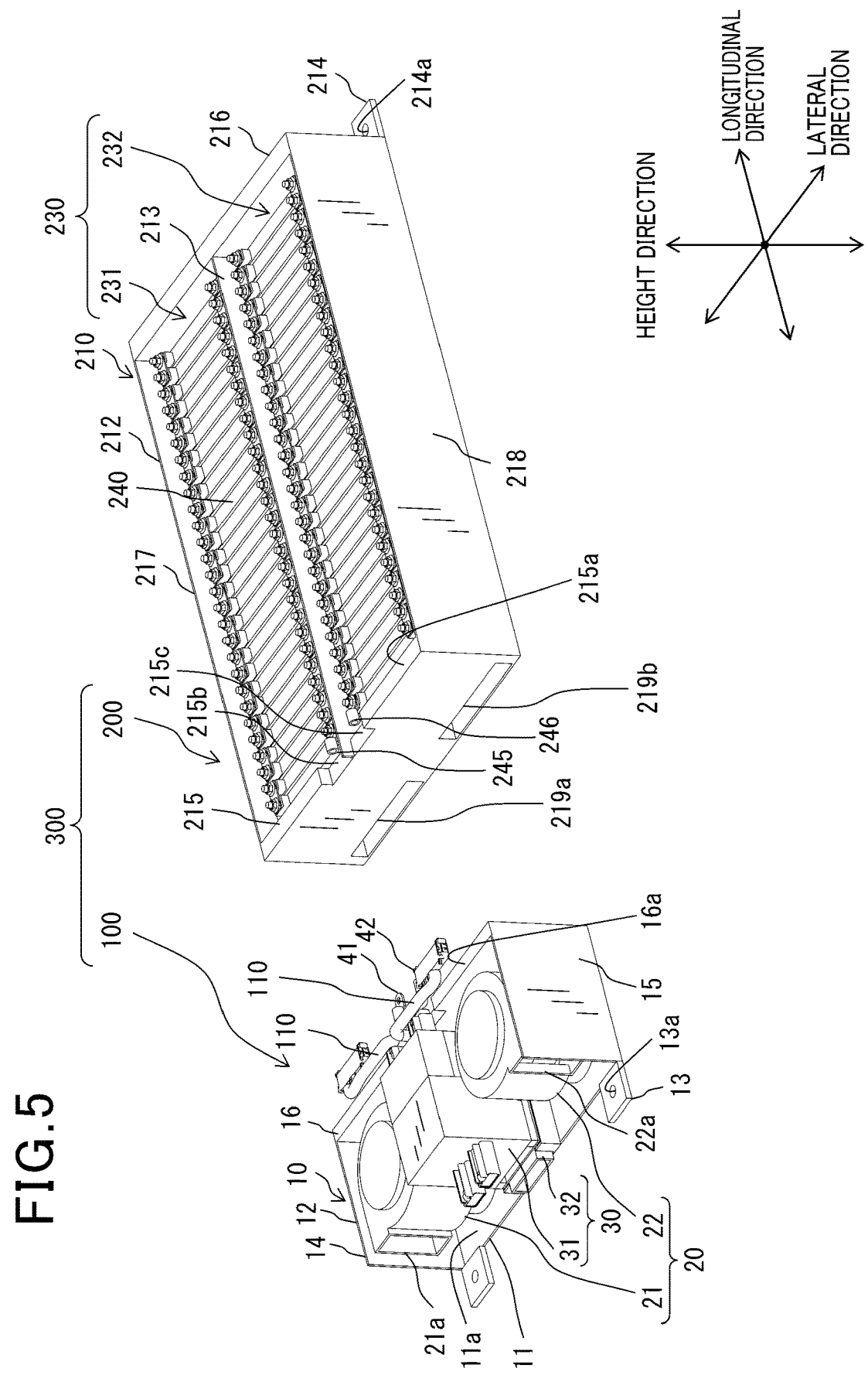
FIG. 5 is an exploded perspective view of the battery pack.

As shown in FIGS. 5-6 and 9, in the left wall 215 of the battery module housing 210, there are formed both a first ventilation hole 219a communicating with the first ventilation space and a second ventilation hole 219b communicating with the second ventilation space. Specifically, both the first and second ventilation holes 219a and 219b are formed in a lower part of the left wall 215 so as to adjoin the bottom wall 211 of the battery module housing 210. Therefore, the first and second ventilation holes 219a and 219b are spaced from the first and second cuts 215b and 215c in the height direction. Moreover, the first and second ventilation holes 219a and 219b are spaced from and aligned with each other in the lateral direction. In the present embodiment, only part of the first cut 215b and only part of the second cut 215c are formed above that part of the left wall 215 which is interposed between the first and second ventilation holes 219a and 219b in the lateral direction. Alternatively, the entire first cut 215b and the entire second cut 215c may be formed above that part of the left wall 215 which is interposed between the first and second ventilation holes 219a and 219b in the lateral direction. In addition, the first and second ventilation holes 219a and 219b constitute battery module-side ventilation holes of the battery pack 300.

(Overview of Control Module)

Figure 11:
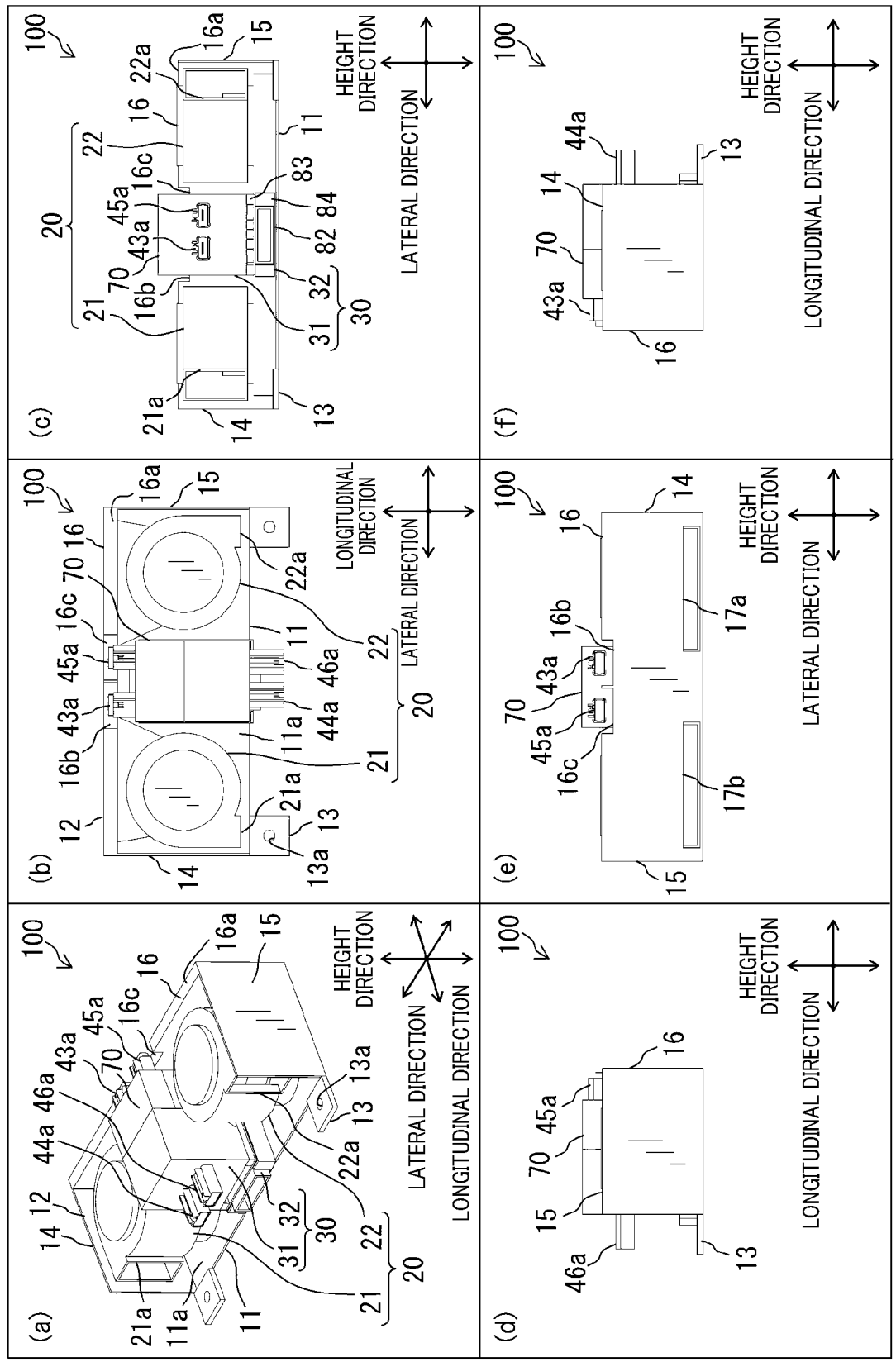
FIG. 11 is a diagram including various views of a control module of the battery pack.

As shown FIG. 11, in the present embodiment, the control module 100 includes a control module housing 10, fans 20 and a control unit 30.

Figure 2:
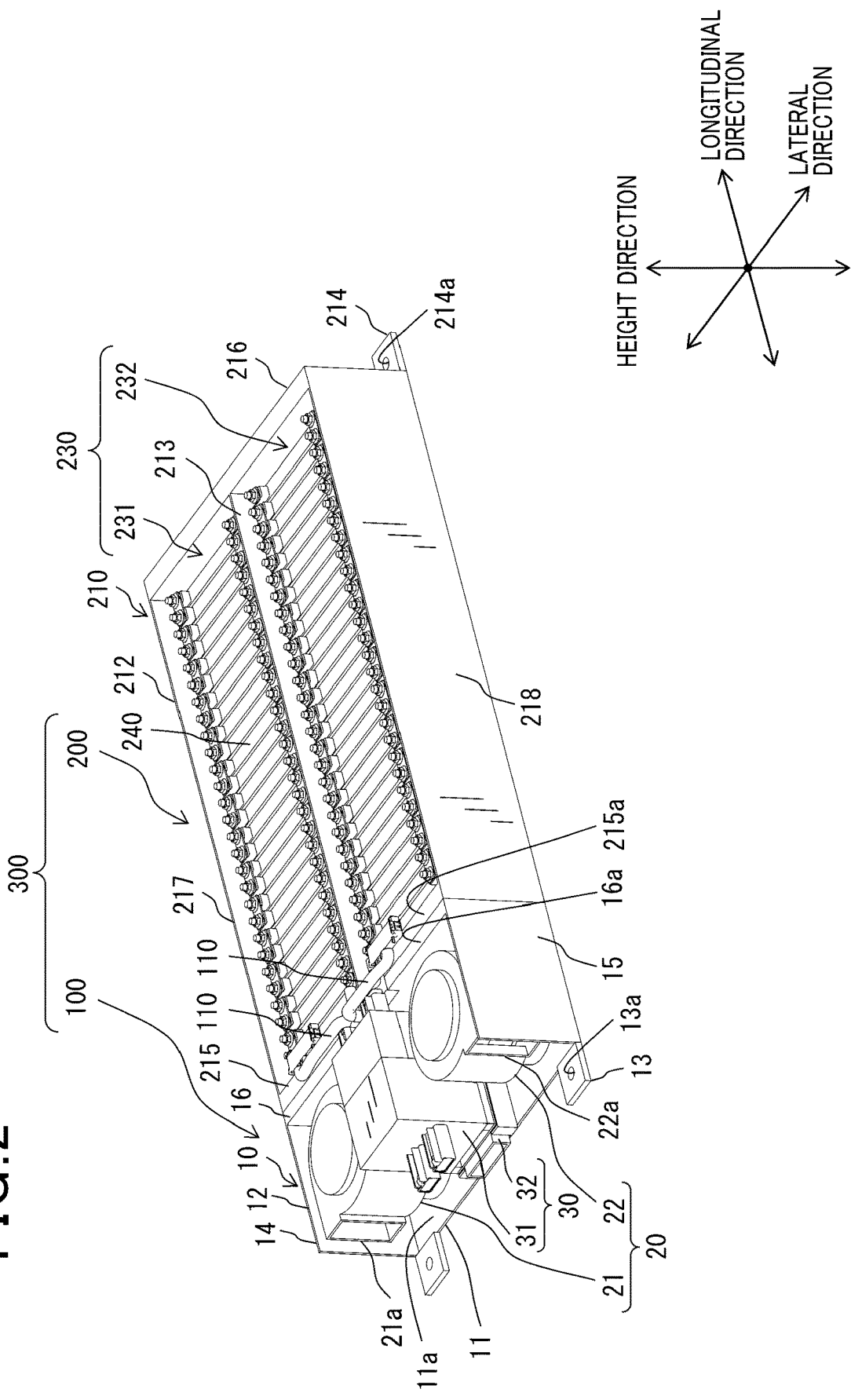
FIG. 2 is a perspective view of the battery pack.

The control module housing 10 is connected to the battery module housing 210 (see FIG. 2). In the control module housing 10, there are arranged the fans 20 and the control unit 30. The fans 20 cause air to flow through the first and second ventilation spaces of the battery module housing 210, thereby cooling the battery cells 240 accommodated in the first and second accommodation spaces of the battery module housing 210. The control unit 30 controls electrical connection between the battery module 200 and the electrical load 400. Moreover, the control unit 30 controls drive of the fans 20. In addition, the control unit 30 commands the monitoring unit 250 to perform the process of balancing the battery cells 240 of the battery module 200.

FIG. 11(a) is a perspective view of the control module 100. FIG. 11(b) is a top view of the control module 100. FIG. 11(c) is a front view of the control module 100. FIG. 11(d) is a right side view of the control module 100. FIG. 11(e) is a rear view of the control module 100. FIG. 11(f) is a left side view of the control module 100.

The control module 100 is assembled as follows.

First, the control module housing 10 as shown in FIG. 12(a) and the control module 30 as shown in FIG. 12(b) are prepared. Then, as shown in FIG. 12(c), the control unit 30 is mounted to the control module housing 10 so as to be located on a central part of a mounting wall 11 of the control module housing 10. Thereafter, the control module 30 is electrically connected to the battery module 200.

Next, the fans 20, more particularly a first fan 21 and a second fan 22 as shown in FIG. 12(d) are prepared. Then, as shown in FIG. 12(e), the first and second fans 21 and 22 are mounted to the control module housing 10 so that: the first fan 21 is interposed between a first side wall 14 of the control module housing 10 and the control unit 30 on the mounting wall 11; and the second fan 22 is interposed between a second side wall 15 of the control module housing 10 and the control unit 30 on the mounting wall 11. Thereafter, the first and second fans 21 and 22 are electrically connected to the control unit 30 via wires 23 (shown in FIG. 1).

As a result, the control module 100 as shown in FIG. 11 is obtained.

In addition, it is also possible to first mount the first and second fans 21 and 22 on the mounting wall 11 of the control module housing 10 and then mount the control unit 30 on the mounting wall 11 so as to be interposed between the first and second fans 21 and 22.

(Configuration of Control Module)

The control module housing 10 is formed, for example, of aluminum. More particularly, in the present embodiment, the control module housing 10 is formed by aluminum die casting.

As shown in FIGS. 6 and 7, the control module housing 10 has the mounting wall (or bottom wall) 11 and a circumferential wall 12.

The mounting wall 11 is in the shape of a rectangle that is longer in the lateral direction of the battery pack 300 than in the longitudinal direction on a horizontal plane defined by the longitudinal and lateral directions.

Moreover, as shown in FIGS. 2-9 and 11, in the mounting wall 11, there are formed ribs 13 for fixing the control module 100 to the body of the hybrid vehicle by bolts. More particularly, in the present embodiment, there are formed two ribs 13 respectively at two corners of the mounting wall 11 which are on the opposite side to the battery module 200 in the longitudinal direction of the battery pack 300. Accordingly, the two ribs 13 are aligned with each other in the lateral direction of the battery pack 300. In each of the ribs 13, there is formed a bolt hole 13a through which a bolt (not shown) is fastened to fix the control module 100 to the body of the hybrid vehicle. In addition, the control module housing 10 constitutes a mounting member of the control module 100.

The circumferential wall 12 includes the first side wall 14, the second side wall 15 and a connection wall 16 that connects the first and second side walls 14 and 15. Each of the first and second side walls 14 and 15 is in the shape of a rectangle that is longer in the longitudinal direction of the battery pack 300 than in the height direction on a longitudinal plane defined by the longitudinal and height directions. The first and second side walls 14 and 15 are spaced from and face each other in the lateral direction of the battery pack 300. On the other hand, the connection wall 16 is in the shape of a rectangle that is longer in the lateral direction of the battery pack 300 than in the height direction on a lateral plane defined by the lateral and height directions. Moreover, the connection wall 16 is located on the battery module 200 side on the mounting wall 11. The first side wall 14, the connection wall 16 and the second side wall 15 are arranged in this order in the circumferential direction of the control module housing 10 and connected with one another. In addition, each of the first side wall 14, the connection wall 16 and the second side wall 15 is connected with a peripheral portion of an upper surface (or inside surface) 11a of the mounting wall 11.

As shown in FIG. 7, the connection wall 16 is aligned with the left wall 215 of the battery module housing 210 in the longitudinal direction of the battery pack 300. The connection wall 16 and the left wall 215 are mechanically connected to each other with their respective outside surfaces abutting each other.

The connection wall 16 is shaped conforming to the shape of the left wall 215. As shown in FIG. 6, in the left wall 215, there are formed the first cut 215b, the second cut 215c, the first ventilation hole 219a and the second ventilation hole 219b. In contrast, as shown in FIG. 13, in the connection wall 16, there are formed a third cut 16b, a fourth cut 16c, a third ventilation hole 17a and a fourth ventilation hole 17b. In addition, the positions of the first to the fourth cuts in the height and lateral directions relative to the first to the fourth ventilation holes are not particularly limited provided that these cuts do not exert excessive influence on the cooling of the battery stacks 230.

Specifically, in a top surface 16a of the connection wall 16, there are formed both the third cut 16b and the fourth cut 16c. As shown in FIGS. 6 and 7, the third cut 16b is aligned with the first cut 215b in the longitudinal direction of the battery pack 300 while the fourth cut 16c is aligned with the second cut 215c in the longitudinal direction. Consequently, at least one of part of the positive busbar 41 and part of the positive input/output terminal 245 is received in the third cut 16b while at least one of part of the negative busbar 42 and part of the negative input/output terminal 246 is received in the fourth cut 16c.

In addition, in the present embodiment, there is formed a partition portion of the connection wall 16 between the third and fourth cuts 16b and 16c. Consequently, in the case where the third and fourth cuts 16b and 16c are not closed, air flowing out of the first accommodation space and air flowing out of the second accommodation space are prevented from being mixed together at the third and fourth cuts 16b and 16c.

It should be noted that the third and fourth cuts 16b and 16c may alternatively be formed continuously without a partition portion of the connection wall 16 formed therebetween.

In addition, in the third cut 16b, there may also be received part of one of the internal wires 110 in such as manner as to be in contact with a wall surface of the connection wall 16 which defines the third cut 16b. Similarly, in the fourth cut 16c, there may also be received part of the other internal wire 110 in such as manner as to be in contact with a wall surface of the connection wall 16 which defines the fourth cut 16c. Alternatively, in the connection wall 16, there may be formed dedicated through-holes or cuts through which the internal wires 110 extend. Consequently, it is possible to position the internal wires 110 with respect to the connection wall 16 and thereby suppress vibration of the internal wires 110. As a result, it is possible to ensure the reliability of electrical connection between the monitoring unit 250 of the battery module 200 and the battery ECU 32 of the control module 100.

In a lower part of the connection wall 16, there are formed a third ventilation hole 17a and a fourth ventilation hole 17b so as to adjoin the mounting wall 11 of the control module housing 10. The third ventilation hole 17a is aligned and communicates with the first ventilation hole 219a in the longitudinal direction of the battery pack 300. Thus, the third ventilation hole 17a communicates with the first ventilation space of the battery module housing 210 via the first ventilation hole 219a. Similarly, the fourth ventilation hole 17b is aligned and communicates with the second ventilation hole 219b in the longitudinal direction of the battery pack 300. Thus, the fourth ventilation hole 17b communicates with the second ventilation space of the battery module housing 210 via the second ventilation hole 219b. Here, the communication between the fourth ventilation hole 17b and the second ventilation space of the battery module housing 210 via the second ventilation hole 219b is illustrated in FIG. 9. In addition, the third and fourth ventilation holes 17a and 17b constitute control module-side ventilation holes of the battery pack 300.

As shown in FIG. 13, the third and fourth ventilation holes 17a and 17b are spaced from the third and fourth cuts 16b and 16c in the height direction. Moreover, part of the third cut 16b and part of the fourth cut 16c are formed above that part of the connection wall 16 which is interposed between the third and fourth ventilation holes 17a and 17b in the lateral direction. The control unit 30, which is enclosed with a dashed line in FIG. 13, is located between the third and fourth ventilation holes 17a and 17b in the lateral direction. Consequently, the control unit 30 is aligned in the longitudinal direction with each of the third and fourth cuts 16b and 16c that are provided for facilitating electrical connection between the control unit 30 and the battery module 200.

Figure 3:
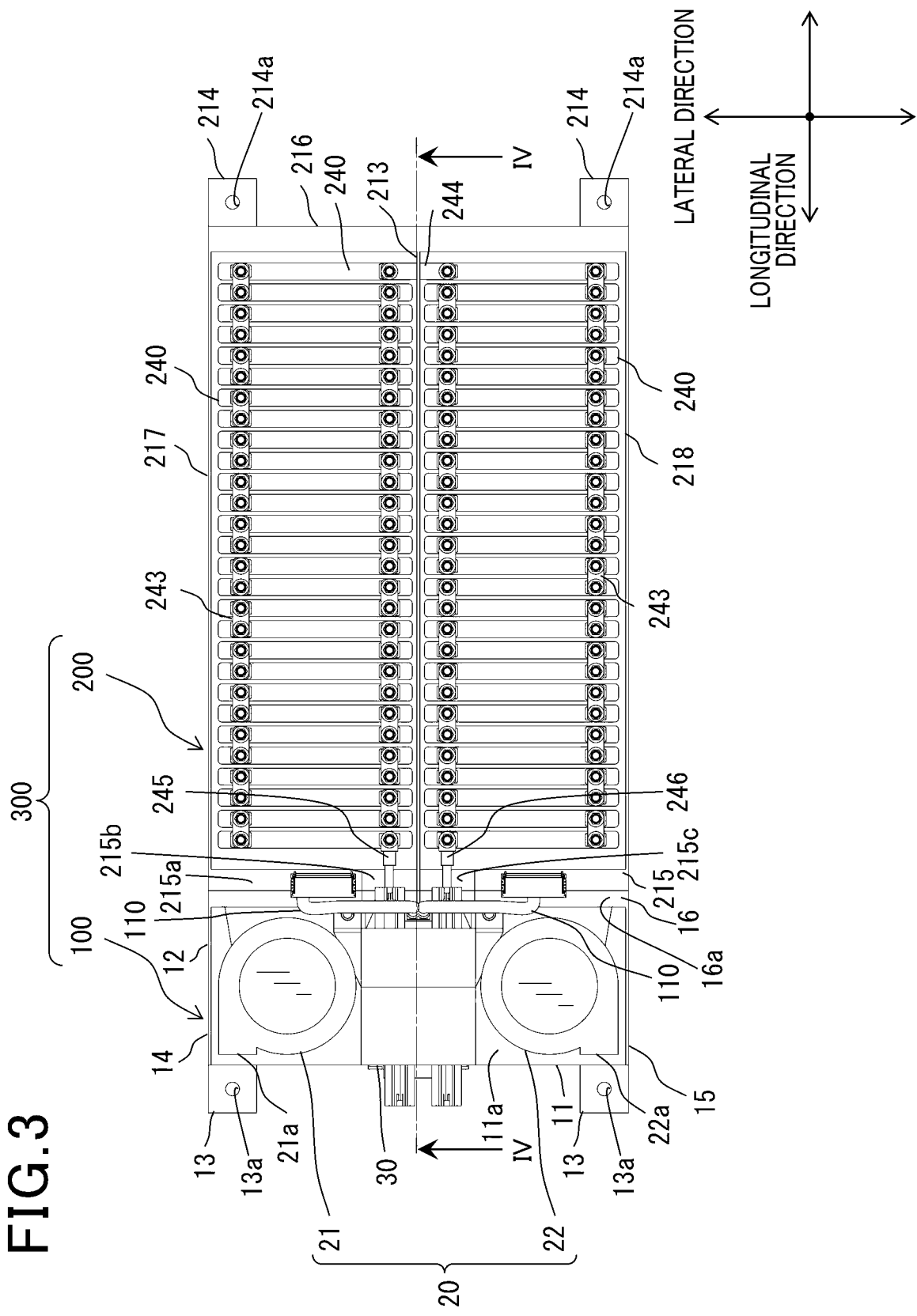
FIG. 3 is a top view of the battery pack.

The first and second fans 21 and 22 are provided for respectively cooling the first and second battery stacks 231 and 232 of the battery module 200. As shown in FIG. 11, both the first and second fans 21 and 22 are mounted on the mounting wall 11 of the control module housing 10. Moreover, as shown in FIGS. 2 and 3, the first and second fans 21 and 22 are aligned respectively with the first and second battery stacks 231 and 232 in the longitudinal direction of the battery pack 300.

The first and second fans 21 and 22 are spaced from and aligned with each other in the lateral direction of the battery pack 300. The first fan 21 is located on the first side wall 14 side whereas the second fan 22 is located on the second side wall 15 side in the lateral direction. The control unit 30 is interposed between the first and second fans 21 and 22 in the lateral direction.

Though not shown in the figures, each of the first and second fans 21 and 22 has an inlet via which air is sucked into the fan. The first and second fans 21 and 22 are mounted to the control module housing 10 so that the inlets of the first and second fans 21 and 22 are fluidically connected respectively to the third and fourth ventilation holes 17a and 17b formed in the connection wall 16 of the control module housing 10.

As shown in FIG. 11, the first fan 21 has a first outlet 21a via which air is discharged out of the first fan 21. The first outlet 21a opens toward the opposite side to the connection wall 16 in the longitudinal direction. Moreover, the first outlet 21a is located further than the inlet of the first fan 21 from the mounting wall 11 of the control module housing 10 in the height direction.

Similarly, the second fan 22 has a second outlet 22a via which air is discharged out of the second fan 22. The second outlet 22a opens toward the opposite side to the connection wall 16 in the longitudinal direction. Moreover, the second outlet 22a is located further than the inlet of the second fan 22 from the mounting wall 11 of the control module housing 10 in the height direction.

In operation, when the first fan 21 rotates to start sucking air thereinto, air is caused to flow in the first ventilation space in the longitudinal direction from the right wall 216 to the left wall 215. At the same time, air is also caused to flow in the height direction through the air gaps between the battery cells 240 of the first battery stack 231 to the first ventilation space. Then, the air, which has flowed to the left wall 215, is sucked into the first fan 21 via the first ventilation hole 219a, the third ventilation hole 17a and the inlet of the first fan 21. Thereafter, the sucked air is discharged out of the first fan 21 via the first outlet 21a toward the opposite side to the battery module 200 in the longitudinal direction. Consequently, the battery cells 240 of the first battery stack 231 are cooled by the air flowing through the air gaps therebetween.

Similarly, when the second fan 22 rotates to start sucking air thereinto, air is caused to flow in the second ventilation space in the longitudinal direction from the right wall 216 to the left wall 215. At the same time, air is also caused to flow in the height direction through the air gaps between the battery cells 240 of the second battery stack 232 to the second ventilation space. Then, the air, which has flowed to the left wall 215, is sucked into the second fan 22 via the second ventilation hole 219b, the fourth ventilation hole 17b and the inlet of the second fan 22. Thereafter, the sucked air is discharged out of the second fan 22 via the second outlet 22a toward the opposite side to the battery module 200 in the longitudinal direction. Consequently, the battery cells 240 of the second battery stack 232 are cooled by the air flowing through the air gaps therebetween.

As shown in FIG. 11, the first outlet 21a and the second outlet 22a are aligned with each other in the lateral direction. The first outlet 21a is located on the first side wall 14 side while the second outlet 22a is located on the second side wall 15 side in the lateral direction. The first outlet 21a is aligned with one of the ribs 13 in the longitudinal direction while the second outlet 22a is aligned with the other rib 13 in the longitudinal direction. In this manner, the first outlet 21a and the second outlet 22a are spaced from the control unit 30 in the lateral direction as far as possible. Consequently, it is possible to suppress the temperature of the control unit 30 from being increased by air discharged out from the first and second outlets 21a and 22a.

Moreover, as shown in FIG. 11, both the first and second outlets 21a and 22a are aligned with an element unit 31 (to be described later) of the control unit 30 in the lateral direction. Both the first and second outlets 21a and 22a are spaced from the battery ECU 32 (to be described later) of the control unit 30 in the height direction. The battery ECU 32 is aligned in the lateral direction with those parts of the first and second fans 21 and 22 which respectively include the inlets of the first and second fans 21 and 22. Consequently, it is possible to suppress interference of the battery ECU 32 with air discharged out from the first and second outlets 21a and 22a.

(Overview of Control Unit)

Figure 12:
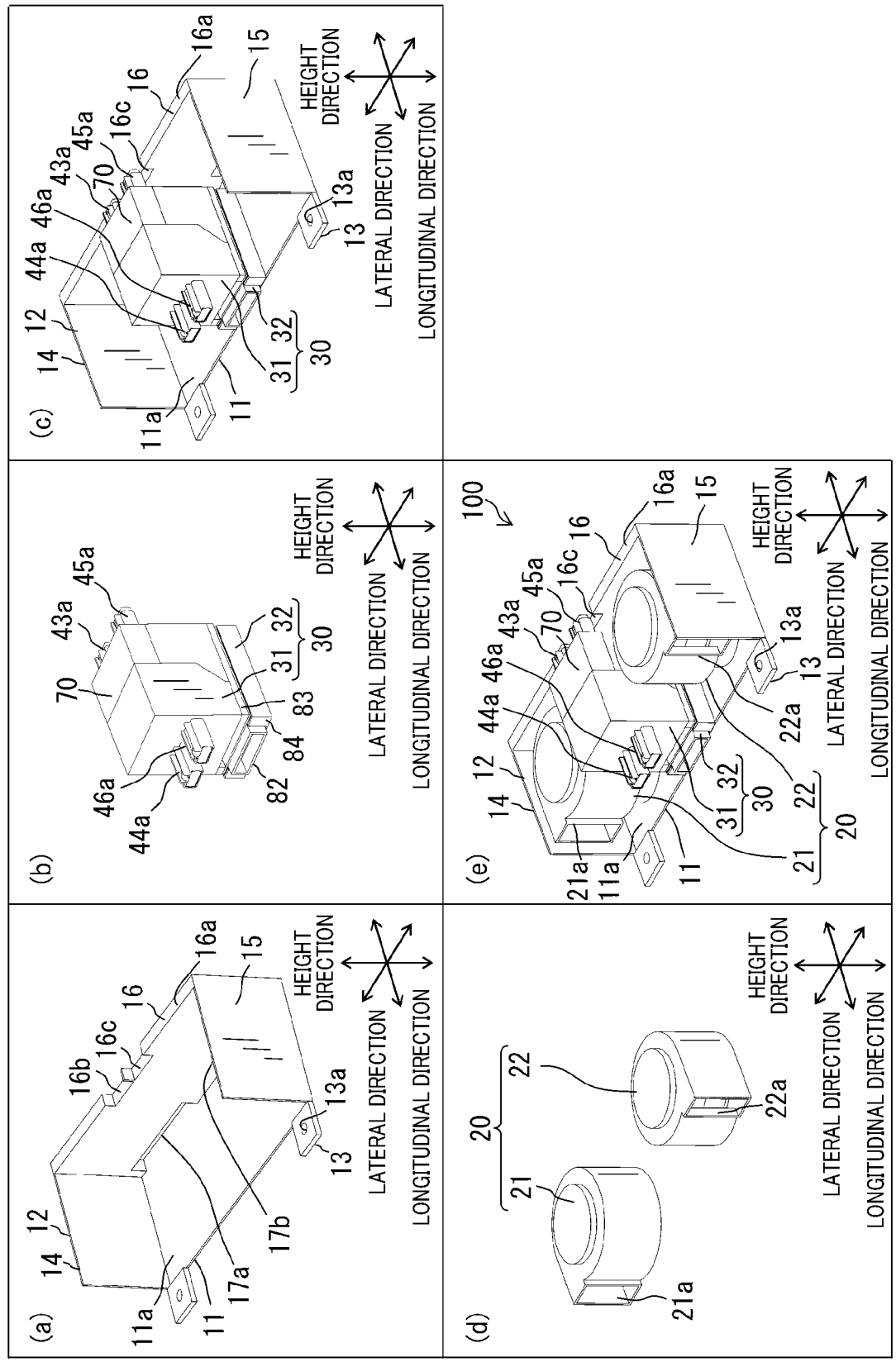
FIG. 12 is a diagram including various views of components of the control module.

As shown in FIGS. 11 and 12, the control unit 30 includes the element unit 31 and the battery ECU 32 both of which are mentioned previously.

Figure 14:
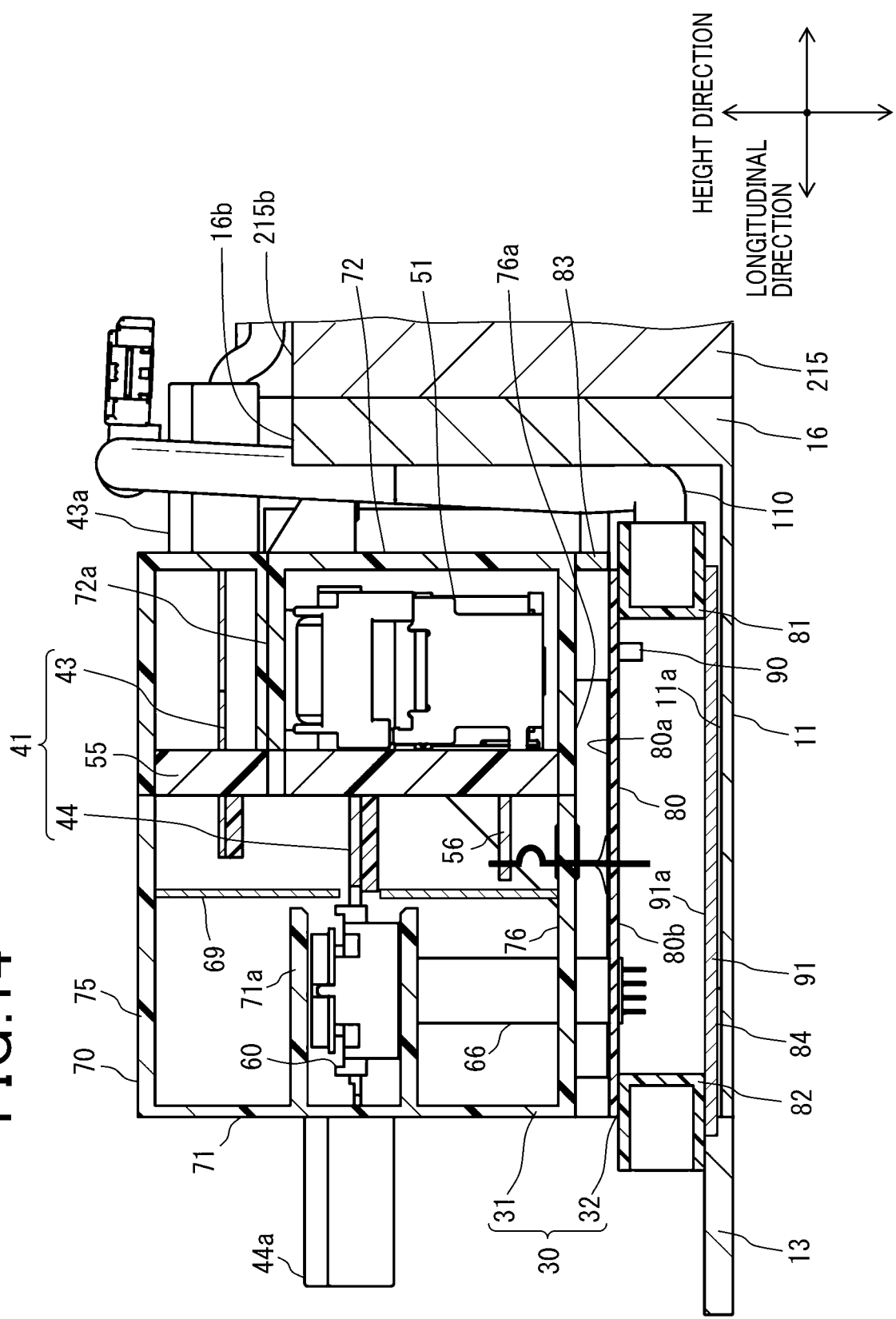
FIG. 14 is an enlarged cross-sectional view of a region A enclosed with a dashed line in FIG. 4.

As shown in FIG. 14, the element unit 31 includes the aforementioned busbars 40, the aforementioned system main relay 50, a current sensor 60, a magnetic shielding member 69 and a case 70. The battery ECU 32 includes a control substrate 80, the aforementioned internal connector 81, an external connector 82, a spacer 83 and a control cover 84. In addition, the battery ECU 32 functions as a controller to control the system main relay 50.

In the case 70, there are received part of each of the busbars 40, the system main relay 50, the current sensor 60 and the magnetic shielding member 69. Moreover, to the case 70, there are assembled the control substrate 80, the internal connector 81 and the external connector 82 via the spacer 83. In addition, the control cover 84 is also assembled to the case 70.

(Configuration of Element Unit)

Figure 15:
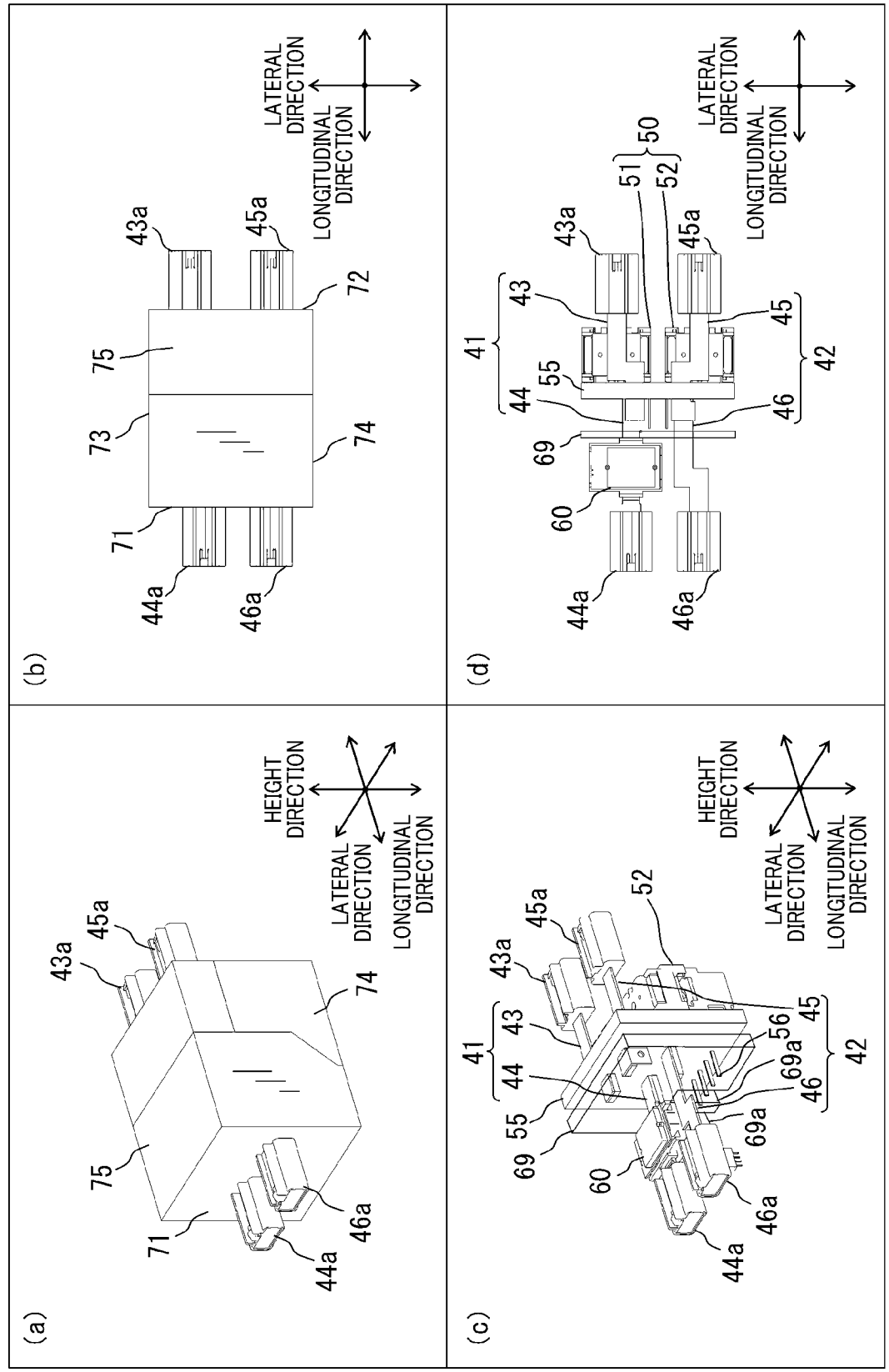
FIG. 15 is a diagram including various views of an element unit of the control module.
Figure 16:
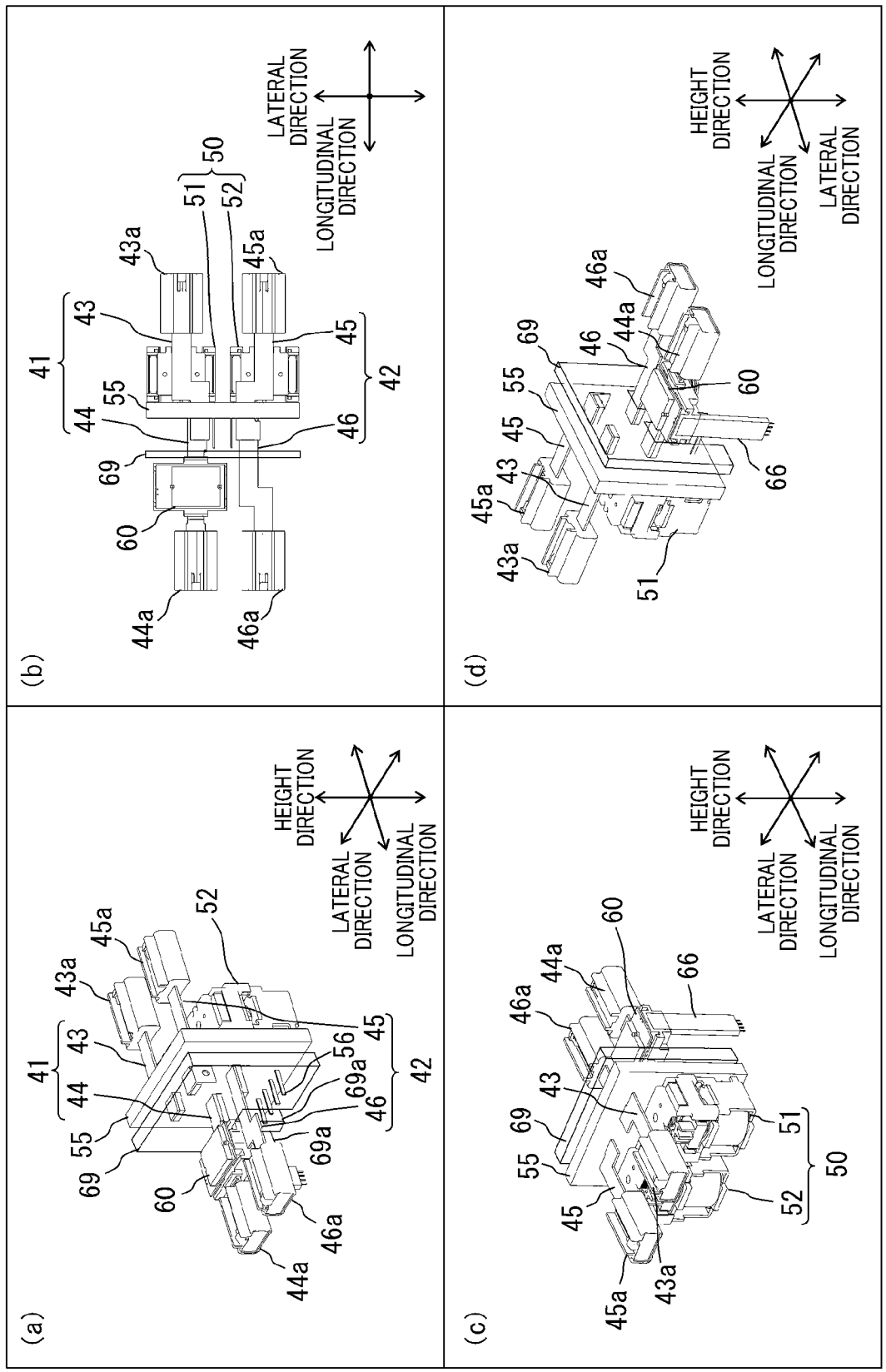
FIG. 16 is another diagram including various views of the element unit.

As shown in FIGS. 15 and 16, the busbars 40 include the aforementioned positive busbar 41 and the aforementioned negative busbar 42.

The positive busbar 41 is comprised of an internal positive busbar 43 and an external positive busbar 44 which are formed separately from each other. The internal positive busbar 43 is connected to the positive input/output terminal 245 of the battery module 200. The external positive busbar 44 is connected to the electrical load 400.

The negative busbar 42 is comprised of an internal negative busbar 45 and an external negative busbar 46. The internal negative busbar 45 is connected to the negative input/output terminal 246 of the battery module 200. The external negative busbar 46 is connected to the electrical load 400.

In addition, it should be noted that: FIG. 15(*c*) is identical to FIG. 16(*a*); and FIG. 15(*d*) is identical to FIG. 16(*b*). Here, FIG. 15 includes FIG. 15(*c*) and FIG. 15(*d*) for illustrating the external and internal structures of the element unit 31 in contrast to each other, while FIG. 16 includes FIG. 16(*a*) and FIG. 16(*b*) for thoroughly illustrating the internal structure of the element unit 31.

As shown in FIG. 16, both the internal positive busbar 43 and the internal negative busbar 45 extend in the longitudinal direction of the battery pack 300. The internal positive busbar 43 and the internal negative busbar 45 are aligned with each other in the lateral direction of the battery pack 300. Moreover, the internal positive busbar 43 and the internal negative busbar 45 are located further than the external positive busbar 44 and the external negative busbar 46 from the mounting wall 11 of the control module housing 10 in the height direction. In other words, the internal positive busbar 43 and the internal negative busbar 45 are located closer than the external positive busbar 44 and the external negative busbar 46 to the upper end faces 240*a* of the battery cells 240 in the height direction.

A battery module-side end portion of the internal positive busbar 43 is received in the third cut 16*b* formed in the connection wall 16 of the control module housing 10. The battery module-side end portion of the internal positive busbar 43 is connected to the positive input/output terminal 245 of the battery module 200. On the other hand, a battery module-side end portion of the internal negative busbar 45 is received in the fourth cut 16*c* formed in the connection wall 16 of the control module housing 10. The battery module-side end portion of the internal negative busbar 45 is connected to the negative input/output terminal 246 of the battery module 200.

Moreover, on the battery module-side end portion of the internal positive busbar 43, there is provided an internal positive connector (or housing) 43*a* for connecting the battery module-side end portion to the positive input/output terminal 245. Similarly, on the battery module-side end portion of the internal negative busbar 45, there is provided an internal negative (or housing) connector 45*a* for connecting the battery module-side end portion to the negative input/output terminal 246.

Each of the internal positive connector 43*a* and the internal negative connector 45*a* is in the shape of a tube with an opening on the battery module 200 side and a bottom on the opposite side to the battery module 200 in the longitudinal direction. Moreover, in the bottom, there is formed a hole.

The battery module-side end portion of the internal positive busbar 43 is inserted into the hole formed in the bottom of the internal positive connector 43*a*, thereby being surrounded by the internal positive connector 43*a*. Moreover, the positive input/output terminal 245 is inserted in the hollow space of the internal positive connector 43*a* and electrically connected to the battery module-side end portion of the internal positive busbar 43 in the hollow space.

Similarly, the battery module-side end portion of the internal negative busbar 45 is inserted into the hole formed in the bottom of the internal negative connector 45*a*, thereby being surrounded by the internal negative connector 45*a*. Moreover, the negative input/output terminal 246 is inserted in the hollow space of the internal negative connector 45*a* and electrically connected to the battery module-side end portion of the internal negative busbar 45 in the hollow space.

As shown in FIG. 16, both the external positive busbar 44 and the external negative busbar 46 extend in the longitudinal direction of the battery pack 300. The external positive busbar 44 and the external negative busbar 46 are aligned with each other in the lateral direction of the battery pack 300. Moreover, the external positive busbar 44 and the external negative busbar 46 are located closer than the internal positive busbar 43 and the internal negative busbar 45 to the mounting wall 11 of the control module housing 10 in the height direction. In other words, the external positive busbar 44 and the external negative busbar 46 are located closer than the internal positive busbar 43 and the internal negative busbar 45 to the lower end faces 240*b* of the battery cells 240 in the height direction.

A battery module-side end portion of the external positive busbar 44 is spaced from an anti-battery module-side end portion of the internal positive busbar 43 in the height direction. The electrical connection between the battery module-side end portion of the external positive busbar 44 and the anti-battery module-side end portion of the internal positive busbar 43 is controlled by the system main relay 50. An anti-battery module-side end portion of the external positive busbar 44 is electrically connected to the electrical load 400.

Similarly, a battery module-side end portion of the external negative busbar 46 is spaced from an anti-battery module-side end portion of the internal negative busbar 45 in the height direction. The electrical connection between the battery module-side end portion of the external negative busbar 46 and the anti-battery module-side end portion of the internal negative busbar 45 is controlled by the system main relay 50. An anti-battery module-side end portion of the external negative busbar 46 is electrically connected to the electrical load 400.

On the anti-battery module-side end portion of the external positive busbar 44, there is provided an external positive connector (or housing) 44*a* for connecting the anti-battery module-side end portion to a first wire harness 85*a* (shown in FIG. 1). Similarly, on the anti-battery module-side end portion of the external negative busbar 46, there is provided an external negative connector (or housing) 46*a* for connecting the anti-battery module-side end portion to another first wire harness 85*a*.

Each of the external positive connector 44*a* and the external negative connector 46*a* is in the shape of a tube with a bottom on the battery module 200 side and an opening on the opposite side to the battery module 200 in the longitudinal direction. Moreover, in the bottom, there is formed a hole.

The anti-battery module-side end portion of the external positive busbar 44 is inserted into the hole formed in the bottom of the external positive connector 44*a*, thereby being surrounded by the external positive connector 44*a*. Moreover, the first wire harness 85*a* is inserted in the hollow space of the external positive connector 44*a* and electrically connected to the anti-battery module-side end portion of the external positive busbar 44 in the hollow space. Consequently, the external positive busbar 44 is electrically connected to the electrical load 400 via the first wire harness 85*a*.

Similarly, the anti-battery module-side end portion of the external negative busbar 46 is inserted into the hole formed in the bottom of the external negative connector 46*a*, thereby being surrounded by the external negative connector 46*a*.

Moreover, the other first wire harness 85*a* is inserted in the hollow space of the external negative connector 46*a* and electrically connected to the anti-battery module-side end portion of the external negative busbar 46 in the hollow space. Consequently, the external negative busbar 46 is electrically connected to the electrical load 400 via the other first wire harness 85*a*.

The system main relay 50 includes a first switch 51 and a second switch 52.

The first switch 51 creates, upon being energized, a magnetic field, thereby controlling the electrical connection of the positive busbar 41. When not energized, the first switch 51 is in an open state where it breaks the electrical connection of the positive busbar 41. Specifically, in the open state, the first switch 51 keeps the internal positive busbar 43 and the external positive busbar 44 in a disconnected state; that is, it keeps the internal positive busbar 43 and the electrical load 400 in a disconnected state. In contrast, when energized, the first switch 51 is in a closed state where it makes the electrical connection of the positive busbar 41. Specifically, in the closed state, the first switch 51 keeps the internal positive busbar 43 and the external positive busbar 44 in a connected state; that is, it keeps the internal positive busbar 43 and the electrical load 400 in a connected state.

Similarly, the second switch 52 creates, upon being energized, a magnetic field, thereby controlling the electrical connection of the negative busbar 42. When not energized, the second switch 52 is in an open state where it breaks the electrical connection of the negative busbar 42. Specifically, in the open state, the second switch 52 keeps the internal negative busbar 45 and the external negative busbar 46 in a disconnected state; that is, it keeps the internal negative busbar 45 and the electrical load 400 in a disconnected state. In contrast, when energized, the second switch 52 is in a closed state where it makes the electrical connection of the negative busbar 42. Specifically, in the closed state, the second switch 52 keeps the internal negative busbar 45 and the external negative busbar 46 in a connected state; that is, it keeps the internal negative busbar 45 and the electrical load 400 in a connected state.

In the present embodiment, the first and second switches 51 and 52 have the same configuration. Therefore, hereinafter, for the sake of avoiding redundancy, only the first switch 51 will be described in detail with reference to FIG. 17, omitting detailed description of the second switch 52.

Figure 17:
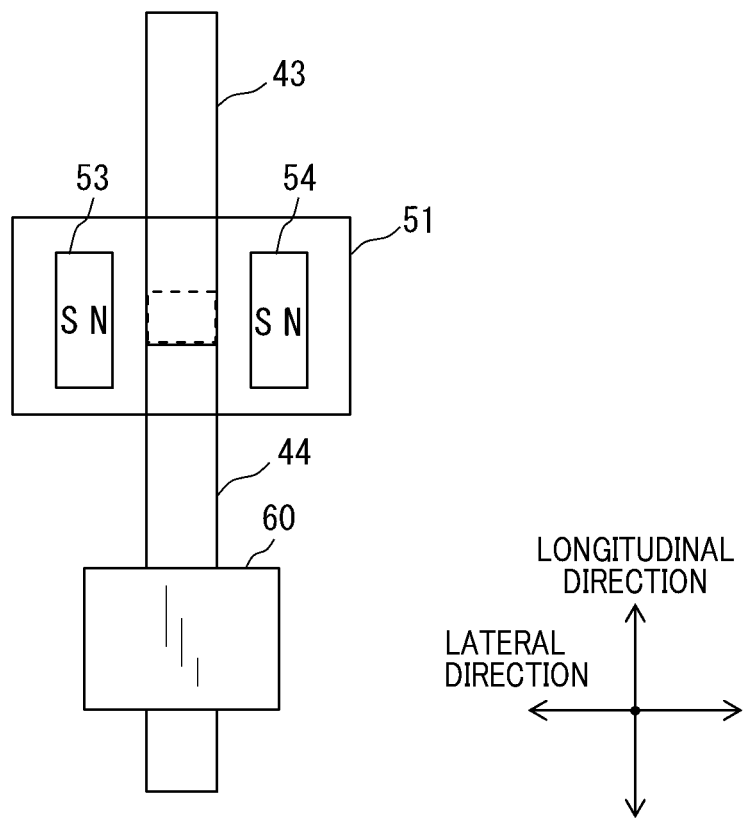
FIG. 17 is a schematic view illustrating the configuration of a first switch of the element unit.

As shown in FIG. 17, the first switch 51 includes a first permanent magnet 53 and a second permanent magnet 54. Moreover, the first switch 51 shares a holding member 55 shown in FIGS. 15 and 16 with the second switch 52. Furthermore, though not shown in the figures, the first switch 51 also includes a moving body, a connection electrode, a spring, an electromagnetic section and an accommodation case. In the accommodation case, there are accommodated the first permanent magnet 53, the second permanent magnet 54, the moving body, the connection electrode, the spring and the electromagnetic section.

The connection electrode is provided in the moving body. The connection electrode is located in the height direction between the anti-battery module-side end portion of the internal positive busbar 43 and the battery module-side end portion of the external positive busbar 44. With movement of the moving body, the connection electrode moves in the height direction, changing the separation distances in the height direction between the connection electrode and the internal positive busbar 43 and between the connection electrode and the external positive busbar 44. Upon contact between the connection electrode and the internal positive busbar 43 and contact between the connection electrode and the external positive busbar 44, the internal positive busbar 43 and the external positive busbar 44 are electrically connected to each other.

Similarly, in the second switch 52, the connection electrode is located in the height direction between the anti-battery module-side end portion of the internal negative busbar 45 and the battery module-side end portion of the external negative busbar 46. Upon contact between the connection electrode and the internal negative busbar 45 and contact between the connection electrode and the external negative busbar 46, the internal negative busbar 45 and the external negative busbar 46 are electrically connected to each other.

In the first switch 51, the spring applies an urging force to the moving body in a direction causing the connection electrode provided in the moving body to move away from the internal positive busbar 43 and the external positive busbar 44 in the height direction.

The electromagnetic section includes a solenoid coil, a yoke and a movable core. The solenoid coil and an end portion of the moving body are surrounded by the yoke. The movable core is mounted to the moving body.

The solenoid coil is electrically connected to the battery ECU 32 via a switch connection terminal 56. The switch connection terminal 56 is joined to the battery ECU 32 by soldering. Upon being supplied with electric current from the battery ECU 32, the solenoid coil creates a magnetic field, thereby forming a magnetic circuit that passes through the yoke and the movable core. Consequently, a magnetic force is generated in the movable core; the magnetic force causes the moving body to move against the urging force of the spring. As a result, the connection electrode provided in the moving body is brought into contact with both the internal positive busbar 43 and the external positive busbar 44, thereby being electrically connected to both the busbars 43 and 44. That is, the internal positive busbar 43 and the external positive busbar 44 are electrically connected to each other via the connection electrode.

Similarly, in the second switch 52, the internal negative busbar 45 and the external negative busbar 46 are electrically connected to each other via the connection electrode in the same manner as described above with respect to the first switch 51.

In addition, the first switch 51 may alternatively be configured so that the connection electrode provided in the moving body is always connected with the external positive busbar 44. In this case, with movement of the moving body, the separation distance between the connection electrode and the internal positive busbar 43 is changed. Moreover, the internal positive busbar 43 and the external positive busbar 44 are electrically connected to each other upon contact between the connection electrode and the internal positive busbar 43. More specifically, the spring applies an urging force to the moving body in a direction causing the connection electrode provided in the moving body to move away from the internal positive busbar 43. With electric current flowing to the solenoid coil, a magnetic force is generated in the movable core; the magnetic force causes the moving body to move against the urging force of the spring. As a result, the connection electrode provided in the moving body is brought into contact with the internal positive busbar 43, thereby being electrically connected to the internal positive busbar 43. That is, the internal positive busbar 43 and the external positive busbar 44 are electrically connected to each other via the connection electrode. Similarly, in the second switch 52, the internal negative busbar 45 and the external negative busbar 46 are electrically connected to each other upon contact between the connection electrode and the internal negative busbar 45.

As shown in FIG. 17, in the first switch 51, each of the first permanent magnet 53 and the second permanent magnet 54 is magnetized in the lateral direction of the battery pack 300. That is, each of the first and second permanent magnets 53 and 54 has its N pole and S pole arranged opposite to each other in the lateral direction. Moreover, the separation distances of the first and second permanent magnets 53 and 54 from the mounting wall 11 of the control module housing 10 in the height direction are equal to each other. That is, the separation distances of the first and second permanent magnets 53 and 54 from the control substrate 80 in the height direction are equal to each other.

The first and second permanent magnets 53 and 54 are aligned with each other in the lateral direction of the battery pack 300. Moreover, the N pole of the first permanent magnet 53 and the S pole of the second permanent magnet 54 face each other in the lateral direction. Consequently, a magnetic field is created which is mainly along a horizontal plane (i.e., a plane defined by the longitudinal and lateral directions of the battery pack 300) at the same height as the first and second permanent magnets 53 and 54.

Moreover, between the N pole of the first permanent magnet 53 and the S pole of the second permanent magnet 54, there are located the connection electrode, the anti-battery module-side end portion of the internal positive busbar 43 and the battery module-side end portion of the external positive busbar 44. In addition, in FIG. 17, the overlap of the anti-battery module-side end portion of the internal positive busbar 43 and the battery module-side end portion of the external positive busbar 44 in the height direction is illustrated with a closed dashed line. Similarly, in the second switch 52, between the N pole of the first permanent magnet 53 and the S pole of the second permanent magnet 54, there are located the connection electrode, the anti-battery module-side end portion of the internal negative busbar 45 and the battery module-side end portion of the external negative busbar 46.

When the connection electrode is in contact with each of the internal positive busbar 43 and the external positive busbar 44, electric current flows through the internal positive busbar 43, the connection electrode and the external positive busbar 44. Further, when the connection electrode moves in the height direction and thus is out of contact with each of the internal positive busbar 43 and the external positive busbar 44, discharge currents flow between the connection electrode and the internal positive busbar 43 and between the connection electrode and the external positive busbar 44.

The magnitude of the discharge current flowing between the connection electrode and the internal positive busbar 43 depends on the separation distance between the connection electrode and the internal positive busbar 43. Specifically, when the separation distance between the connection electrode and the internal positive busbar 43 is long, the discharge current flowing therebetween is low. In contrast, when the separation distance between the connection electrode and the internal positive busbar 43 is short, the discharge current flowing therebetween is high and thus the duration of electromagnetic noise caused by the discharge current is long.

Similarly, the magnitude of the discharge current flowing between the connection electrode and the external positive busbar 44 depends on the separation distance between the connection electrode and the external positive busbar 44. Specifically, when the separation distance between the connection electrode and the external positive busbar 44 is long, the discharge current flowing therebetween is low. In contrast, when the separation distance between the connection electrode and the external positive busbar 44 is short, the discharge current flowing therebetween is high and thus the duration of electromagnetic noise caused by the discharge current is long.

As described above, between the N pole of the first permanent magnet 53 and the S pole of the second permanent magnet 54, there are located the connection electrode, the anti-battery module-side end portion of the internal positive busbar 43 and the battery module-side end portion of the external positive busbar 44. Therefore, the magnetic field along the horizontal plane passes through the connection electrode, the internal positive busbar 43 and the external positive busbar 44. The magnetic field created by the first and second permanent magnets 53 and 54 is stronger than the magnetic field created by the solenoid coil. Hence, when discharge currents flow between the connection electrode and the internal positive busbar 43 and between the connection electrode and the external positive busbar 44 upon movement of the connection electrode in the height direction, the discharge currents are bent (changed in the flow course) by the magnetic field of the first and second permanent magnets 53 and 54 in a direction along the horizontal plane. Consequently, the flow path of the discharge current between the connection electrode and the internal positive busbar 43 becomes longer than the separation distance between the connection electrode and the internal positive busbar 43 in the height direction; the flow path of the discharge current between the connection electrode and the external positive busbar 44 becomes longer than the separation distance between the connection electrode and the external positive busbar 44 in the height direction. As a result, the resistances along the flow paths are increased, reducing the discharge currents and thereby suppressing the generation of electromagnetic noise due to the discharge currents.

As described above, the first switch 51 shares the holding member 55 with the second switch 52. The holding member 55 positions the busbars 40 relative to the system main relay 50. The holding member 55 is formed of a resin material into the shape of a rectangle that extends on a lateral plane defined by the lateral and height directions of the battery pack 300. The holding member 55 is located in the longitudinal direction between the current sensor 60 and the moving body, the connection electrode, the spring, the electromagnetic section and the first and second permanent magnets 53 and 54. The holding member 55 divides the interior space of the case 70 of the element unit 31 into first and second parts. In the first part, there is received the current sensor 60. In the second part, there are receive the moving body, the connection electrode, the spring, the electromagnetic section and the first and second permanent magnets 53 and 54 of each of the first and second switches 51 and 52. The holding member 55 is fixed to the case 70 by, for example, screws.

In the holding member 55, there are formed holes corresponding to the busbars 40 and holes corresponding to the solenoid coils of the first and second switches 51 and 52. These holes are formed in the longitudinal direction of the battery pack 300.

Specifically, in the holding member 55, there are formed: internal busbar insertion holes into which the anti-battery module-side end portions of the internal positive busbar 43 and the internal negative busbar 45 are respectively press-fitted; and external busbar insertion holes into which the battery module-side end portions of the external positive busbar 44 and the external negative busbar 46 are respectively press-fitted. Consequently, the internal positive busbar 43, the internal negative busbar 45, the external positive busbar 44 and the external negative busbar 46 are positioned relative to each other. In addition, the internal busbar insertion holes are located further than the external busbar insertion holes from the mounting wall 11 of the control module housing 10 in the height direction.

Moreover, in the holding member 55, there are also formed: a first insertion hole into which is press-fitted the switch connection terminal 56 connected to the solenoid coil of the first switch 51; and a second insertion hole into which is press-fitted the switch connection terminal 56 connected to the solenoid coil of the second switch 52. Consequently, the first and second switches 51 and 52 are positioned relative to the busbars 40.

In addition, the busbars 40 and the switch connection terminals 56 may be insert-molded to the holding member 55 instead of being press-fitted into the respective holes formed in the holding member 55 as described above.

Figure 18:
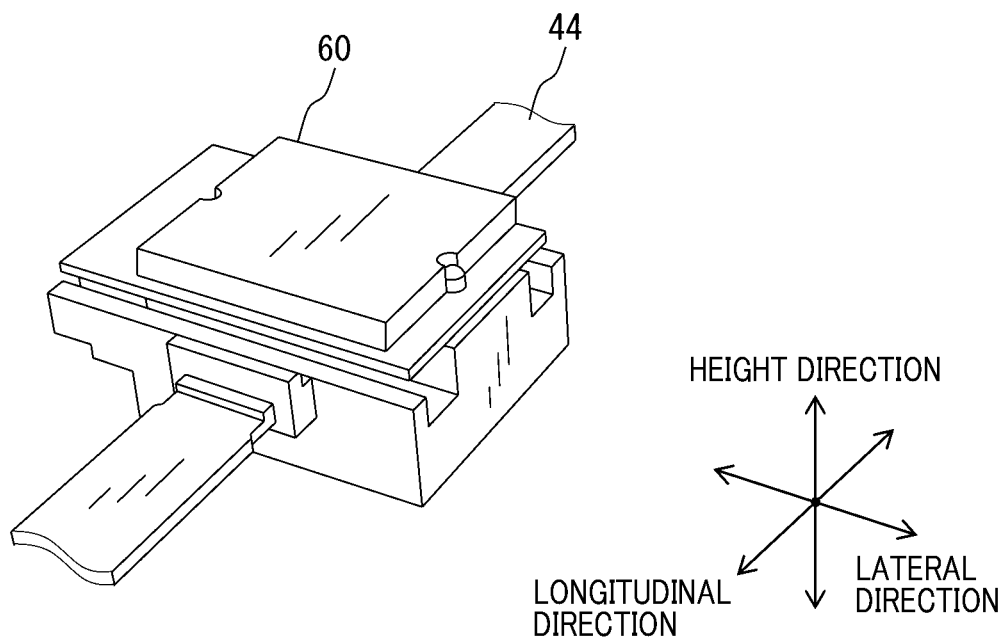
FIG. 18 is a perspective view of a current sensor of the element unit mounted to an external positive busbar.

The current sensor 60 is provided to detect electric current flowing through the busbars 40. More particularly, in the present embodiment, as shown in FIG. 18, the current sensor 60 is mounted on the external positive busbar 44 to detect the electric current flowing through the external positive busbar 44. The separation distance of the current sensor 60 from the mounting wall 11 of the control module housing 10 in the height direction is substantially equal to the separation distances of the first and second permanent magnets 53 and 54 of the first and second switches 51 and 52 from the mounting wall 11 in the height direction. That is, the separation distance of the current sensor 60 from the control substrate 80 in the height direction is substantially equal to the separation distances of the first and second permanent magnets 53 and 54 from the control substrate 80 in the height direction. Therefore, at least part of the current sensor 60 is aligned with at least part of each of the first and second permanent magnets 53 and 54 in the longitudinal direction on a horizontal plane defined by the longitudinal and lateral directions. In other words, at least part of the current sensor 60 faces at least part of each of the first and second permanent magnets 53 and 54 on the horizontal plane.

Figure 19:
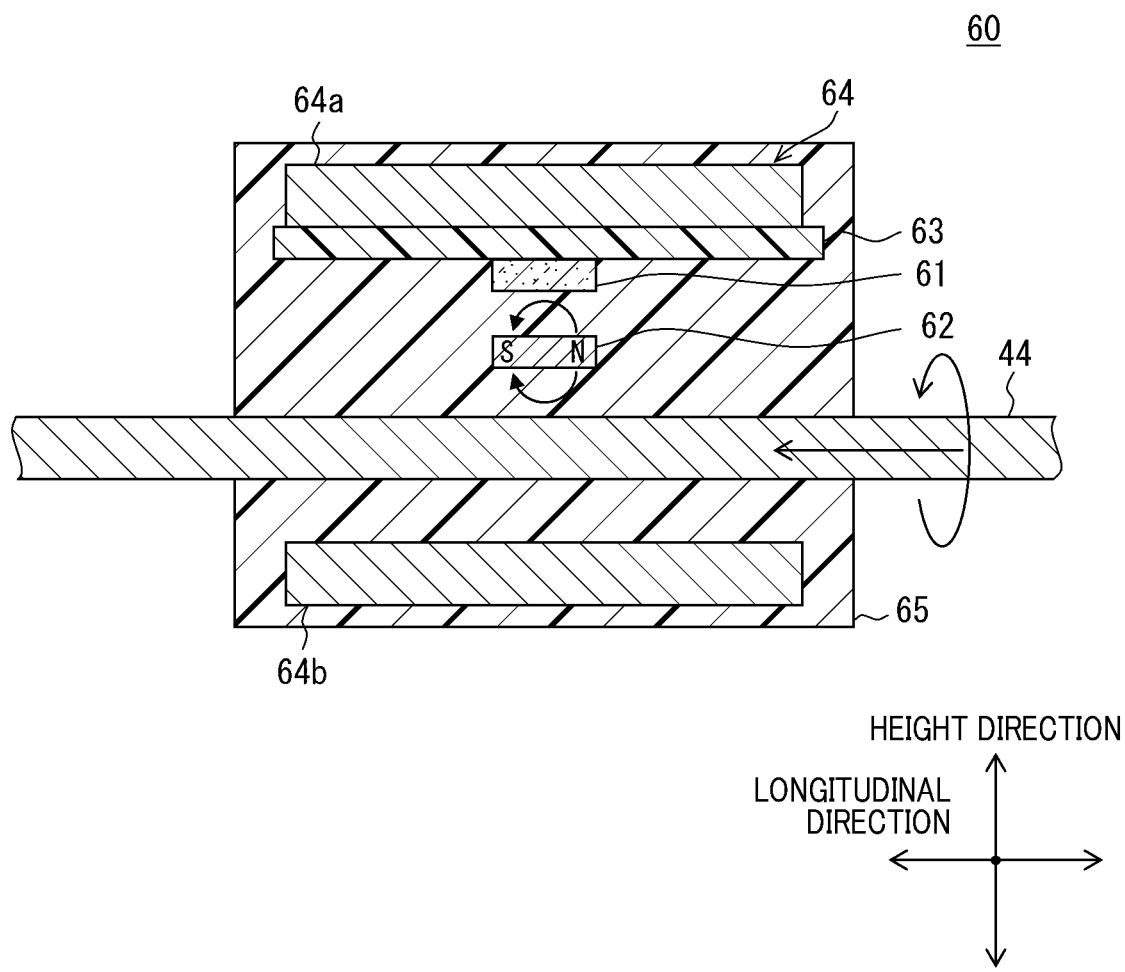
FIG. 19 is a schematic cross-sectional view of the current sensor.

As shown in FIG. 19, the current sensor 60 includes a magneto-electric transducer 61, a bias magnet 62, a wiring board 63, magnetic field suppressors 64 and a fixing member 65. The magneto-electric transducer 61 is mounted on the wiring board 63. The magnetic field suppressors 64 include a first magnetic field suppressor 64a and a second magnetic field suppressor 64b. The first and second magnetic field suppressors 64a and 64b are spaced from and aligned with each other in the height direction.

The external positive busbar 44 extends between the first and second magnetic field suppressors 64a and 64b. Moreover, between the first and second magnetic field suppressors 64a and 64b, there is arranged the wiring board 63 on which the magneto-electric transducer 61 is mounted. Furthermore, between the first and second magnetic field suppressors 64a and 64b, there is also arranged the bias magnet 62 so as to face the magneto-electric transducer 61 in the height direction.

The fixing member 65 is formed, for example, of a resin material which is nonmagnetic and not electrically conductive. The fixing member 65 is provided to fix the wiring board 63 with the magneto-electric transducer 61 mounted thereon, the bias magnet 62 and the magnetic field suppressors 64 to the external positive busbar 44.

With the above configuration of the current sensor 60, a measured magnetic field, which is a magnetic field created by electric current flowing through the external positive busbar 44 (or measured current), passes through the magneto-electric transducer 61. Moreover, a bias magnetic field, which is a magnetic field created by the bias magnet 62, also passes through the magneto-electric transducer 61. That is, a resultant magnetic field, which is the result of the measured magnetic field and the bias magnetic field, passes through the magneto-electric transducer 61.

Specifically, as indicated with a straight-line arrow in FIG. 19, the measured current flows in the longitudinal direction. Therefore, as indicated with a curved-line arrow in FIG. 19, the measured magnetic field is created around the longitudinal direction (i.e., on a lateral plane). Consequently, a lateral component (i.e., a component in the lateral direction) of the measured magnetic field passes through the magneto-electric transducer 61. On the other hand, the bias magnet 62 is magnetized in the longitudinal direction. Therefore, the bias magnetic field is created mainly around the lateral direction (or on a longitudinal plane). Consequently, a longitudinal component (i.e., a component in the longitudinal direction) of the bias magnetic field passes through the magneto-electric transducer 61.

As a result, the lateral component of the measured magnetic field and the longitudinal component of the bias magnetic field together constitute the resultant magnetic field passing through the magneto-electric transducer 61.

The resultant magnetic field makes an angle $\theta$ with the longitudinal component of the bias magnetic field. When the measured magnetic field is zero, the resultant magnetic field is equal to the bias magnetic field; thus the angle $\theta$ is equal to zero. On the other hand, when the measured magnetic field is finite and not zero, the angle $\theta$ is also finite and not equal to zero. That is, the angle $\theta$ depends on the strength of the measured magnetic field.

In the present embodiment, the magneto-electric transducer 61 is configured to convert the resultant magnetic field, which passes through the magneto-electric transducer 61 along a horizontal plane defined by the longitudinal and lateral directions, into an electrical signal that is indicative of the resultant magnetic field and thus indicative of the measured magnetic field.

Specifically, in the present embodiment, the magneto-electric transducer 61 is configured to detect only those magnetic fields which are along a horizontal plane defined by the longitudinal and lateral directions of the battery pack 300. More particularly, though not shown in the figures, the magneto-electric transducer 61 includes a pin layer whose magnetization direction is fixed, a free layer whose magnetization direction is changeable and a nonmagnetic intermediate layer interposed between the pin layer and the free layer. That is, the magneto-electric transducer 61 is implemented by a magnetoresistance effect element whose resistance depends on an angle between the magnetization directions of the pin layer and the free layer. The magnetization direction of the pin layer is a fixed direction on the horizontal plane. The magnetization direction of the free layer depends on an external magnetic field along the horizontal plane.

As described above, the resultant magnetic field passes through the magneto-electric transducer 61. Therefore, the magnetization direction of the free layer depends on the direction of the resultant magnetic field which is represented by the angle $\theta$. Thus, the angle between the magnetization directions of the pin layer and the free layer depends on the angle θ. Hence, the resistance of the magneto-electric transducer 61 depends on the angle θ. As mentioned previously, the angle θ depends on the strength of the measured magnetic field. Therefore, the resistance of the magneto-electric transducer 61 depends on the strength of the measured magnetic field.

Moreover, though not shown in the figures, the current sensor 60 actually includes a plurality of magneto-electric transducers 61 that are connected in series with each other between a power supply and the ground to form a bridge circuit on the wiring board 63. A midpoint potential of the bridge circuit is inputted to a calculating unit (not shown) provided on the wiring board 63. In the calculating unit, there are stored the correlation between the midpoint potential and the angle θ and the correlation between the angle θ and the strength of the measured magnetic field (or the magnitude of the measured current). The calculating unit calculates the magnitude of the measured current based on the inputted midpoint potential and the correlations stored therein.

The wiring board 63 of the current sensor 60 is electrically connected to the control substrate 80 of the battery ECU 32 via a sensor connection terminal 66. A current signal, which is indicative of the measured current detected by the current sensor 60, is inputted to the control substrate 80 via the sensor connection terminal 66. As shown in FIGS. 14 and 16, the sensor connection terminal 66 is shaped to extend in the height direction. A connection portion of the sensor connection terminal 66, which is connected to the wiring board 63 of the current sensor 60, is located closer than the connection point (or connection portion) between the internal positive busbar 43 and the connection electrode of the first switch 51 to the mounting wall 11 of the control module housing 10 in the height direction. In other words, a connection portion between the sensor connection terminal 66 and the wiring board 63 is located closer than the connection point between the internal positive busbar 43 and the connection electrode of the first switch 51 to the control substrate 80 in the height direction. Therefore, the length of the sensor connection terminal 66 in the height direction of the battery pack 300 is shorter than the separation distance of the connection point between the internal positive busbar 43 and the connection electrode of the first switch 51 from the battery ECU 32 in the height direction. In addition, the sensor connection terminal 66 is joined to the control substrate 80 by, for example, soldering.

Specifically, in each of the following two cases, the connection portion between the sensor connection terminal 66 and the wiring board 63 is located closer than the connection point between the internal positive busbar 43 and the connection electrode of the first switch 51 to the control substrate 80 in the height direction.

In the first case, the connection portion between the sensor connection terminal 66 and the wiring board 63 is located in the height direction between the connection point between the internal positive busbar 43 and the connection electrode of the first switch 51 and the connection point between the external positive busbar 44 and the connection electrode of the first switch 51.

In the second case, the connection portion between the sensor connection terminal 66 and the wiring board 63 is located closer than both the connection point between the internal positive busbar 43 and the connection electrode of the first switch 51 and the connection point between the external positive busbar 44 and the connection electrode of the first switch 51 to the control substrate 80 in the height direction.

The magnetic field suppressors 64 are provided to suppress external magnetic fields, which are irrelevant to the electric current flowing through the external positive busbar 44 (or the measured current), from passing through the magneto-electric transducer 61. The magnetic field suppressors 64 include the first and second magnetic field suppressors 64a and 64b that are made of a magnetic material. Each of the first and second magnetic field suppressors 64a and 64b is in the shape of a flat plate with major faces having a maximum area. Moreover, each of the first and second magnetic field suppressors 64a and 64b is arranged to have its major faces extending perpendicular to the height direction. The first and second magnetic field suppressors 64a and 64b are spaced from and aligned with each other in the height direction. The magneto-electric transducer 61 is located in the space between the first and second magnetic field suppressors 64a and 64b.

As described above, each of the first and second magnetic field suppressors 64a and 64b is flat plate-shaped and arranged to have its major faces extending perpendicular to the height direction. Therefore, when an external magnetic field passes through the current sensor 60 along a horizontal plane defined by the longitudinal and lateral directions of the battery pack 300, the external magnetic field preferentially passes through the first and second magnetic field suppressors 64a and 64b. Consequently, the external magnetic field is suppressed from passing through the magneto-electric transducer 61.

As described previously, the current sensor 60 is arranged in alignment with the first and second permanent magnets 53 and 54 of the first and second switches 51 and 52 on a horizontal plane defined by the longitudinal and lateral directions. The first and second permanent magnets 53 and 54 create a magnetic field which is mainly along the horizontal plane. Therefore, the magnetic field created by the first and second permanent magnets 53 and 54 preferentially passes through the first and second magnetic field suppressors 64a and 64b in the current sensor 60. Consequently, the magnetic field created by the first and second permanent magnets 53 and 54 is suppressed from passing through the magneto-electric transducer 61.

As shown in FIGS. 14-16, the magnetic shielding member 69 is in the shape of a rectangle on a lateral plane defined by the lateral and height directions. The magnetic shielding member 69 is formed of a magnetic material such as iron. The magnetic shielding member 69 divides the interior space of the case 70 of the element unit 31 into two parts. In one of the two parts, there is received the system main relay 50. In the other of the two parts, there is received the current sensor 60. The magnetic shielding member 69 is fixed to the case 70 by, for example, screws.

It should be noted that in FIGS. 15(c) and 16, for clearly showing the internal structure of the element unit 31, the magnetic shielding member 69 is made transparent showing only the contour thereof.

In the magnetic shielding member 69, there is formed a groove 69a through which the external positive busbar 44 and the external negative busbar 46 extend in the longitudinal direction. Therefore, the interior space of the case 70 is not perfectly divided into two parts by the magnetic shielding member 69. However, at least part of the magnetic shielding member 69 is located between the system main relay 50 and the current sensor 60 in the longitudinal direction. The groove 69a of the magnetic shielding member 69 is located closer than the magneto-electric transducer 61 of the current sensor 60 and the first and second permanent magnets 53 and 54 of the system main relay 50 to the control substrate 80 of the battery ECU 32 in the height direction.

As described above, in the present embodiment, there is provided the magnetic shielding member 69 between the system main relay 50 and the current sensor 60. Therefore, magnetic fields created in the system main relay 50 preferentially pass through the magnetic shielding member 69. More specifically, magnetic fields created in the solenoid coils and first and second permanent magnets 53 and 54 of the first and second switches 51 and 52 preferentially pass through the magnetic shielding member 69.

In addition, in the present embodiment, the magnetic shielding member 69 and the holding member 55 of the system main relay 50 are spaced from and aligned with each other in the longitudinal direction of the battery pack 300. Alternatively, the magnetic shielding member 69 and the holding member 55 may be arranged in contact and alignment with each other in the longitudinal direction. Moreover, the magnetic shielding member 69 may alternatively be provided on the surface or inside the holding member 55. In this case, the parts count of the control module 100 could be reduced. Furthermore, provided that the magnetic shielding member 69 is located between the system main relay 50 and the current sensor 60 on a horizontal plane, the magnetic shielding member 69 does not necessarily divide the interior space of the case 70 into two parts.

As shown in FIGS. 11 and 14, the case 70 is formed of a resin material into the shape of a box. The case 70 has a first side wall 71, a second side wall 72, a third side wall 73, a fourth side wall 74, a top wall 75 and a bottom wall 76. Each of the first side wall 71 and the second side wall 72 is in the shape of a rectangle on a lateral plane defined by the lateral and height directions of the battery pack 300. The first side wall 71 and the second side wall 72 are spaced from, aligned with and face each other in the longitudinal direction of the battery pack 300. Each of the third side wall 73 and the fourth side wall 74 is in the shape of a rectangle that is longer in the longitudinal direction than in the height direction on a longitudinal plane defined by the longitudinal and height directions. The third side wall 73 and the fourth side wall 74 are spaced from, aligned with and face each other in the lateral direction. The first side wall 71, the third side wall 73, the second side wall 72 and the fourth side wall 74 are arranged in this order in the circumferential direction of the case 70 around the height direction, and connected with one another. Moreover, each of the first side wall 71, the third side wall 73, the second side wall 72 and the fourth side wall 74 is connected with both a peripheral portion of a lower surface (or inside surface) of the top wall 75 and a peripheral portion of an upper surface (or inside surface) of the bottom wall 76. Consequently, the interior space of the case 70 is defined which is surrounded by the first to the fourth side walls 71-74 between the top and bottom walls 75 and 76.

In addition, the case 70 may have other alternative configurations according to the shape, size and arrangement of the elements received in the interior space thereof. For example, the case 70 may alternatively have a three-piece configuration as shown in FIG. 15(a).

In the interior space of the case 70, there are received part of each of the busbars 40, the system main relay 50, the current sensor 60 and the magnetic shielding member 69. In each of the first and second side walls 71 of the case 70, there are formed through-holes through which the busbars 40 respectively extend.

Specifically, in the second side wall 72 of the case 70, there are formed two through-holes through which the internal positive busbar 43 and the internal negative busbar 45 respectively extend. Consequently, through the respective through-holes, the battery module-side end portions of the internal positive busbar 43 and the internal negative busbar 45 protrude outside the interior space of the case 70. As described previously, on the battery module-side end portion of the internal positive busbar 43, there is provided the internal positive connector 43a; on the battery module-side end portion of the internal negative busbar 45, there is provided the internal negative connector 45a. In addition, the outside openings of the two through-holes formed in the second side wall 72 are respectively covered by the internal positive connector 43a and the internal negative connector 45a.

In the first side wall 71 of the case 70, there are formed two through-holes through which the external positive busbar 44 and the external negative busbar 46 respectively extend. Consequently, through the respective through-holes, the anti-battery module-side end portions of the external positive busbar 44 and the external negative busbar 46 protrude outside the interior space of the case 70. As described previously, on the anti-battery module-side end portion of the external positive busbar 44, there is provided the external positive connector 44a; on the anti-battery module-side end portion of the external negative busbar 46, there is provided the external negative connector 46a. In addition, the outside openings of the two through-holes formed in the first side wall 71 are respectively covered by the external positive connector 44a and the external negative connector 46a.

Moreover, on an inside surface of the first side wall 71 of the case 70, there is formed a first holding portion 71a for holding the current sensor 60 as shown in FIG. 14. The first holding portion 71a is in the shape of a tube with one end closed by the first side wall 71 and the other end open. In the hollow space of the first holding portion 71a, there are held the current sensor 60 and part of the external positive busbar 44. In addition, in the hollow space of the first holding portion 71a, there may also be held part of the external negative busbar 46.

Similarly, on an inside surface of the second side wall 72 of the case 70, there is formed a second holding portion 72a for holding the internal positive busbar 43 and the internal negative busbar 45 as shown in FIG. 14. The second holding portion 72a forms, together with the top wall 75 of the case 70, a tubular shape with one end closed by the second side wall 72 and the other end open. In the hollow space of the second holding portion 72a, there are held the internal positive busbar 43 and the internal negative busbar 45. Moreover, to the second holding portion 72a, there is mechanically fixed the system main relay 50 via a flange (not shown). That is, both the accommodation cases of the first and second switches 51 and 52 are mechanically fixed to the second holding portion 72a via the flange.

As shown in FIG. 14, both the accommodation cases of the first and second switches 51 and 52 are spaced from the bottom wall 76 of the case 70 in the height direction. Therefore, it is difficult for heat to be transmitted from the first and second switches 51 and 52 to the battery ECU 32 that is located under the bottom wall 76 of the case 70. In addition, as shown in FIG. 21(b), in the bottom wall 76 of the case 70, there are formed through-holes through which the switch connection terminals 56 of the system main relay 50 and the sensor connection terminal 66 of the current sensor 60 respectively extend.

(Configuration of Battery ECU)

As shown in FIG. 4, the battery ECU 32 is mounted on the mounting wall 11 of the control module housing 10. Above the battery ECU 32, there is provided the element unit 31. The element unit 31 is aligned with the battery cells 240 in the longitudinal direction of the battery pack 300. In contrast, the battery ECU 32 is aligned with the first and second ventilation spaces of the battery module 200 in the longitudinal direction. However, as shown in FIG. 13, the control unit 30, which includes the element unit 31 and the battery ECU 32, is located in the lateral direction of the battery pack 300 between the third ventilation hole 17a communicating with the first ventilation space and the fourth ventilation hole 17b communicating with the second ventilation space.

As described previously, the battery ECU 32 includes the control substrate 80, the internal connector 81, the external connector 82, the spacer 83 and the control cover 84.

Figure 20:
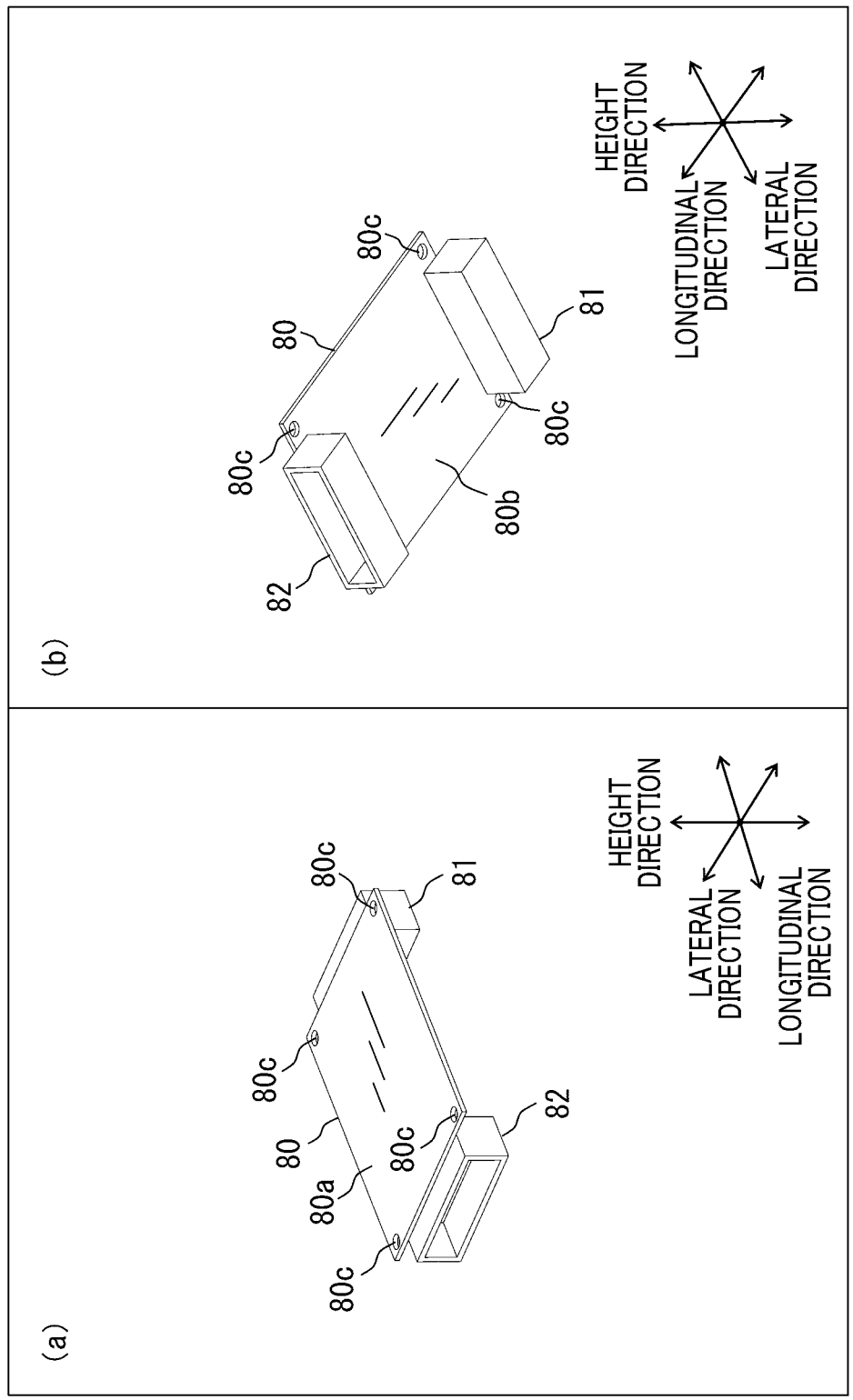
FIG. 20 is a diagram including two different perspective views of a control substrate of a battery ECU of the control module.

As shown in FIG. 20, the control substrate 80 is in the shape of a flat plate that extends along a horizontal plane defined by the longitudinal and lateral directions of the battery pack 300.

Though not shown in the figures, in the control substrate 80, there are formed mounting holes for electrical connection with the sensor connection terminal 66 and the switch connection terminals 56. Moreover, wiring patterns are formed on an upper surface 80a of the control substrate 80, on a lower surface 80b of the control substrate 80 which is on the opposite side to the upper surface 80a in the height direction, and between the upper surface 80a and the lower surface 80b. On the upper surface 80a of the control substrate 80, there are mounted electronic elements for forming a control circuit. To the lower surface 80b of the control substrate 80, there are fixed the internal connector 81 and the external connector 82 that are electrically connected to the control circuit via the wiring patterns.

More specifically, the internal connector 81 is fixed to a connection wall 16-side end portion of the lower surface 80b of the control substrate 80. The external connector 82 is fixed to an anti-connection wall 16-side end portion of the lower surface 80b of the control substrate 80. Consequently, the internal connector 81 and the external connector 82 are aligned with each other in the longitudinal direction on the lower surface 80b of the control substrate 80. To the internal connector 81, there are connected the internal wires 110. On the other hand, to the external connector 82, there are connected second wire harnesses 85b (shown in FIG. 1). Via the second wire harnesses 85b, the control substrate 80 is electrically connected to the in-vehicle ECU 500.

At four corners of the control substrate 80, there are respectively formed four through-holes 80c that penetrate the upper and lower surfaces 80a and 80b of the control substrate 80. Through the four through-holes 80c, there are respectively fastened four screws 86 (shown in FIG. 22) to fix the control substrate 80 to the bottom wall 76 of the case 70 of the element unit 31.

Moreover, though not shown in the figures, in the control substrate 80, there are also formed two positioning holes for positioning the control substrate 80 with respect to the element unit 31. The two positioning holes are aligned with each other in a diagonal direction of the control substrate 80. Into the two positioning holes, there are respectively inserted two protrusions 90 (shown in FIG. 21).

Figure 21:
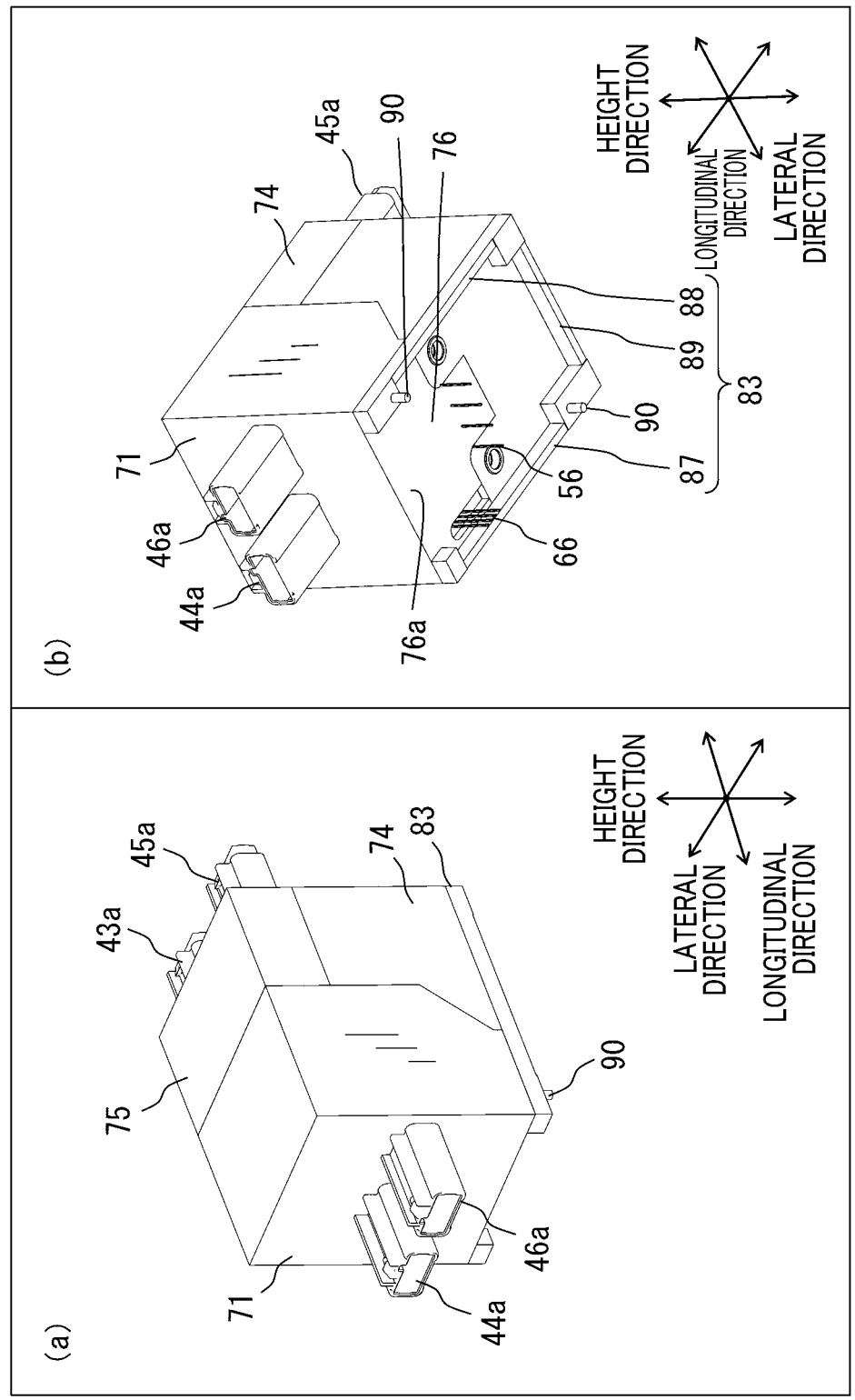
FIG. 21 is a diagram including two different perspective views illustrating the configuration of a spacer of the battery ECU.

As shown in FIG. 21, the spacer 83 has a substantially U-shape on a horizontal plane defined by the longitudinal and lateral directions of the battery pack 300. The spacer 83 is provided on an outside surface 76a of the bottom wall 76 of the case 70. The spacer 83 has a first supporting part 87, a second supporting part 88 and a third supporting part 89. Each of the first and second supporting parts 87 and 88 is in the shape of a column extending in the longitudinal direction. On the other hand, the third supporting part 89 is in the shape of a column extending in the lateral direction. All of the first, second and third supporting parts 87, 88 and 89 have the same height and are provided on a peripheral portion of the outside surface 76a of the bottom wall 76. Consequently, under the outside surface 76a of the bottom wall 76, there is formed a surrounded space which is surrounded by the spacer 83.

As shown in FIG. 21, the first supporting part 87 and the second supporting part 88 are spaced and aligned with each other in the lateral direction. The third supporting part 89 is interposed between the first and second supporting parts 87 and 88. More specifically, the third supporting part 89 is provided on a connection wall 16-side peripheral portion of the outside surface 76a of the bottom wall 76. Moreover, the third supporting part 89 connects the first and second supporting parts 87 and 88. The surrounded space opens on the opposite side to the connection wall 16 in the longitudinal direction.

On a connection wall 16-side end portion of the first supporting part 87, there is formed one of the two protrusions 90 which protrudes in the height direction toward the mounting wall 11 side. Moreover, on an anti-connection wall 16-side end portion of the second supporting part 88, there is formed the other of the two protrusions 90 which also protrudes in the height direction toward the mounting wall 11 side. Consequently, the two protrusions 90 are aligned with each other in a direction that intersects each of the longitudinal and lateral directions on a horizontal plane defined by the longitudinal and lateral directions. In other words, the two protrusions 90 are aligned with each other in the aforementioned diagonal direction of the control substrate 80.

Figure 22:
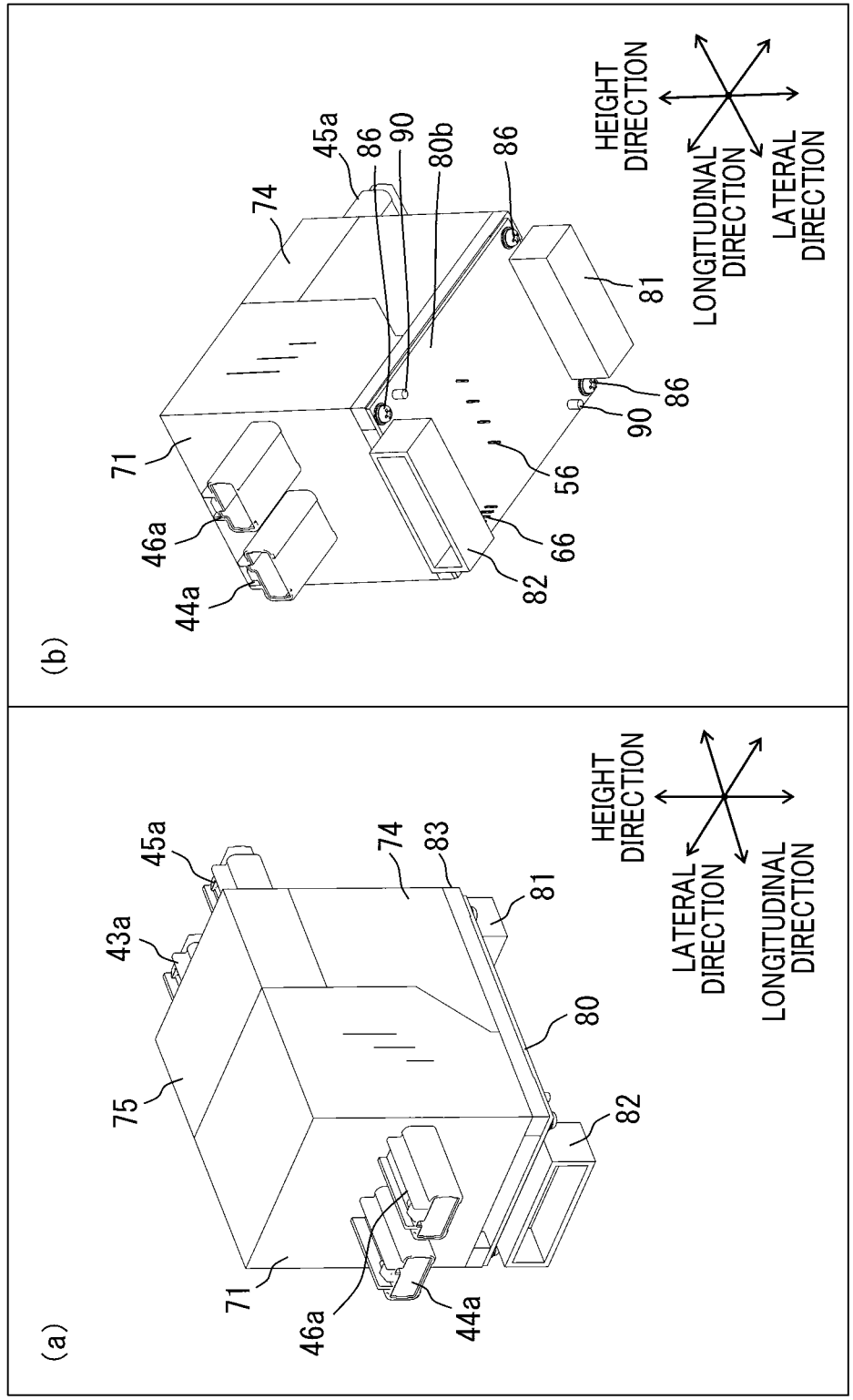
FIG. 22 is a diagram including two different perspective views illustrating the control substrate fixed to the element unit.

In mounting the spacer 83 to the control substrate 80, the outside surface 76a of the bottom wall 76 of the case 70 and the upper surface 80a of the control substrate 80 are opposed to each other in the height direction. Then, as shown in FIG. 22, the two protrusions 90 of the spacer 83 are respectively inserted into the two positioning holes of the control substrate 80. Consequently, the control substrate 80 is positioned relative to the case 70 on a horizontal plane defined by the longitudinal and lateral directions. Thereafter, the four screws 86 are fastened respectively through the four through-holes 80c of the control substrate 80. As a result, the control substrate 80 is fixed, together with the internal connector 81 and the outer connector 82, to the case 70 via the spacer 83.

As described previously, on the upper surface 80a of the control substrate 80, there are mounted the electronic elements for forming the control circuit. Moreover, under the outside surface 76a of the bottom wall 76 of the case 70, there is formed the surrounded space which is surrounded by the spacer 83. Therefore, the electronic elements mounted on the upper surface 80a of the control substrate 80 are located in the surrounded space and thus surrounded by the spacer 83. However, as described above, the surrounded space opens on the opposite side to the connection wall 16 in the longitudinal direction (see FIGS. 21 and 22). That is, the surrounded space communicates with the external space. Consequently, heat generated by the electronic elements can be easily dissipated.

The control cover 84 is provided to cover the lower surface 80b of the control substrate 80. The control cover 84 is formed of a metal material or a resin material. As shown in FIG. 23, the control cover 84 has an opposing wall 91 and a circumferential wall 92. The opposing wall 91 is shaped in a rectangle that is longer in the longitudinal direction than in the lateral direction on a horizontal plane defined by the longitudinal and lateral directions. The opposing wall 91 has an opposing surface 91a that opposes (or faces) the lower surface 80b of the control substrate 80. The circumferential wall 92 is formed on a peripheral portion of the opposing surface 91a of the opposing wall 91 along the circumferential direction of the opposing wall 91. The circumferential wall 92 includes a pair of longitudinally-extending parts and a pair of laterally-extending parts. At a central portion of each of the laterally-extending parts, there is formed a cut. In the cuts of the laterally-extending parts of the circumferential wall 92, there are respectively received the internal connector 81 and the external connector 82.

Figure 24:
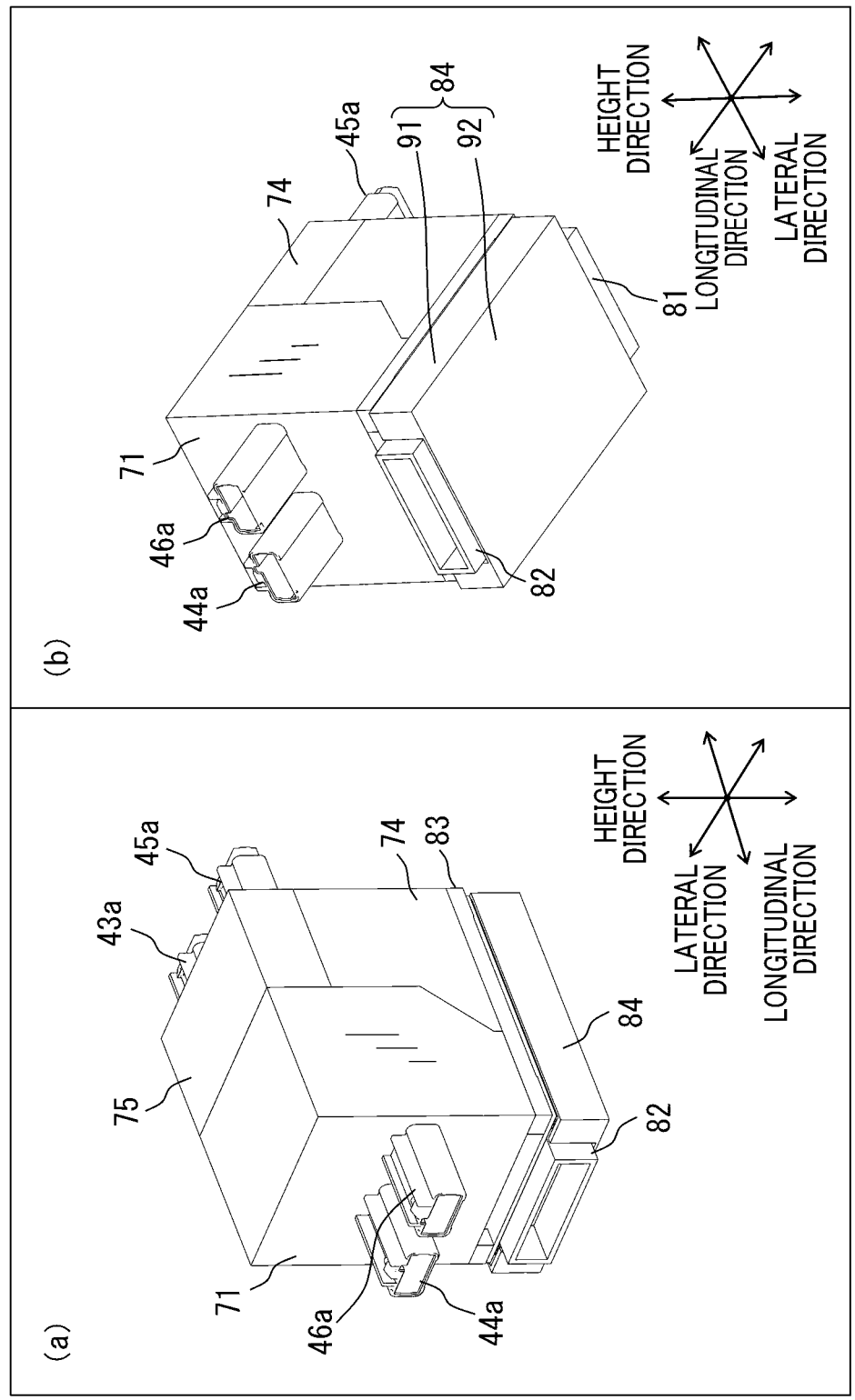
FIG. 24 is a diagram including two different perspective views illustrating the control cover fixed to the element unit.

In mounting the control cover 84 to the control substrate 80, the lower surface 80b of the control substrate 80 and the opposing surface 91a of the opposing wall 91 of the control cover 84 are opposed to each other in the height direction. Then, as shown in FIG. 24, the control cover 84 is attached to the control substrate 80 so as to have the internal connector 81 and the external connector 82 located respectively in the cuts formed in the laterally-extending parts of the circumferential wall 92 of the control cover 84. Consequently, the lower surface 80b of the control substrate 80 is covered by the control cover 84.

Next, referring back to FIG. 1, the electrical connection between the battery module 200, the control module 100, the electrical load 400 and the in-vehicle ECU 500 will be summarized.

As described previously, the battery module 200 includes the first battery stack 231 and the second battery stack 232 that are connected in series with each other via the second connecting member 244. The first battery stack 231 is electrically connected to the internal positive busbar 43 via the positive input/output terminal 245, while the second battery stack 232 is electrically connected to the internal negative busbar 45 via the negative input/output terminal 246.

Further, the internal positive busbar 43 is electrically connected to the external positive busbar 44 via the first switch 51, while the internal negative busbar 45 is electrically connected to the external negative busbar 46 via the second switch 52. Each of the external positive busbar 44 and the external negative busbar 46 is electrically connected to the electrical load 400 via the first wire harness 85a.

The electrical connection between the battery module 200 and the electrical load 400 is controlled by opening/closing of the first and second switches 51 and 52. Moreover, the opening/closing of the first and second switches 51 and 52 is controlled by the battery ECU 32.

The battery module 200 also includes the monitoring unit 250. The monitoring unit 250 is electrically connected to the battery ECU 32 via the internal wires 110. Further, the battery ECU 32 is electrically connected to the in-vehicle ECU 500 via the second wire harnesses 85b.

The in-vehicle ECU 500 outputs the command signal to the battery ECU 32. The battery ECU 32 controls the opening/closing of the first and second switches 51 and 52 in accordance with the command signal.

The monitoring unit 250 detects the voltage and temperature of each of the battery cells 240 of the first and second battery stacks 231 and 232 and outputs the detected voltage and temperature to the battery ECU 32. The battery ECU 32 calculates the SOC of each of the battery cells 240 based on the inputted voltage and temperature of the battery cell 240 and the correlations of the SOC with the voltage and temperature of the battery cell 240; the correlations are stored in the battery ECU 32. Then, based on the calculated SOCs of all the battery cells 240, the battery ECU 32 determines whether it is necessary to perform the process of balancing the SOCs of all the battery cells 240. When it is determined that it is necessary to perform the balancing process, the battery ECU 32 outputs the command signal to the monitoring unit 250. Upon receipt of the command signal, the monitoring unit 250 performs the balancing process by controlling the on/off operation of the switches that respectively correspond to the battery cells 240.

The control module 100 includes the first and second fans 21 and 22 that are electrically connected to the battery ECU 32 via the respective wires 23. The monitoring unit 250 includes the temperature sensors that detect the temperatures of the battery cells 240 and generate temperature signals indicative of the detected temperatures of the battery cells 240. The temperature signals are inputted to the battery ECU 32. Then, based on the temperatures of the battery cells 240 indicated by the inputted temperature signals, the battery ECU 32 controls drive of the first fan 21 and drive of the second fan 22 separately. For example, when the temperature of the first battery stack 231 is higher than the temperature of the second battery stack 232, the battery ECU 32 sets the rotational speed of the first fan 21 to be higher than the rotational speed of the second fan 22. Consequently, the flow of air in the first ventilation space becomes stronger than the flow of air in the second ventilation space, thereby enhancing the cooling of the first battery stack 231 more than the cooling of the second battery stack 232.

In addition, on the control substrate 80 of the battery ECU 32, there are formed first and second drive circuits (not shown) for respectively driving the first and second fans 21 and 22. The first and second drive circuits are electrically connected respectively to motors of the first and second fans 21 and 22 via the respective wires 23.

The control module 100 includes the current sensor 60. The current sensor 60 is electrically connected to the battery ECU 32 via the sensor connection terminal 66. Consequently, the battery ECU 32 can determine the input/output current of the battery module 200 and output the determined input/output current to the in-vehicle ECU 500.

Next, referring again to FIG. 14, the positional relationship between the control substrate 80 and the element unit 31 will be described.

As shown in FIG. 14, the busbars 40, the system main relay 50 and the current sensor 60 are located above the upper surface 80a of the control substrate 80 in the height direction. More specifically, the system main relay 50 is located between the control substrate 80 and the internal positive and negative busbars 43 and 45 in the height direction. The external positive busbar 44 and the external negative busbar 46 are located closer than the internal positive busbar 43 and the internal negative busbar 45 to the control substrate 80 in the height direction. Moreover, the external positive busbar 44 and the external negative busbar 46 are aligned with the system main relay 50 in the longitudinal direction of the battery pack 300.

(Operational Effects)

Next, operational effects (or advantages) of the control module 100 according to the present embodiment will be described.

(Operational Effects Relating to Connection Terminals and System Main Relay)

In the present embodiment, the connection portion of the sensor connection terminal 66, which is connected to the wiring board 63 of the current sensor 60, is located closer than the connection point between the internal positive busbar 43 and the connection electrode of the first switch 51 to the control substrate 80 of the battery ECU 32 in the height direction. Therefore, the length of the sensor connection terminal 66 in the height direction of the battery pack 300 is shorter than the separation distance of the connection point between the internal positive busbar 43 and the connection electrode of the first switch 51 from the control substrate 80 of the battery ECU 32 in the height direction. Consequently, vibration of the sensor connection terminal 66 is suppressed, thereby suppressing the reliability of electrical connection between the sensor connection terminal 66 and the control substrate 80 of the battery ECU 32 from being lowered.

Moreover, during the switching operation of the first switch 51, electromagnetic noise is generated at the connection point between the internal positive busbar 43 and the connection electrode of the first switch 51. However, the connection point between the internal positive busbar 43 and the connection electrode of the first switch 51 is located further than the connection portion of the sensor connection terminal 66, which is connected to the wiring board 63 of the current sensor 60, to the control substrate 80 of the battery ECU 32 in the height direction. Consequently, the influence of the electromagnetic noise on the control substrate 80 of the battery ECU 32 is suppressed.

In the present embodiment, the internal positive busbar 43 and the internal negative busbar 45 are located closer to the upper end faces 240a of the battery cells 240 than to the lower end faces 240b of the batter cells 240 in the height direction. The external positive busbar 44 and the external negative busbar 46 are located closer than the internal positive busbar 43 and the internal negative busbar 45 to the lower end faces 240b of the batter cells 240 (or to the control substrate 80 of the battery ECU 32) in the height direction. The current sensor 60 is mounted on the external positive busbar 44. The external positive busbar 44 and the external negative busbar 46 are spaced from the control substrate 80 of the battery ECU 32 in the height direction.

With the above configuration, there is formed a space around the external positive busbar 44 between the upper end faces 240a and the lower end faces 240b of the batter cells 240 in the height direction; in this space, there is arranged the current sensor 60. Consequently, the height of the control module 100 (or the length of the control module 100 in the height direction) and thus the volume of the control module 100 are prevented from being increased due to the arrangement of the current sensor 60 therein.

Moreover, the length of the sensor connection terminal 66, which connects the current sensor 60 to the control substrate 80 of the battery ECU 32, is shortened in comparison with the case of mounting the current sensor 60 on the internal positive busbar 43 or the internal negative busbar 45. Consequently, vibration of the sensor connection terminal 66 is suppressed, thereby suppressing the reliability of electrical connection between the sensor connection terminal 66 and the control substrate 80 from being lowered.

(Operational Effects Relating to System Main Relay)

In the present embodiment, the system main relay 50 is located above the upper surface 80a of the control substrate 80 of the battery ECU 32. More specifically, the system main relay 50 is located between the internal positive and negative busbars 43 and 45 and the control substrate 80 in the height direction.

That is, between the internal positive and negative busbars 43 and 45 and the control substrate 80, there is formed a space whose height depends on the height of the battery cells 240; in this space, the system main relay 50 is arranged. Consequently, the height of the control module 100 and thus the volume of the control module 100 are prevented from being increased due to the arrangement of the system main relay 50 therein.

Moreover, the connection points between the busbars 40 and the connection electrodes of the first and second switches 51 and 52 of the system main relay 50 are located away from the control substrate 80 by about the height of the system main relay 50. Consequently, the influence of electromagnetic noise, which is generated at the connection points during the switching operation of the system main relay 50, on the control substrate 80 is suppressed. In addition, the influence of heat generated in the system main relay 50 on the control substrate 80 is also suppressed.

In the present embodiment, the electrical connection of the positive busbar 41 (i.e., the electrical connection between the internal positive busbar 43 and the external positive busbar 44) is controlled by the first switch 51, while the electrical connection of the negative busbar 42 (i.e., the electrical connection between the internal negative busbar 45 and the external negative busbar 46) is controlled by the second switch 52. Consequently, even if one of the first and second switches 51 and 52 suffers an on-failure, it is still possible to control the electrical connection between the electrical load 400 and the battery module 200 by the other of the first and second switches 51 and 52.

(Operational Effects Relating to Current Sensor and Permanent Magnets)

In the present embodiment, the current sensor 60 includes the first shield 64a and the second shield 64b each of which is in the shape of a flat plate with major faces extending perpendicular to the height direction. The current sensor 60 is aligned with each of the first and second permanent magnets 53 and 54 of the first and second switches 51 and 52 on a horizontal plane defined by the longitudinal and lateral directions. The first and second permanent magnets 53 and 54 create the magnetic field which is mainly along the horizontal plane.

With the above configuration, the magnetic field created by the first and second permanent magnets 53 and 54 preferentially passes through the first and second magnetic field suppressors 64a and 64b. Consequently, the magnetic field created by the first and second permanent magnets 53 and 54 is suppressed from passing through the magneto-electric transducer 61 of the current sensor 60. As a result, decrease in the detection accuracy of the current sensor 60 is suppressed. That is, it becomes possible to shorten the separation distance between the system main relay 50 and the current sensor 60 and thereby reduce the size of the element unit 31 while ensuring the detection accuracy of the current sensor 60.

(Operational Effects Relating to Magnetic Shielding Member)

In the present embodiment, the magnetic shielding member 69, which is formed of a magnetic material, is interposed between the current sensor 60 and the system main relay 50.

With the magnetic shielding member 69, even if the separation distance (or clearance) between the current sensor 60 and the system main relay 50 is reduced with reduction in the size of the control module 100, it is still possible to suppress magnetic fields created in the system main relay 50 from passing through the current sensor 60. Consequently, decrease in the detection accuracy of the current sensor 60 is suppressed.

Moreover, in the magnetic shielding member 69, there is formed the groove 69a through which the external positive busbar 44 and the external negative busbar 46 extend in the longitudinal direction.

With the groove 69a, it becomes unnecessary for the external positive busbar 44 and the external negative busbar 46 to be designed to extend around the magnetic shielding member 69. Consequently, increase in the size of the control module 100 is suppressed. Moreover, it also becomes unnecessary for the magnetic shielding member 69 to be shaped to avoid contact with the external positive busbar 44 and the external negative busbar 46. In other words, it becomes possible for the magnetic shielding member 69 to be shaped to reliably suppress the magnetic fields created in the system main relay 50 from passing through the current sensor 60.

(Operational Effects Relating to Arrangement of Battery Pack)

In the present embodiment, the battery pack 300 is arranged in the space under the rear seat of the hybrid vehicle. The battery pack 300 includes the battery module 200 and the control module 100 that are aligned with each other in the longitudinal direction of the battery pack 300. Moreover, the battery module 200 and the control module 100 are connected with each other both mechanically and electrically.

The height of the rear seat in the vertical direction (or the height direction of the battery pack 300) is determined according to the degree of comfort felt by an occupant seated on the rear seat. The width of the rear seat in the forward-backward direction of the vehicle (or the lateral direction of the battery pack 300) is also determined according to the degree of comfort felt by an occupant seated on the rear seat. On the other hand, the length of the rear seat in the left-right direction of the vehicle (or the longitudinal direction of the battery pack 300) is determined according to the size of the hybrid vehicle. Therefore, the length of the space under the rear seat can be set to be considerably greater than the height and the width of the space.

In view of the above, in the present embodiment, the battery pack 300 is arranged in the space under the rear seat of the hybrid vehicle so that the longitudinal direction of the battery pack 300, in which the battery module 200 and the control module 100 are aligned with each other, coincides with the lengthwise direction of the rear seat (or the left-right direction of the vehicle). Consequently, even if the size of the battery module 200 is increased with increase in the output power and capacities of the battery stacks 230, it is still possible to reliably arrange the battery pack 300 in the hybrid vehicle.

(Operational Effects Relating to Cuts and Ventilation Holes)

In the present embodiment, the third and fourth ventilation holes 17a and 17b are spaced from the third and fourth cuts 16b and 16c in the height direction. Moreover, the third and fourth cuts 16b and 16c are located above the first and second ventilation holes 219a and 219b in the height direction and between the first and second ventilation holes 219a and 219b in the lateral direction. The control unit 30 is located between the third and fourth ventilation holes 17a and 17b in the lateral direction.

With the above configuration, interference of the control unit 30 with air flowing through the third ventilation hole 17a and air flowing through the fourth ventilation hole 17b is suppressed. In other words, interference of the control unit 30 with air sucking into the first fan 21 and air sucking into the second fan 22 is suppressed. Moreover, both air flowing out of the first ventilation hole 219a and air flowing out of the second ventilation hole 219b are suppressed from leaking via the third and fourth cuts 16b and 16c.

The third and fourth cuts 16b and 16c are formed in the top surface 16a of the connection wall 16. The third cut 16b is aligned with the first cut 215b in the longitudinal direction, while the fourth cut 16c is aligned with the second cut 215c in the longitudinal direction. At least one of part of the positive busbar 41 and part of the positive input/output terminal 245 is received in the third cut 16b, while at least one of part of the negative busbar 42 and part of the negative input/output terminal 246 is received in the fourth cut 16c.

Consequently, unlike in the case where the third and fourth cuts 16b and 16c are formed in a lower part of the connection wall 16, it becomes unnecessary to bend the positive input/output terminal 245 and the negative input/output terminal 246 downward from the upper end face 240a side to the lower end face 240b side of the battery cells 240. As a result, it becomes possible to facilitate the design of the positive input/output terminal 245 and the negative input/output terminal 246 that are respectively connected to the positive busbar 41 and the negative busbar 42. Moreover, it also becomes possible to omit the connectors or wires connecting the positive input/output terminal 245 and the negative input/output terminal 246 respectively to the positive busbar 41 and the negative busbar 42.

(Operational Effects Relating to Ventilation of Battery Module)

In the present embodiment, the positive terminal 241 of that battery cell 240 (i.e., the first battery cell 240) of the first battery stack 231 which faces the left wall 215 of the battery module housing 210 and the negative terminal 242 of that battery cell 240 (i.e., the first battery cell 240) of the second battery stack 232 which faces the left wall 215 are aligned with each other in the lateral direction with the partition wall 213 of the battery module housing 210 interposed therebetween. The partition wall 213 partitions the accommodation space of the battery module housing 210 into the first and second accommodation spaces and the ventilation space of the battery module housing 210 into the first and second ventilation spaces. To the positive terminal 241 located on the partition wall 213 side, there is connected the positive input/output terminal 245. To the negative terminal 242 located on the partition wall 213 side, there is connected the negative input/output terminal 246.

In a central part of the top surface 215a of the left wall 215 of the battery module housing 210, there is formed the first cut 215b for electrically connecting the positive input/output terminal 245 with the positive busbar 41 at substantially the same height as the upper end faces 240a of the battery cells 240. Moreover, in the central part of the top surface 215a of the left wall 215, there is also formed the second cut 215c for electrically connecting the negative input/output terminal 246 with the negative busbar 42 at substantially the same height as the upper end faces 240a of the battery cells 240.

In the left wall 215 of the battery module housing 210, there are also formed both the first ventilation hole 219a that communicates with the first ventilation space and the second ventilation hole 219b that communicates with the second ventilation space. The first and second ventilation holes 219a and 219b are spaced from the first and second cuts 215b and 215c in the height direction. Moreover, the first and second cuts 215b and 215c are located above that part of the left wall 215 which is interposed between the first and second ventilation holes 219a and 219b in the lateral direction.

In the battery module housing 210, air in the first accommodation space flows through the first ventilation space and out of the battery module housing 210 via the first ventilation hole 219a; air in the second accommodation space flows through the second ventilation space and out of the battery module housing 210 via the second ventilation hole 219b. As described above, the first and second ventilation holes 219a and 219b are spaced from the first and second cuts 215b and 215c in the height direction. Consequently, the flow of air in the first accommodation space and the flow of air in the second accommodation space are prevented from being interfered with the first and second cuts 215b and 215c.

Moreover, the first cut 215b is aligned with the third cut 16b in the longitudinal direction; the second cut 215c is aligned with the fourth cut 16c in the longitudinal direction. Consequently, the flow of air in the first accommodation space and the flow of air in the second accommodation space are also prevented from being interfered with the third and fourth cuts 16b and 16c.

(Operational Effects Relating to Connection by Soldering)

In the present embodiment, both the current sensor 60 and the system main relay 50 are located above the control substrate 80 of the battery ECU 32 in the height direction. Moreover, the current sensor 60 is electrically connected to the control substrate 80 via the sensor connection terminal 66, while the system main relay 50 is electrically connected to the control substrate 80 via the switch connection terminals 56. Furthermore, each of the sensor connection terminal 66 and the switch connection terminals 56 is connected to the control substrate 80 by soldering.

As above, each of the current sensor 60 and the system main relay 50 is aligned with the control substrate 80 in the height direction. Consequently, it becomes easy to electrically connect each of the current sensor 60 and the system main relay 50 to the control substrate 80. More particularly, it becomes possible to connect (or join) each of the sensor connection terminal 66 and the switch connection terminals 56 to the control substrate 80 only by soldering without employing additional wires or connectors. As a result, it becomes possible to suppress increase in the parts count of the control module 100.

(Operational Effects Relating to Fans)

In the present embodiment, the control unit 30 is interposed between the first fan 21 and the second fan 22. The first outlet 21a of the first fan 21 opens toward the opposite side to the connection wall 16 in the longitudinal direction. Therefore, air sucked into the first fan 21 is discharged out of the first fan 21 via the first outlet 21a in the longitudinal direction away from the battery module 200. Similarly, the second outlet 22a of the second fan 22 also opens toward the opposite side to the connection wall 16 in the longitudinal direction. Therefore, air sucked into the second fan 22 is discharged out of the second fan 22 via the second outlet 22a in the longitudinal direction away from the battery module 200.

With the above configuration, interference of the control unit 30 with the air discharged out from the first and second outlets 21a and 22a is suppressed. Consequently, a situation is prevented from occurring where it becomes difficult for air flowing in the first and second accommodation spaces of the battery module housing 210 to flow due to the control unit 30.

In the present embodiment, the first and second drive circuits, which respectively drive the first and second fans 21 and 22, are formed on the control substrate 80 of the battery ECU 32. Consequently, the sizes of the first and second fans 21 and 22 are reduced in comparison with the case of the first and second drive circuits being respectively built in the first and second fans 21 and 22. Moreover, the size of the entire control module 100 is reduced in comparison with the case of the first and second drive circuits being formed separately from the control substrate 80.

In the present embodiment, the battery ECU 32 controls drive of the first fan 21 and drive of the second fan 22 separately. Consequently, it is possible for the battery ECU 32 to control the cooling of the first battery stack 231 and the cooling of the second battery stack 232 separately.

More specifically, in the present embodiment, the battery ECU 32 controls drive of the first fan 21 and drive of the second fan 22 separately based on the temperatures of the first and second battery stacks 231 and 232 detected by the respective temperature sensors. For example, when the temperature of the first battery stack 231 is higher than the temperature of the second battery stack 232, the battery ECU 32 sets the rotational speed of the first fan 21 to be higher than the rotational speed of the second fan 22. Consequently, the flow of air in the first ventilation space becomes stronger than the flow of air in the second ventilation space, thereby enhancing the cooling of the first battery stack 231 more than the cooling of the second battery stack 232. As a result, the temperature of the first battery stack 231 and the temperature of the second battery stack 232 are equalized, thereby suppressing a difference in service life from occurring between the first and second battery stacks 231 and 232.

(Operational Effects Relating to Fixing)

In the present embodiment, the internal positive busbar 43, the internal negative busbar 45 and the system main relay 50 are together mechanically fixed to the second holding portion 72a formed in the second side wall 72 of the case 70. Consequently, it becomes easy for the internal positive busbar 43, the internal negative busbar 45 and the system main relay 50 to vibrate at the same frequency. As a result, connection between the internal positive busbar 43 and the external positive busbar 44 via the system main relay 50 and connection between the internal negative busbar 45 and the external negative busbar 46 via the system main relay 50 become stable in comparison with the case of the internal positive busbar 43, the internal negative busbar 45 and the system main relay 50 vibrating at different frequencies. Moreover, generation of heat by friction at the connection points (or contact points) between the system main relay 50 and the busbars 43-46 is suppressed.

In the present embodiment, both the current sensor 60 and the system main relay 50 are fixed to the case 70. Moreover, to the case 70, there is also fixed the control substrate 80 of the battery ECU 32. Consequently, relative displacement of each of the current sensor 60 and the system main relay 50 to the control substrate 80 is suppressed in comparison with the case of the control substrate 80 being not fixed to the case 70. As a result, it is possible to ensure both the reliability of electrical connection between the current sensor 60 and the control substrate 80 and the reliability of electrical connection between the system main relay 50 and the control substrate 80.

[First Modification]

In the above embodiment, as shown in FIG. 11, the battery ECU 32 is mounted on the mounting wall 11 of the control module housing 10 and the element unit 31 is arranged above the battery ECU 32.

Figure 25:
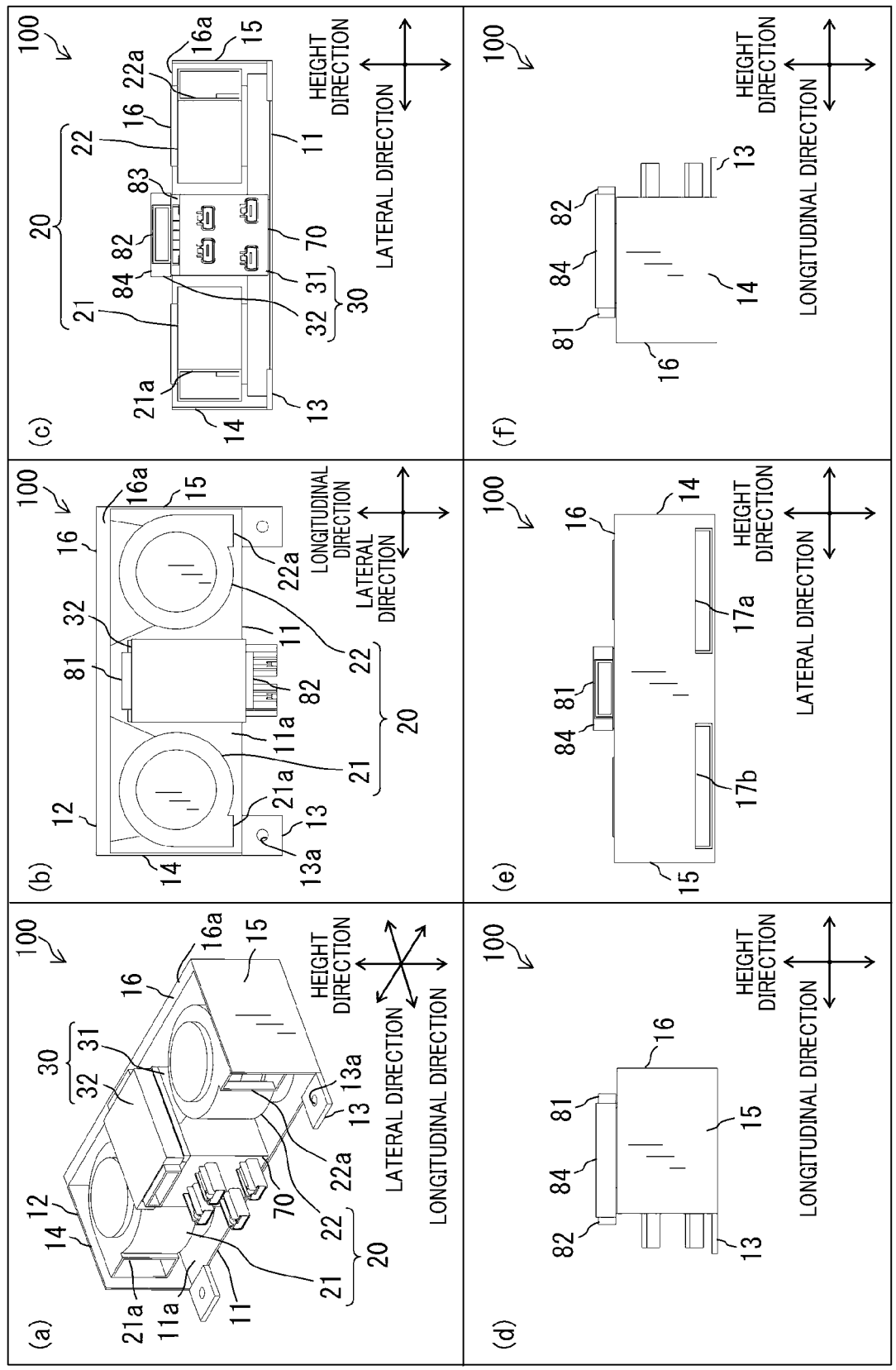
FIG. 25 is a diagram including various views of a control module according to a first modification.
Figure 26:
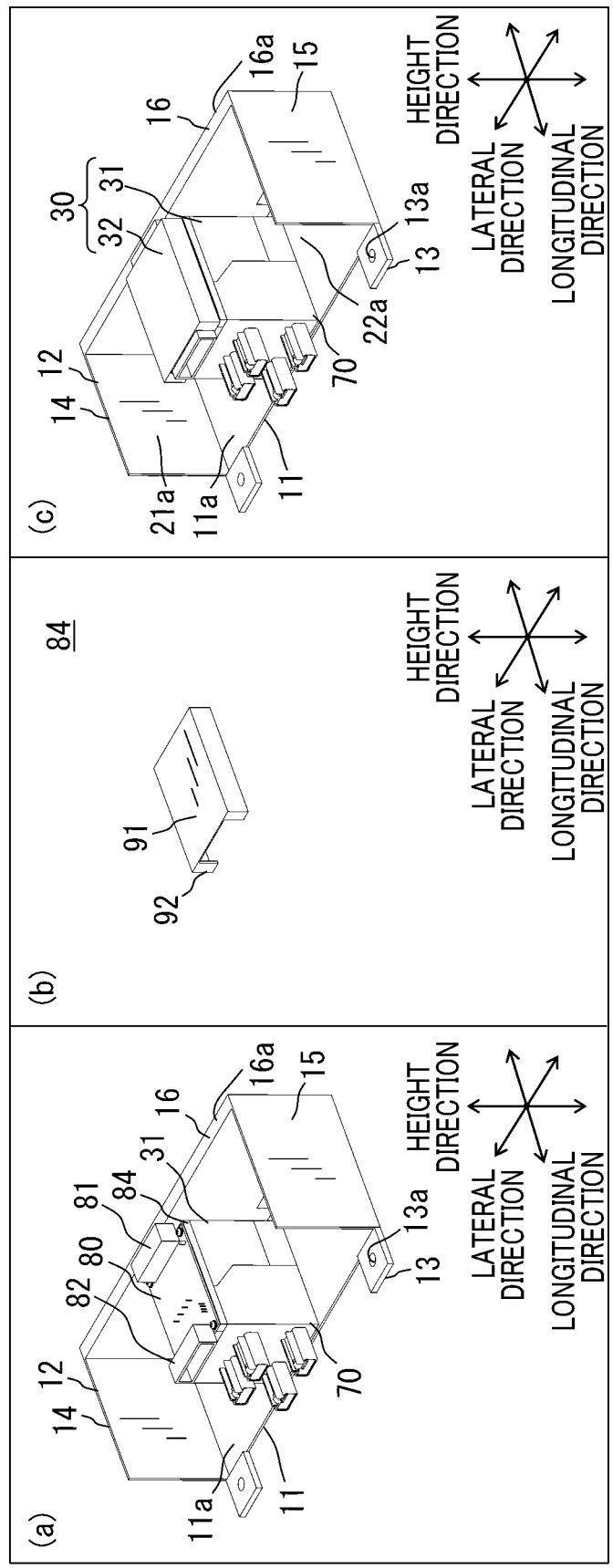
FIG. 26 is a diagram including various views of components of the control module according to the first modification.

In contrast, in this modification, as shown in FIGS. 25-26, the element unit 31 is mounted on the mounting wall 11 of the control module housing 10 and the battery ECU 32 is arranged above the element unit 31.

With the above arrangement according to the present modification, it becomes easy to have the system main relay 50 thermally connected with the mounting wall 11. That is, it becomes easy to have the system main relay 50 thermally connected with the body of the hybrid vehicle via the mounting wall 11. For example, the system main relay 50 may be arranged in contact with the mounting wall 11. Consequently, it becomes possible to more effectively dissipate heat generated in the system main relay 50.

In addition, in the present modification, the four busbars protrude from an end face of the case 70 which is on the opposite side to the connection wall 16 of the control module housing 10 in the longitudinal direction.

[Second Modification]

Figure 27:
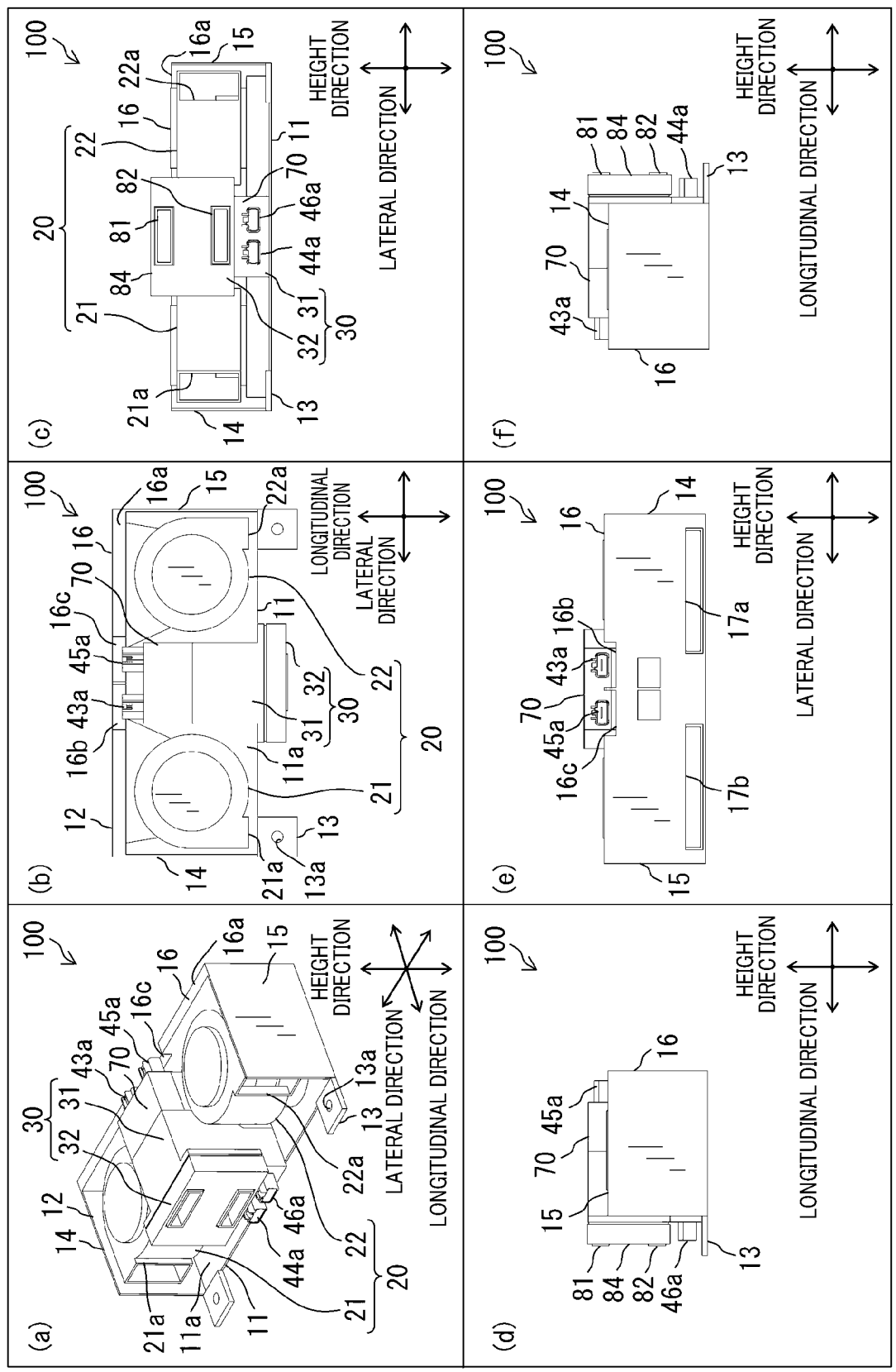
FIG. 27 is a diagram including various views of a control module according to a second modification.

In this modification, as shown in FIGS. 27 and 28, both the element unit 31 and the battery ECU 32 are mounted on the mounting wall 11 of the control module housing 10 so as to be aligned and in contact with each other in the longitudinal direction. More particularly, the battery ECU 32 is arranged in contact with an end face of the element unit 31 which is on the opposite side to the connection wall 16 of the control module housing 10 in the longitudinal direction.

With the above arrangement according to the present modification, it is possible to minimize the height of the control module 100.

Moreover, in the present modification, the system main relay 50 may be arranged in contact with the mounting wall 11. In this case, it is possible to more effectively dissipate heat generated in the system main relay 50.

In addition, in the present modification, in two opposite end portions of the opposing wall 91 of the control cover 84 in the height direction, there are respectively formed two cuts (or through-holes) for arranging the internal connector 81 and the external connector 82.

While the above particular embodiment and modifications have been shown and described, it will be understood by those skilled in the art that various further modifications, changes, and improvements may be made without departing from the spirit of the present invention.

For example, in the above embodiment, the present invention is applied to the battery pack 300 that is designed to be used in a hybrid vehicle. However, the present invention may also be applied to other battery packs, such as a battery pack designed to be used in a plug-in hybrid vehicle or a battery pack designed to be used in an electric vehicle.

In the above embodiment, the battery module 200 includes the two battery stacks 230, i.e., the first and second battery stacks 231 and 232. However, the battery module 200 may be modified to include a different number of battery stacks 230, for example four battery packs 230.

In the above embodiment, the battery module housing 210 and the control module housing 10 are formed separately from and assembled to each other. More specifically, the left wall 215 of the battery module housing 210 and the connection wall 16 of the control module housing 10 are mechanically connected to each other. However, the battery module housing 210 and the control module housing 10 may alternatively be formed integrally into one piece. In this case, the left wall 215 of the battery module housing 210 and the connection wall 16 of the control module housing 10 are integrated into a single boundary wall. In other words, the battery module housing 210 and the control module housing 10 share a single boundary wall formed therebetween.

In the above embodiment, both the first outlet 21a of the first fan 21 and the second outlet 22a of the second fan 22 open toward the opposite side to the connection wall 16 of the control module housing 10 in the longitudinal direction. However, at least one of the first outlet 21a and the second outlet 22a may alternatively open toward the system main relay 50 received in the case 70 of the element unit 31. In this case, it is possible to cool the system main relay 50 with air discharged out from the at least one of the first outlet 21a and the second outlet 22a.

Moreover, the first outlet 21a and the second outlet 22a may alternatively be arranged so as to both open toward the control unit 30 side in the lateral direction or toward the opposite side to the control unit 30 in the lateral direction. In addition, the first outlet 21a and the second outlet 22a may also be arranged so as to open in the height direction.

Furthermore, the first outlet 21a of the first fan 21 and the second outlet 22a of the second fan 22 shown in FIG. 12(d) may be respectively replaced with the inlet of the first fan 21 and the inlet of the second fan 22.

In the above embodiment, the system main relay 50 is configured to include both the first switch 51 and the second switch 52. However, the system main relay 50 may alternatively be configured to include only one of the first switch 51 and the second switch 52.

In the above embodiment, the battery ECU 32 includes the control cover 84 that covers the lower surface 80b of the control substrate 80. However, the control cover 84 may be omitted from the battery ECU 32. In this case, the lower surface 80b of the control substrate 80 is covered with the mounting wall 11 of the control module housing 10.

In the above embodiment, the control substrate 80 is located outside the case 70. However, the control substrate 80 may alternatively be arranged in the case 70. In this case, the control cover 84 may be omitted, reducing the parts count of the control module 100.

In the above embodiment, the control module 100 has the current sensor 60 mounted on the external positive busbar 44. However, the current sensor 60 may alternatively be mounted on the external negative busbar 46. In addition, the control module 100 may alternatively have two current sensors 60 mounted respectively on the external positive busbar 44 and the external negative busbar 46.

What is claimed is:

1. A control module configured to be arranged in alignment with a battery module in a longitudinal direction,
the battery module including at least one battery stack that is comprised of a plurality of battery cells aligned with each other in the longitudinal direction, each of the battery cells having an upper end face and a lower end face that are opposite to each other in a height direction perpendicular to the longitudinal direction, each of the battery cells including a pair of electrodes formed on the upper end face thereof,
the control module comprising:
a busbar configured to electrically connect the battery module to an electrical load;
a switch configured to switch electrical connection of the busbar with the electrical load between a connected state and a disconnected state; and
a controller configured to control switching operation of the switch,
wherein
the busbar is located to be closer to the upper end faces of the battery cells than to the lower end faces of the battery cells in the height direction,
the controller is located to be closer to the lower end faces of the battery cells than to the upper end faces of the battery cells in the height direction, and
the switch is located between the busbar and the controller in the height direction.

2. The control module as set forth in claim 1, further comprising:
  a current sensor configured to detect electric current flowing through the busbar; and
  a connection terminal configured to electrically connect the current sensor to the controller,
  wherein
    a connection portion between the current sensor and the connection terminal is located closer than a connection portion between the busbar and the switch to the controller in the height direction.

3. The control module as set forth in claim 2, wherein the busbar is comprised of an internal busbar configured to be electrically connected to the battery module and an external busbar configured to be electrically connected to the electrical load,
  the external busbar is located closer than the internal busbar to the controller in the height direction,
  the switch is configured to selectively make and break electrical connection between the internal busbar and the external busbar, and
  the current sensor is mounted on the external busbar.

4. The control module as set forth in claim 3, wherein the current sensor includes a magneto-electric transducer and a magnetic field suppressor, the magneto-electric transducer being configured to convert a magnetic field, which depends on the electric current flowing through the busbar and passes through the magneto-electric transducer along a plane perpendicular to the height direction, into an electrical signal, the magnetic field suppressor being configured to suppress external magnetic fields from passing through the magneto-electric transducer along the plane perpendicular to the height direction,
  the switch includes a pair of magnets provided to change the flow path of a discharge current that is generated in the switch when the electrical connection of the busbar with the electrical load is switched by the switch from the connected state to the disconnected state,
  the magnets are magnetized in a lateral direction, which is perpendicular to both the longitudinal direction and the height direction, and opposed to each other in the lateral direction, and
  the current sensor is arranged in alignment with the pair of magnets in the longitudinal direction.

5. The control module as set forth in claim 2, further comprising a magnetic shielding member,
  wherein
    the current sensor is configured to detect the electric current flowing through the busbar by detecting a magnetic field created by the electric current,
    the switch creates a magnetic field during its switching operation, and
    the magnetic shielding member is arranged between the current sensor and the switch.

6. The control module as set forth in claim 5, wherein in the magnetic shielding member, there is formed a groove through which the busbar extends.

7. The control module as set forth in claim 1, further comprising a case in which the switch and at least part of the busbar are received,
  wherein
    the at least one battery stack of the battery module comprises a first battery stack and a second battery stack that are arranged in alignment with each other in a lateral direction perpendicular to both the longitudinal direction and the height direction,
    the battery module also has a first battery module-side ventilation hole and a second battery module-side ventilation hole which are formed in alignment with each other in the lateral direction and through which air flows to respectively cool the first and second battery stacks, and
    the case is located between the first and second battery module-side ventilation holes in the lateral direction.

8. The control module as set forth in claim 1, further comprising a mounting member on which the switch and at least part of the busbar are mounted,
  the at least one battery stack of the battery module comprises a first battery stack and a second battery stack that are arranged in alignment with each other in a lateral direction perpendicular to both the longitudinal direction and the height direction,
  the mounting member has a first control module-side ventilation hole and a second control module-side ventilation hole which are formed in alignment with each other in the lateral direction and through which air flows to respectively cool the first and second battery stacks, and
  the switch and the at least part of the busbar are located between the first and second control module-side ventilation holes in the lateral direction.

9. The control module as set forth in claim 8, wherein in the mounting member, there is formed a cut in which at least one of the busbar and an input/output terminal is received, the input/output terminal being provided for inputting and outputting electric power to and from the battery module,
  the cut is located to be closer to the upper end faces of the battery cells than to the lower end faces of the battery cells in the height direction, and
  the first and second control module-side ventilation holes are located to be closer than the cut to the lower end faces of the battery cells in the height direction.

10. The control module as set forth in claim 1, wherein the control module is configured to be arranged along with the battery module in a space under a seat of a vehicle which includes an electric machine that functions as at least one of an electric motor and an electric generator.

* * * * *